US010735026B2

(12) United States Patent
Tamir et al.

(10) Patent No.: US 10,735,026 B2
(45) Date of Patent: Aug. 4, 2020

(54) COMPRESSION AND DECOMPRESSION ENGINES AND COMPRESSED DOMAIN PROCESSORS

(71) Applicant: iDensify LLC, Round Rock, TX (US)

(72) Inventors: Dan E. Tamir, Round Rock, TX (US); Dan Bruck, Austin, TX (US)

(73) Assignee: IDENSIFY LLC, Austin, TX (US)

( * ) Notice: Subject to any disclaimer, the term of this patent is extended or adjusted under 35 U.S.C. 154(b) by 0 days.

(21) Appl. No.: 16/518,602

(22) Filed: Jul. 22, 2019

(65) Prior Publication Data

US 2019/0349001 A1 Nov. 14, 2019

Related U.S. Application Data

(63) Continuation of application No. 16/029,259, filed on Jul. 6, 2018, now Pat. No. 10,404,277.

(60) Provisional application No. 62/529,685, filed on Jul. 7, 2017, provisional application No. 62/529,688, filed on Jul. 7, 2017.

(51) Int. Cl.

| | |
|---|---|
| ***H03M 7/30*** | (2006.01) |
| ***H03M 7/40*** | (2006.01) |
| ***H03M 7/02*** | (2006.01) |
| ***G06F 7/74*** | (2006.01) |
| ***G06F 9/30*** | (2018.01) |
| ***G06F 7/76*** | (2006.01) |
| ***H03M 7/24*** | (2006.01) |
| ***H03M 7/18*** | (2006.01) |
| ***H04N 19/48*** | (2014.01) |

(52) U.S. Cl.
CPC ............ *H03M 7/6017* (2013.01); *G06F 7/74* (2013.01); *G06F 7/76* (2013.01); *G06F 9/30014* (2013.01); *G06F 9/30112* (2013.01); *H03M 7/02* (2013.01); *H03M 7/18* (2013.01); *H03M 7/24* (2013.01); *H03M 7/30* (2013.01); *H03M 7/4093* (2013.01); *H03M 7/6047* (2013.01); *H04N 19/48* (2014.11)

(58) Field of Classification Search
CPC ........ H03M 7/6017; H03M 7/24; H03M 7/30; H03M 7/02; H03M 7/6047; H03M 7/4093; G06F 7/74; G06F 9/30112; G06F 7/76; G06F 9/30014
See application file for complete search history.

(56) References Cited

U.S. PATENT DOCUMENTS

| | | | | |
|---|---|---|---|---|
| 4,949,293 | A * | 8/1990 | Kawamura | H03M 7/18 708/491 |
| 5,606,677 | A | 2/1997 | Balmer et al. | |
| 5,644,524 | A | 7/1997 | Van Aken et al. | |
| 8,346,838 | B2 | 1/2013 | Debes et al. | |
| 2005/0201723 | A1 | 9/2005 | Islam et al. | |
| 2008/0123741 | A1 | 5/2008 | Li et al. | |
| 2019/0013823 | A1 | 1/2019 | Tamir et al. | |

* cited by examiner

*Primary Examiner* — Howard Williams
(74) *Attorney, Agent, or Firm* — Lee & Hayes, P.C.

(57) ABSTRACT

Compressed domain processors configured to perform operations on data compressed in a format that preserves order. The Compressed domain processors may include operations such as addition, subtraction, multiplication, division, sorting, and searching. In some cases, compression engines for compressing the data into the desired formats are provided.

20 Claims, 27 Drawing Sheets

COMPRESSION AND DECOMPRESSION ENGINES AND COMPRESSED DOMAIN PROCESSORS

CROSS-REFERENCE TO RELATED APPLICATION(S)

This application is a continuation of and claims priority to U.S. application Ser. No. 16/029,259, filed on Jul. 6, 2018 and entitled "Compression And Decompression Engines And Compressed Domain Processors," which claims priority to U.S. Provisional Application Nos. 62/529,685 filed on Jul. 7, 2017 and entitled "COMPRESSION AND DECOMPRESSION ENGINES AND COMPRESSED DOMAIN PROCESSORS" and 62/529,688 filed on Jul. 7, 2017 and entitled "LOSSLESS ENCODING AND DECODING SYSTEMS," which are incorporated herein by reference in their entirety.

BACKGROUND

Data compression is used for various types of systems including communication systems, multi-media, information retrieval systems, internal storage systems, inter chip and intra chip Communication, and computer networks. In some situations, data compression may be utilized to reduce data transmission bandwidth and/or the memory required to store data in computer systems. Conventional approaches to lossless data compression are either computationally expensive or fail to produce high compression ratio along with high throughput at low latency. Furthermore, Conventional approaches assume that compressed data has to be decompressed prior to processing. In this application, we present compressed domain processors. These processors enable operating on compressed data in real-time without decompression the data. In each system, the data is encoded in a way that is computationally inexpensive and produces high compression ratio, high throughput, and low latency.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

DETAILED DESCRIPTION

Figure 1:
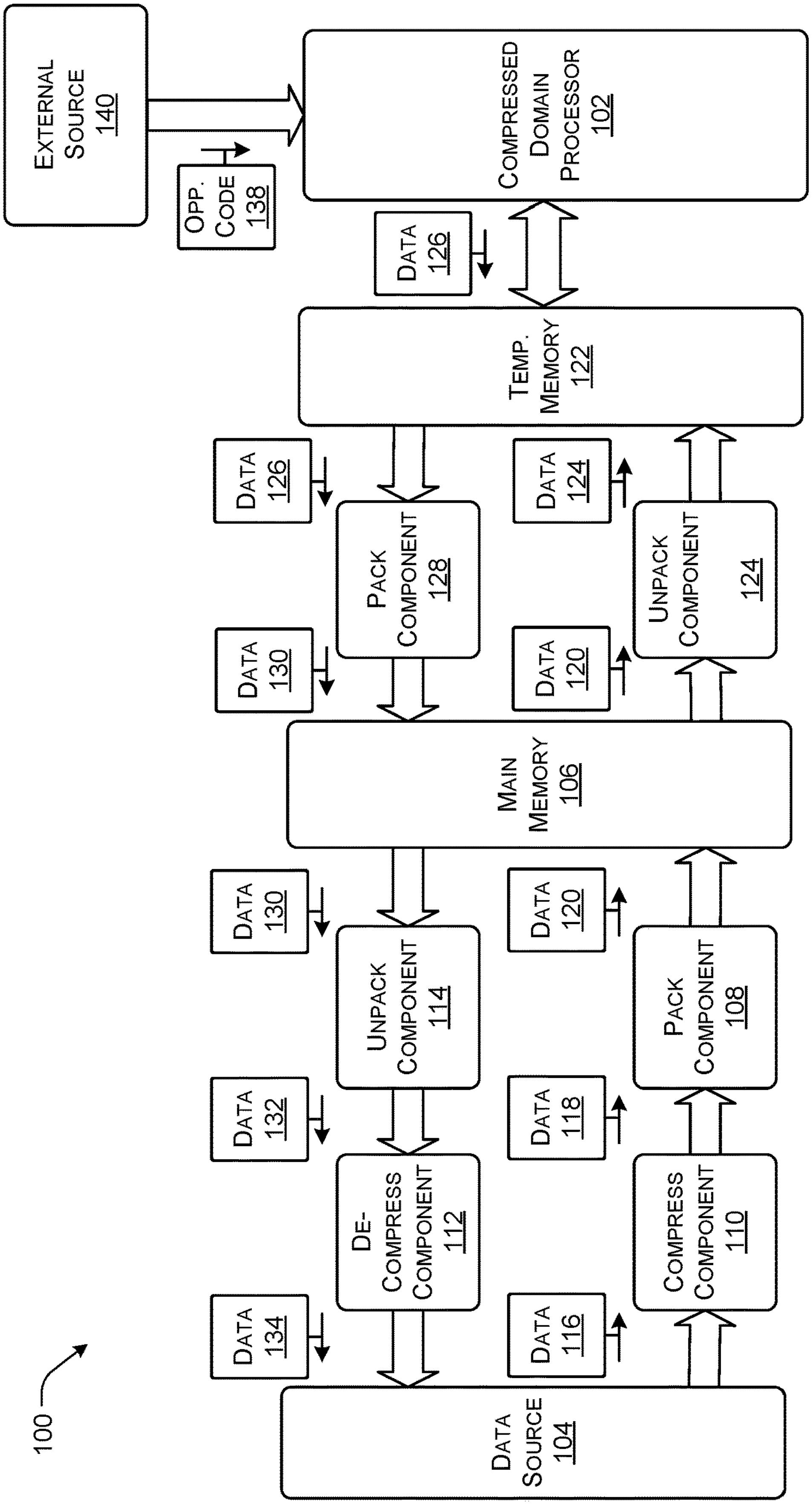
FIG. 1 illustrates a block diagram showing select components of example logic implementing a compressed domain processor according to some implementations.

Described herein are systems for providing efficient lossless data-tokens encoding and decoding and decompression of data-tokens code at high compression, high throughput, low latency, low energy consumption, and low implementation costs. The described encoding systems are referred to as Compression Engines (CEs), while the decoding systems are referred to as Decompression Engines (DE). Additionally, described herein are operation-execution-systems, cores, components, or units that are configured to operate on data stored in a compressed format. These systems are referred to as Compressed Domain Processors (CDPs.)

The CE systems may include an encoding component and a pack component that are configured to convert data-tokens into an encoded and packed representation. Additionally, the DE systems may be configured to unpack and then decode packed code. In various examples below, techniques and system for encoding and decoding of two types of data, symbols and integer values, are discussed. In the implementations utilizing symbols, the symbols are assumed to be members of an alphabet (set of characters). For example, the symbols may be members of the English alphabet set of characters. That is each character from a to z and from A to Z is considered as a symbol. Other examples of symbols, include all the members of the ASCII set of characters or all the members of the Unicode set of characters. Since processing bytes provides for efficient hardware implementation and without limiting the generality, each distinct byte may represent a symbol in a set of symbols that contains all the combinations of eight-bits. Hence, there are 256 symbols in this alphabet, each of which, is represented by a unique combination of eight-bits. Thus, in some cases, data-tokens may be referred to as symbols. In these cases, the data may be a stream of symbols (e.g., a stream of bytes).

For example, the encoding component may be configured to receive data-tokens as symbol, values generally represented as one eight-bit byte or integer values represented in eight-bit scheme, sixteen-bit scheme, thirty-two-bit scheme, sixty-four-bit scheme, or other schemes such as one hundred and twenty-eight-bit schemes. The encoding component may convert the data-token into an encoded representation based on the scheme used. In some cases, however, the data-token may be composed of highly auto-correlated integer sequences.

The second type of data is referred to herein as integers. As described herein, the term 'integer' refer to members of a set or a stream of data elements that represents numbers, indexes, measurements, etc. Moreover, often these data elements have high auto-correlation. In this case, more knowledge of the data (e.g., the nature of correlation between consecutive integers) might be available and may be exploited to improve compression. For example, a sensor might emit a set of numbers that are the results of measurements of the temperature in a specific location in a power plant. Each of these measurements might be represented by sixteen-bits and may be referred to as sixteen-bit 'integer'. Thus, as used herein, the term data-token may represent both symbols and integers. Otherwise, the terms symbols and integers are used as appropriate for specific encoders and decoders.

The CDP system described herein is includes an execution core, configured to execute desired operation on compressed operand or operands and produce a compressed result (e.g., a correct compressed representation of the result if the same operation were to be done on the non-compressed operand or operands). In general, the CDP may achieve the compression via data encoding techniques. Hence, the word compression and encoding are used as synonyms in this document. In a similar way, decompression and decoding are considered to be synonyms herein. Conventional approaches assume that compressed data has to be decompressed prior to using the compressed domain processor to perform operations. Discussed herein are compressed domain processors or cores configured to operate on compressed integers in real-time without decompression. In each example, the data may be encoded in a way that is computationally inexpensive and produces high compression ratio, high throughput, and low latency.

In some implementations, the execution core may be an execution core of a processor or of a co-processor controlled by another processor. For example, several compression techniques preserve order according to a mathematical definition of order e.g., lexical order. Several novel compression technique that enable efficient implementation of a compressed domain processor as discussed below. Examples of compression techniques that maintain or preserve order include SigBits, SigBytes, In-Between, Elias Gamma, Delta, Omega coding, Fibonacci coding, several variants of Golomb coding, Rice coding, and Comma Coding, among others. Details associated with some of the compression techniques are described in more detail below.

In some cases, the compressed domain processor may operate in a compressed integer data domain, thereby reducing the processing associated with decompression and recompression the data prior to and following access operations. Additionally, the processor can enable reduction in data transmission and energy consumption. As described herein, the compressed domain processor may receive or access the compressed data and preform computations or operations on the data within the compressed space (or domain). The operations, such as addition, subtraction, etc. can be the basis for more complex operations, such as statistical analysis as well as sorting and searching, performed on the compressed data. The operations, when executed by operation-execution-system, may produce compressed results that comply with the compression scheme associated with the input data.

For instance, some systems, such as information retrieval systems, storage systems, inter-chip and intra-chip communication systems, image processing systems, video processing systems, communication systems, network systems, and sensor data networks, include components or processors that perform integer operations such as addition, subtraction, multiplication, division, truncation, rounding, etc. In these cases, the conventional method is to store data in a compressed format and to perform operations on the data in an uncompressed and/or decoded format. Thus, the compressed domain processor or unit, capable of performing operations on the compressed data, is able to reduce the processing requirements, communication bandwidth requirements, power requirements, or time requirements associated with unpacking, decompression, compression, packing, etc. the data prior to and following an operation associated with the data without negatively affecting, and potentially even improving, throughput, latency and energy consumption while maintaining low-cost implementation.

For example, a component, such as the compressed domain processor, may desire to add two integers, i and j, to obtain a value l=i+j. The two integers, i and j, may be stored in a compressed (encoded) representations E(i) and E(j). In the conventional approach E(i) is decoded to obtain i, referred to herein as D(E(i))=i. In a similar way, the conventional processor may obtain j by decoding E(j), thus D(E(j))=j. Next the conventional components perform an add operation on, i and j to obtain l or l=i+j. Finally, the conventional components compress l as E(l) and store and/or transmit E(l). Thus, in the conventional method the entire set of operations can be described as: E(l)=E(D(E(i))+D(E(j))).

In the system described herein, the compressed domain processor may be configured to perform the operation to solve directly for: E(l), (e.g., $E(l)=E(i+j)=E(i)+E(j)$), or more generally, $$E(l)=E(i \text{ op } j)=E(i) \text{ op } E(j)=E(D(E(i) \text{ op } D(E(j)))$$

where 'op' denotes a general arithmetic or logical operation such as multiplication or bitwise exclusive-or. The final equality denotes that the result in the compressed domain is equivalent to the result in the uncompressed domain. Thus, the compressed domain processor obtains the same result as the conventional components without performing intermediate decompression and compression operations. Further, it should be understood that the compressed domain processor may perform other operations (e.g., subtraction, multiplication, division, multiply-accumulate, bitwise operations, etc.) on representations E(i) and E(j) while maintaining the correct results under the encoding method E. Additionally, the compressed domain processor may also perform more complex operations such as sorting, searching, statistical analysis, and encryption on compressed representations of integers. For example, in some scenarios, compressed integers might need to be encrypted to safeguard the information. The operation-execution-system described may support encryption of the compressed integer by provision of logical operations, shifts/rotation of the operation results and s-boxes. In general, the operation performed by the compressed domain processor is dictated by a signal, referred to as 'op-code', initiated by other computation units.

Further, while the system described herein is discussed with respect to compressed domain processor, components, or units, in some implementations, the compressed domain processor may be implemented in software, such as via a virtual machine. The compression methods described herein might be applied to the data after pre-processing of the data in the form of "move-to-front", caching, transforms, lossless differential coding etc. In these cases, the compressed domain processor may operate on the pre-processed data.

FIG. 1 illustrates a block diagram showing select components of an example system 100 including a compressed domain processor 102 (or a general processor configured to perform operations on compressed data) according to some implementations. In the current example, a data source 104 (e.g., an external system, component, or device) may exchange data with a main memory 106 or access data stored in the main memory 106. In some cases, the system may be configured to perform operations on uncompressed data and the main memory 106 may be configured to store the data in a compressed representation which may or may not be packed for improved throughput. Thus, in the current example, a pack component 108 and a compression component 110, may be utilized to convert the uncompressed data into compressed and packed data, similarly, a decompression component 112, and an unpack component 114 may be utilized to convert the compressed and packed data into uncompressed data.

For instance, when the data source 104 transmits data 116 in an uncompressed format to be stored in the main memory 106, the compression component 110 may receive the uncompressed data 116 and generate compressed data 118. The compressed data 116 may then be packed by the pack component 108. For example, the compression component 110 may generate variable length compressed representations. Thus, to enable efficient storage within the main memory 106 and better data throughput, the compressed representations of the data 118 may be packed. For instance, the pack component 108 may pack integers into blocks of data prior to storing the packed and compressed data 110 in the main memory 106.

In some cases, the stored data 120 may be accessed and/or modified by a system, device, processor, or component, such as the compressed domain processor 102. Thus, the packed and compressed data 120 may be provided to a temporary memory 122 for access by the compressed domain processor 102. In some examples, the packed and compressed data 120 are unpacked by an unpack component 124 to separate the blocks of compressed integers into individual compressed integers. Since two operands are often utilized during an integer operation, the unpack component 124 may accept one or two packed blocks of integers from the main memory 106, such that the appropriate one or two compressed integers are provided as operands to the compressed domain processor 102. For instance, if the data is compressed according to SigBits described below, one or two compressed integers maybe be provided to the compressed domain processor 102 in the form of $E(i)=\langle P_i, I_i\rangle$, and $E(j)=\langle P_j, I_j\rangle$), as discussed below.

The compressed domain processor 102 may then perform operations on the compressed integers to generate the result data 126 stored in the temporary memory 122 (or other internal memory). In some cases, the result data 126 may be sent back to the main memory 106. In these cases, the result data 126 may be provided to a pack component 128, which may shape the compressed integers back into blocks to generate packed and compressed data 130.

In some situations, the data source 104 may desire to access the information stored in the main memory 106. Thus, when the information is to be output to the data source 104 or another device/system, the compressed and packed representation of the packed and compressed data 130 is sent to the unpack component 114 to generate unpacked compressed data 132. The decode component 112 may receive the unpacked compressed data 132 and generate uncompressed data 134, such as a fixed length code binary representation of the integers.

In some examples, the compressed domain processor 102 may be configured to receive an operation code 138 from an external source 140. The operation code 138 may be instructions or commands that indicate to the compressed domain processor 102 which operation should be performed on the data stored within the temporary memory 122. For example, the temporary memory 122 may store the operands and a result of the operation indicated by the operation code 138 and performed on the operands. Alternatively, in some implementations, the compressed domain processor 102 may be incorporated into a general purpose processing unit such that the operation code 138 may be part of an instruction set associated with the general purpose processing unit. Thus, in this alternative implementation, the general purpose processing unit may operate on compressed data or integers.

Figure 2:
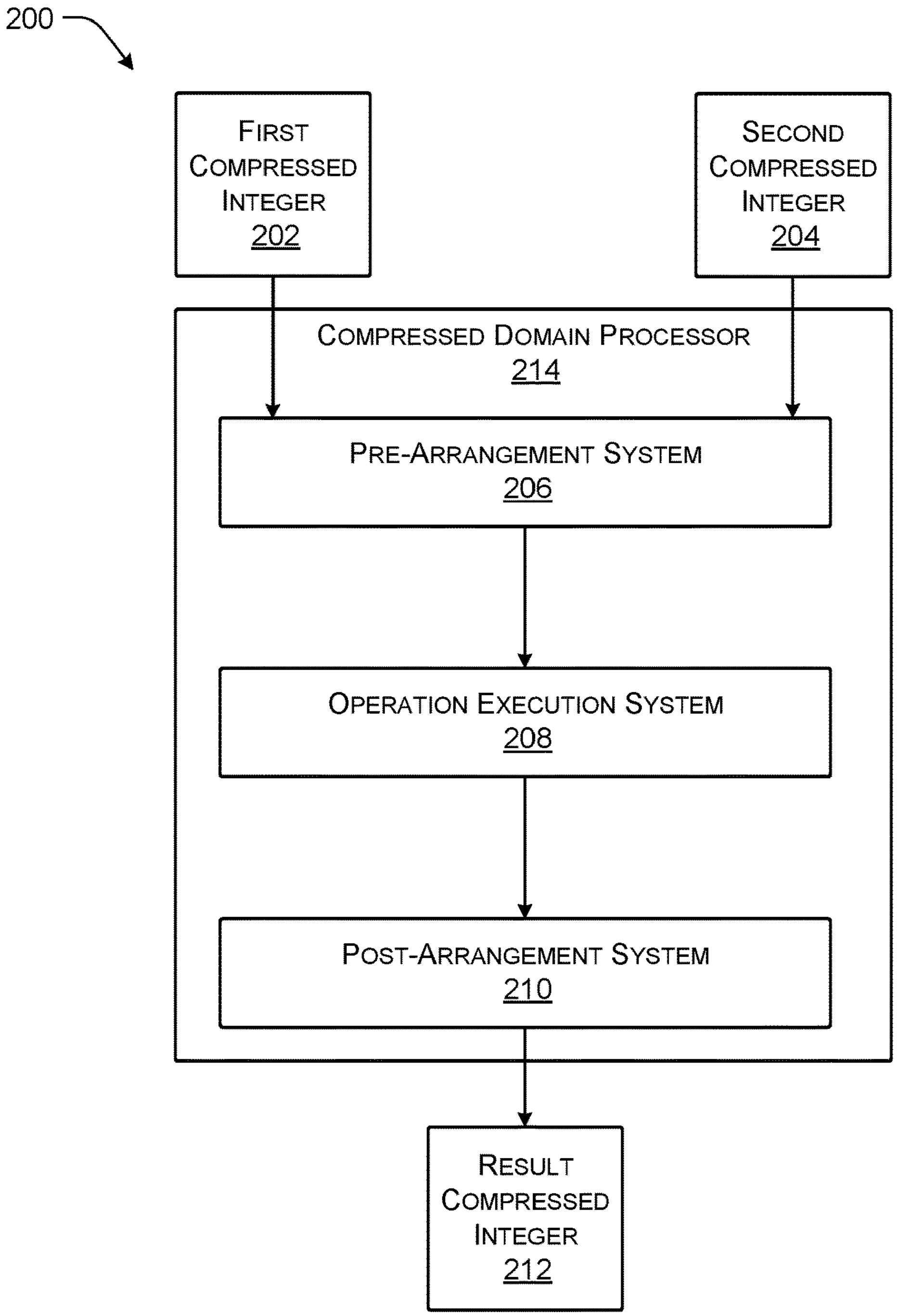
FIG. 2 illustrates a block diagram showing select components of example logic associated with a compressed domain processor according to some implementations.

FIG. 2 illustrates a block diagram showing select components of example logic 200 associated with a compressed domain processor 214 for performing operations on compressed integers, such as a first compressed integer 202 and a second compressed integer 204, according to some implementations. In the illustrated example, a pre-arrangement-system 206 may receive the first and second compressed integers 202 and 204. The pre-arrangement-system 206 may prepare the compressed integers 202 and 204 and send them to an operation-execution-system 208. The operation-execution-system performs an operation, such as add, subtract, multiply, divide, bitwise operations, etc. on the first and second compressed integers 202 and 204. Specifically, presented herein are compressing techniques and compressed domain processors for compressing data and processing the data in the compressed format.

The pre-arrangement-system 206 may be configured to preform pre-arrangement on the compressed integers to align the compressed integers 202 and 204 in a manner that the operation associated with the operation-execution-system 208 may be performed on the compressed version of the integers 202 and 204. The operation-execution-system 208 may include one or more components for performing various operations on the compressed integers 202 and 204, such as add, subtract, divide, multiply, bitwise operations, etc.

The illustrated example, also includes a post-arrangement-system 210. The post-arrangement-system 210 may be configured to preform post-arrangement on the compressed result placing its components in alignment with the actual compression (encoding) format. Additionally, the post-arrangement-system 210 may be configured so that artifacts such as carry or overflow caused by the operation performed by the operation-execution-system 208 are correctly represented in the compressed format of the resulting compressed integer 212. For example, if the operation caused an overflow (e.g., the value is larger than the maximal value supported by the fixed length code binary format), the post-arrangement-system 210 may cause an overflow alert in the form of an overflow flag. In other cases, the post-arrangement-system 210 may adjust the compressed representation, such as by adding a bit to the compressed integer 212, to reflect the impact of the carry.

Figure 3:
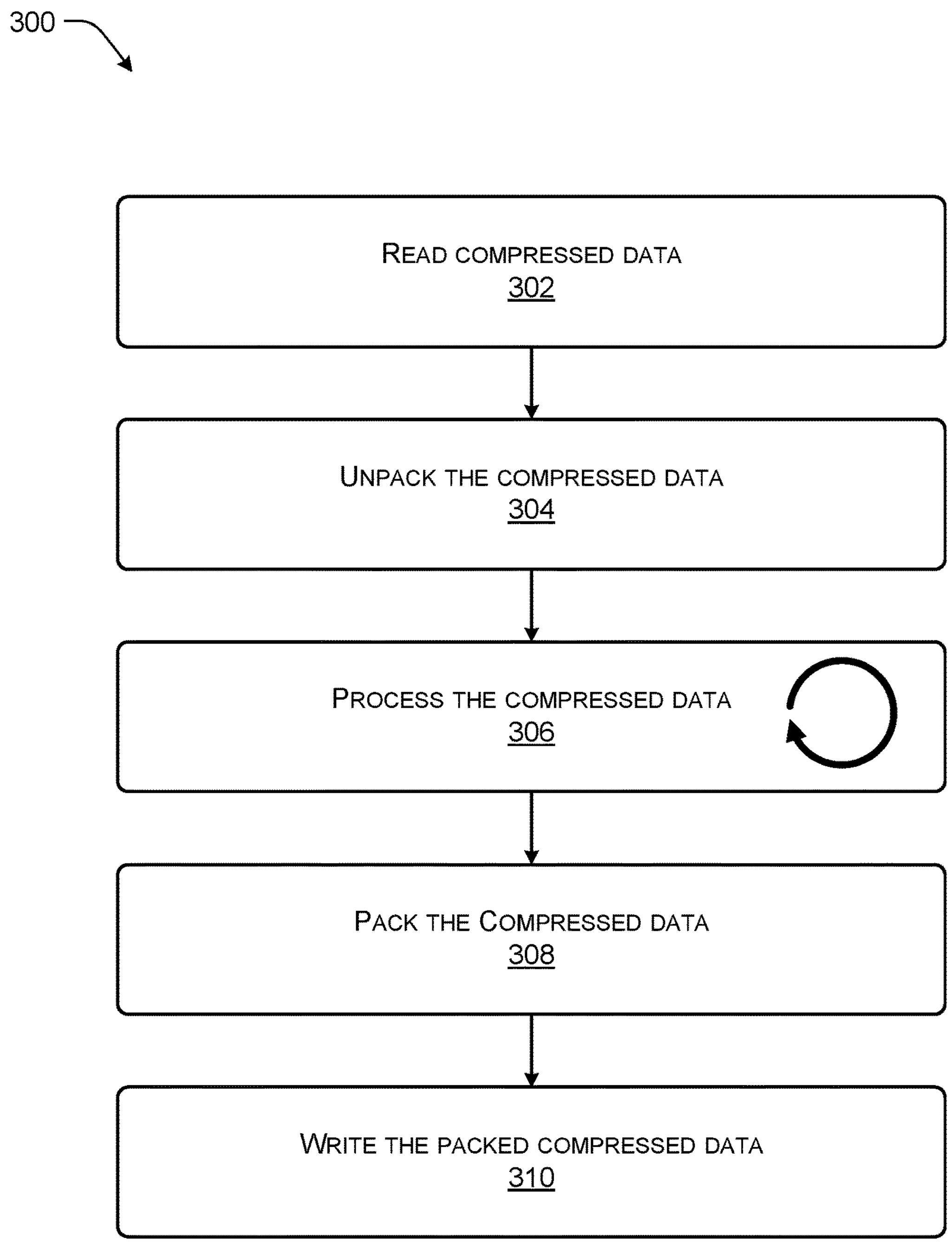
FIG. 3 is an example flow diagram showing an illustrative process for performing operations on compressed integers according to some implementations.

FIG. 3 is an example flow diagram illustrating example processes associated with compressing integers according to some implementations. The processes are illustrated as a collection of blocks in a logical flow diagram, which represent a sequence of operations, some or all of which can be implemented in hardware, software or a combination thereof. In the context of software, the blocks represent computer-executable instructions stored on one or more computer-readable media that, which when executed by one or more processors, perform the recited operations. Generally, computer-executable instructions include routines, programs, objects, components, encryption, deciphering, compressing, recording, data structures and the like that perform particular functions or implement particular data types.

The order in which the operations are described should not be construed as a limitation. Any number of the described blocks can be combined in any order and/or in parallel to implement the process, or alternative processes, and not all of the blocks need be executed. For discussion purposes, the processes herein are described with reference to the frameworks, architectures and environments described in the examples herein, although the processes may be implemented in a wide variety of other frameworks, architectures or environments.

FIG. 3 is example flow diagram showing an illustrative process 300 for performing operations on compressed and packed integers according to some implementations. In this example, a compressed domain processor may be configured to perform the operation to solve directly for E(l), (e.g., E(l)=E(i+j)=E(i)+E(j) or in more general terms E(l)=E(i op j)=E(i) op E(j) where op is an arithmetic, logic, or compound operation or computation). Thus, the compressed domain processor obtains the same result as the conventional components without performing intermediate decompression and compression operations.

At 302, the CDP may read or access data stored in a compressed format and, at 304, the CDP may unpack the data. For example, the data maybe unpacked using one or more filters or shifters to separate the compressed integers from each other.

At 306, the CDP may perform operations such as add, subtract, multiply, divide, bitwise operations etc. on one or two of the compressed integers. For example, the CDP may implement one or more of the adders, subtractors, multipliers, or dividers. In some cases, the CDP may perform series of operations or multiple operations potentially incorporating pipelines and/or other forms of parallelism/high performance computing on the same or different compressed integers prior to advancing to 308.

At 308, the CDP may pack the resulting integer. For example, the CDP may replace one of the operands in the block of data or add the integer to an existing block or create a new block.

At 310, the CDP may write the data potentially in compressed and possibly in packed form back into the storage device. Thus, the CDP may perform the operation to generate a resulting integer or product integer on the compressed integers improving overall throughput and efficiency of a computing system as well as other computing metrics.

The above referenced examples, provide examples of a CDP operating on data that is compressed according to various compression scheme. However, it should be understood that the CDP discussed herein may operate on data compressed according to various other compression schemes.

Figure 4:
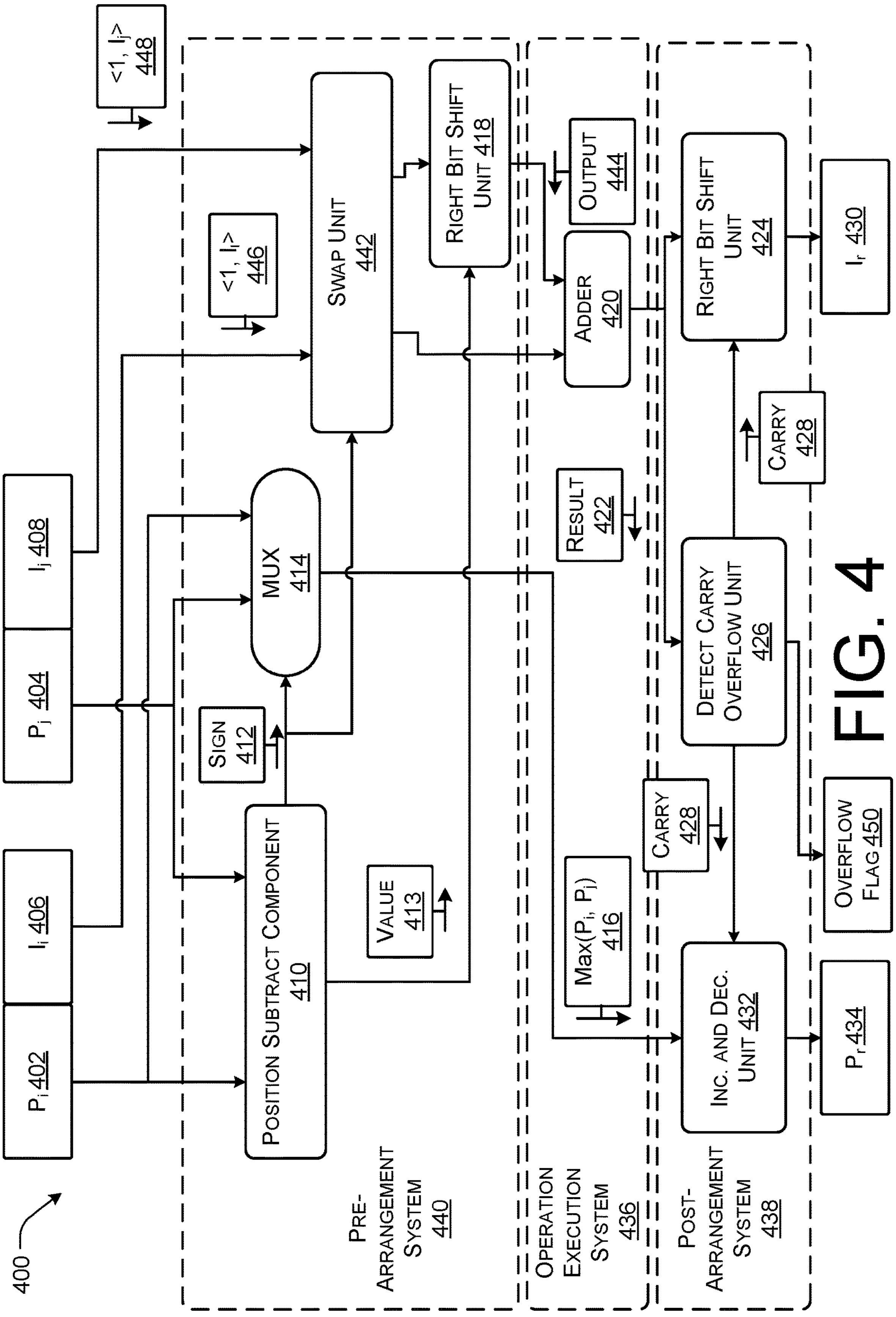
FIG. 4 illustrates a block diagram showing select components of example logic associated with a compressed domain processor according to some implementations.
Figure 5:
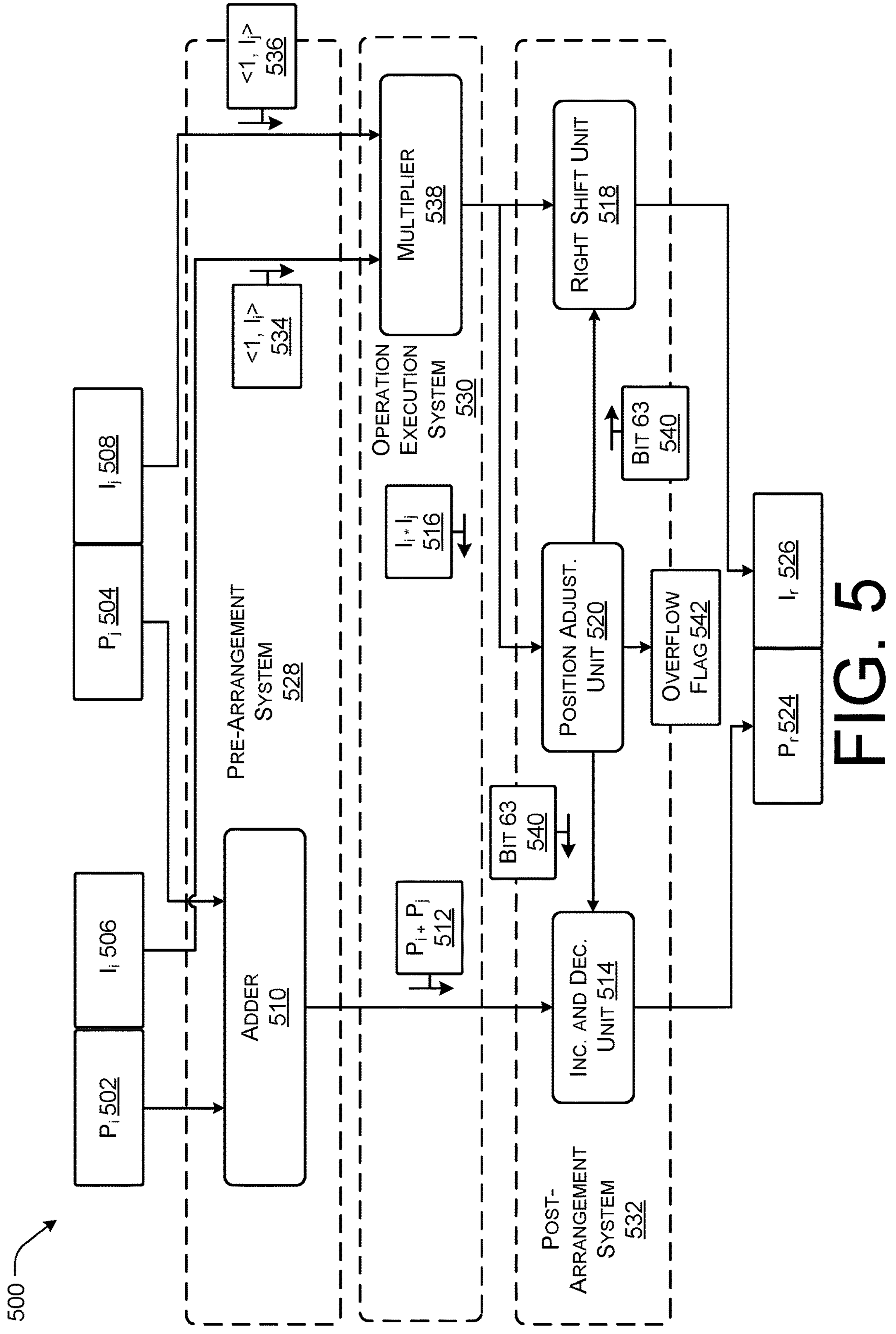
FIG. 5 illustrates a block diagram showing select components of example logic associated with a compressed domain processor according to some implementations.

FIGS. 4 and 5 illustrate examples of logic associated with a compressed domain processor using the thirty-two-bit SigBits compression method described below. However, it should be understood, that the compression component may be configured to receive integer values represented in fixed length code with eight-bit scheme, sixteen-bit scheme, thirty-two-bit scheme, sixty-four-bit scheme, or other schemes such as one hundred and twenty-eight-bit schemes. In some cases, the integer values may be positive integer values (e.g., integers that are greater than zero).

For example, positive integers constrained to thirty-two-bits (i.e., values of less than 4,294,967,296) may be encoded as follows. A thirty-two-bit integer i may have a binary representation of $\beta_i$ with zero or more bits prepended to the left of $\beta_i$. These bits are referred to as the "leading Zeros" (LZs) bits. Each $\beta_i$ includes a most significant bit (MSB) with the value of '1'. This bit is the left most bit of '1' and is referred to herein as the "leading-one" or LO in $\beta_i$. Each bit to the right of the LO may be considered as a part of the frustum, I. Thus, the frustum for an integer i (e.g., $1_i$) may be obtained from i by truncating the fixed length code binary representation of i starting with the LO of $\beta_i$ and each of the bits to the left of the LO of $\beta_i$. For instance, in one specific example, if we set i=9, then the thirty-two-bit representation of i is '00000000000000000000000000001001.' In this case, $\beta_i$ is equal to '1001.' Thus, $I_i$ is equal to '001'. Further, let $P_i$ be a fixed length header (FLH) representing the position of the LO of $\beta_i$. Then, E(i), the encoded representation of the integer i, may have the form: ($P_i$, $I_i$). In other words, the encoded representation of the integer i may include a FLH representation of the position of the LO in $\beta_i$, followed by a variable length code representative of the frustum or the digits of $\beta_i$ that reside to the right of the LO of $\beta_i$. It should be understood, that the LO is truncated from the E(i) representation as, for positive integers, the LO's value is always one. However, in other examples, the LO may be appended to the FLH representing $P_i$ prior to appending $I_i$. In the following we use the notation E(i)=($P_i$, $I_i$) for the SigBits representation of i.

For example, if the compress-component receive the value of '9' having a fixed length code binary representation in 32 bits of '00000000000000000000000000001001', the compress component may generate the representation, E(9), as ⟨00011,001⟩ or '00011001'. This is explained as follows. In the thirty-two-bit representation of '9' the LO is in position three. Three converted to a five-bit fixed length binary header, $P_9$, is '00011'. Additionally, to the right of the LO are the remaining bits of $I_9$, '001', which may be appended onto the $P_9$ to provide the representation, E(9)=⟨$P_9$, $I_9$⟩, of '00011001'. It should be noted that variations of the SigBits method exist and their implementation in a compressed domain process is similar to the embodiment described here.

FIG. 4 illustrates a block diagram showing select components of example logic associated with a compressed domain processor 400 for preforming addition on integers, i and j, compressed using SigBits (or other compression schemes that use a fixed header and a variable frustum) as compressed integers, E(i) and EU), according to some implementations. Thus, E(i)=⟨$P_i$, $I_i$⟩ and E(j)=⟨$P_i$, $I_j$⟩, where $P_i$ 402, $P_i$ 404, $I_i$ 406, and $I_j$ 408.

For instance, in the illustrated example, the compressed domain processor 400 may include a pre-arrangement-system 440, that prepares the operands to be provided to an operation-execution-system 436 which performs the operation and provides the intermediate result, and a post-arrangement-system 438, that rearranges the intermediate result in a form that complies with the SigBits encoding scheme, as discussed above with respect to FIG. 2.

In some cases, the pre-arrangement-system 440 may align the two frustums so that the least significant bit of both operands are located in the same position within temporary registers. The alignment is achieved by restoring the leading one, to each of the frustums and by calculating the difference between the fixed length headers of the two operands. Then, shifting the smallest value, restored with LO frustum 446 or 448 by the adequate number of bits to the right. The pre-arrangement system 440 sends the aligned operands to the operation-execution-system 436. The result 422 of the addition done by the operation-execution-system 436 has the same number of bits as the two operands. Yet, in some cases, the result 422 might generate a carry-out bit 428.

In the case of a carry-out, the post-arrangement-system 438 adjusts the result 422 by shifting the result by one bit to the right. The leading one of the adjusted result is removed creating the result's frustum 430. In case of no carry-out 428, the fixed length header 434 of the result is the fixed length header of the largest input frustum 416. In case of a carry-out the largest fixed length header 416 is incremented by 1 and serves as the fixed length header 434 of the result 422. The frustum 430 is concatenated to the fixed length header 434 to generate the SigBits representation of the result 422. In the case that the new value of the fixed length header 434 exceeds the number of bits allocated to the headers, the post-arrangement-system 438 detects an overflow condition and sets an overflow flag 450. In the current example, the fixed length headers $P_i$ 402 and $P_j$ 404 are provided to a position subtract component 410 of the pre-arrangement-system 440. In this example, the position subtract component 410 subtracts the value of $P_i$ 402 from $P_j$ 404 to determine a sign 412 and value 413. It should also be understood that the position subtract component 410 may, alternatively, subtract the value of $P_j$ 404 from $P_i$ 402 to determine the sign 412 and the value 413. Additionally, in some implementations, the position subtract component 410 may be configured to subtract the larger value from the smaller value or vice versa.

The sign 412 is provided to a multiplexer MUX 414 of the pre-arrangement-system 440 and to a swap unit 442 of the pre-arrangement-system 440. The MUX 414 also receives $P_j$ 404 and $P_i$ 402 as inputs and outputs the position Pas the max ($P_j$, $P_i$), generally indicated by 416. As discussed above, the swap unit 446 receives the sign 412 from the position subtract component 410 as well as $I_i$ 406 and $I_j$ 408, each of the frustums is prepended by a bit of '1' (referred to as prepended-by-one frustums) to restore the leading one and indicated by ⟨1, $I_i$⟩ 446 and ⟨1, $I_j$⟩ 448.

The swap unit 442 determines which of ⟨1, $I_i$⟩ 446 and ⟨1, $I_j$⟩ 448 is greater using the sign 412. The swap unit 442 provides the smaller of the two prepended-by-one frustums ⟨1, $I_i$⟩ 446, and ⟨1, $I_j$⟩ 448 to the right shift unit 418 and the larger of the two prepended-by-one frustums ⟨1, $I_i$⟩ 446, and ⟨1, $I_j$⟩ 448 to the adder 420. The right shift unit 418 (such as a right barrel shifter) may receive the value 413 determined by the position subtract component 410 and based on the value 413 right-shift the smaller of the prepended-by-one frustums ⟨1, $I_i$⟩ 446, and ⟨1, $I_j$⟩ 448 to align the bits of the two prepended-by-one frustums ⟨1, $I_i$⟩ 446, and ⟨1, $I_j$⟩ 448 prior to adding the prepended-by-one frustums ⟨1, $I_i$⟩ 446, and ⟨1, $I_j$⟩ 448. Once the right shift unit 418 has aligned the smaller of the two prepended-by-one frustums ⟨1, $I_i$⟩ 446 or ⟨1, $I_j$⟩ 448, the aligned smaller of the two prepended-by-one frustum ⟨1, $I_i$⟩ 446 or ⟨1, $I_j$⟩ 448 is provided as output 444 to the adder 420.

Once both the larger of the two prepended-by-one frustums ⟨1, $I_i$⟩ 406, and ⟨1, $I_j$⟩ 408 and the right-shifted smaller of the two prepended-by-one frustums ⟨1, $I_i$⟩ 446 and ⟨1, $I_j$⟩ 448 (e.g., the output 444) are received by the adder 420, the guard interval (GI) adder 420 may add the two prepended-by-one frustums ⟨1, $I_i$⟩ 446 and ⟨1, $I_j$⟩ 448 together. The result 422 from the adder 420 is provided to a right shift unit 424 of the post-arrangement-system 438 and to a detect carry and overflow unit 426 of the post-arrangement-system 438.

In the case of a carry 428, the detect carry and overflow unit 426 determines that an additional bit has to be prepended to the result 422. The detect carry and overflow unit 426 then provides an indication of the carry 428 to the right shift unit 424 to cause the right shift unit 424 to prepend a bit of '1' to the result 422 when necessary and, next, generate $I_r$ 430 by removing the leading one. The indication of the carry 428 as well as the max ($P_i$, $P_j$) 416 is received by an increment and decrement unit 432. The increment and decrement unit 432 may be configured to increase the value of max ($P_i$, $P_j$) 416 when a digit is added to generate $P_r$ 434. In some cases, $P_r$ 434 may be concatenated with the $I_r$ 430 to form the compressed representation of the integer r resulting from adding the compressed representation of the integers i and j.

In some cases, the carry 428 detected by the detect carry and overflow unit 426 may cause an overflow (e.g., when adding a bit to the result 422 causes the value to exceed a limit of the scheme being implemented by a device, such as a value in excess of a thirty-two-bit or 64-bit restraint). In these cases, the detect carry and overflow unit 426 may set an overflow flag 450.

SigBits may be extended to include signed number representation as well as a representation for zero. In this case, subtraction may be implemented in a way that is similar to the addition described above. With the extension of the adder logic to include subtraction logic and expansion of the result-bit-shifter to enable additional shifting capabilities associated with the subtraction result to allow for the execution of subtraction operations on the compressed integers. It should also be understood that other operations, such as multiplication, division, bitwise operations, etc. may also be implemented by the operation-execution-system 436 in a manner similar to the one discussed above.

In the current example, the compressed domain processor 400 is shown with the GI adder 420, but in other implementations the GI adder 420 using 2's complement logic or a subtractor unit may be used to perform subtraction as well as addition on the compressed integers E(i) and E(j).

FIG. 5 illustrates a block diagram showing select components of example logic associated with a compressed domain processor 500 for performing multiplication of integers, i and j, compressed using SigBits (or other compression schemes that use a fixed header and a variable frustum). In some cases, the compressed i and j may be represented as, E(i) and E(j), according to some implementations. Thus, $E(i)=\langle P_i, I_i\rangle$ and $E(j)=\langle P_j, I_j\rangle$, where $P_i$ is illustrated as 502, $P_j$ is illustrated as 504, $I_i$ is illustrated as 506, and $I_j$ is illustrated as 508. For instance, in the illustrated example, the compressed domain processor 500 may include a pre-arrangement-system 528, an operation-execution-system 530, and a post-arrangement-system 532 as discussed above with respect to FIG. 2.

The pre-arrangement-system 528 feeds the two frustums, each of which is prepended by a bit of '1', $\langle 1, I_i\rangle$ 534, and $\langle 1, I_j\rangle$ 536, to the multiplier, at the same time the pre-arrangement-system 528 calculates the number of bits of the result by adding the two fixed length header $P_i$ 502, and $P_j$ 504. The result of the multiplication done by the operation-execution-system 530 has either $P_i+P_j+1$ or $P_i+P_j+2$ bits depending on whether bit 63 of the multiplier result is one or zero.

The post-arrangement-system 532 adjusts the result of the multiplier 516 according to the value of bit 63. If bit 63 is equal to one, the result is shifted by one bit to the left to remove the LO and is prepended by a five bit FLH with the value of $P_i+P_j+1$ to create the compressed representation of the result. If bit 63 is equal to zero, the result is shifted by two bits to the left to remove the zero and the LO and is prepended by a five bit FLH with the value of $P_i+P_j$ to create the compressed representation of the result. Additionally, the post-arrangement-system 532 checks for overflow and set an overflow flag 542 if an overflow has occurred (i.e., the calculated FLH for the result is larger than 31).

In the example, the fixed length headers $P_i$ 502 and $P_j$ 504 are provided to an adder component 510. In this example, the adder component 510 adds the value of $P_i$ 502 to $P_j$ 504 to determine $P_i+P_j$ 512. The value of $P_i+P_j$ 512 is provided to an increment and decrement unit 514. The two frustums are prepended by a bit of '1' to restore the leading one. Next, $\langle 1, I\rangle$ 534 and $\langle 1, I\rangle$ 536 are provided to a multiplier component 538 and a result of the multiplication, $\langle 1, I_i\rangle\times\langle 1, I_j\rangle$ 516, is provided to a right shift unit 518 (e.g., a right barrel shifter) and a position adjust unit 520.

The position adjust unit 520 may detect the value of bit 63 of the multiplier result $\langle 1, I_i\rangle\times\langle 1, I_j\rangle$ 516. An indication of the value 540 of bit 63 of the multiplier result 516 may be sent to the increment and decrement unit 514 and the right shift unit 518. In the case of a value of one in bit 63, the increment and decrement unit 514 may increase the value of $P_i+P_j$ 512 by one to represent the additional bit of '1', thereby, generating $P_r$ 524. In the case of a value of zero in bit 63, the increment and decrement unit 514 pass the value of $P_i+P_j$ 512, thereby, generating $P_r$ 524. Likewise, the right shift unit 518 may remove bit 63 if it is '1' or remove bit 63 and 62 if bit 63 is '0', thereby, generating $I_r$ 526.

It should be understood, that division and modulo operations can be implemented on the compressed integers with the addition of a hardware divider that divides the two prepended-by-one frustums $\langle 1, I_i\rangle$ 506, and $\langle 1, I_j\rangle$ 508, and calculates the result $P_R$ 524. The value of $P_R$ 524 is calculated based on the difference between $P_i$ 502, and $P_j$ 504 and adjusted by the increment and decrement unit based on the number of leading zero bits removed from the result via one or more shift components.

In some examples, SigBits may be extended to include operations on real numbers represented in fixed point format and signed numbers represented under a signed number representation. In these cases, multiplication, division, modulo, and other operations may be implemented in a way that is similar to the multiplication described above. With the extension of the multiply logic to include division logic and expansion of the result bit shifter to enable additional shifting capabilities associated with the division result to allow for the execution of division operations on the compressed integers.

Figure 6:
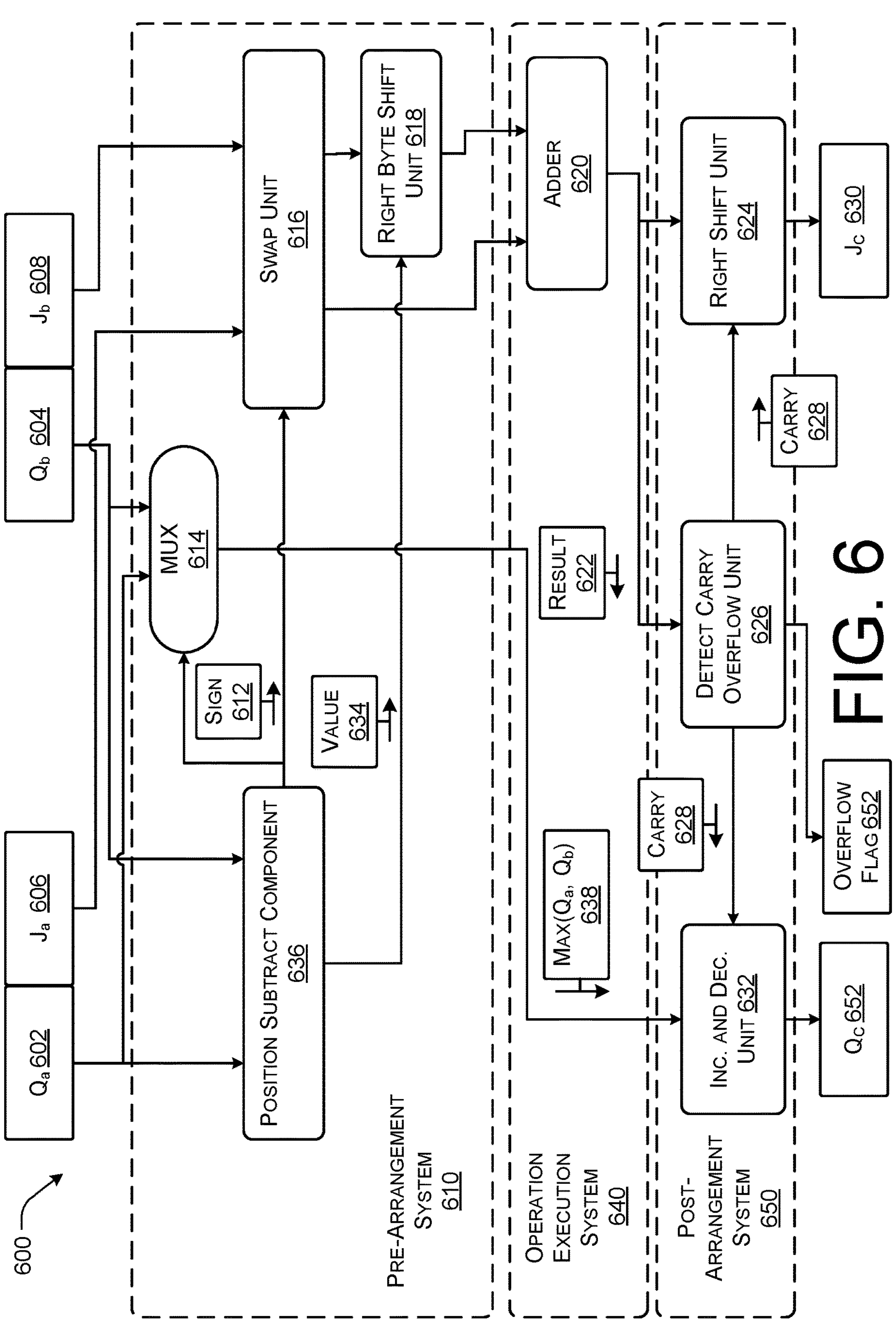
FIG. 6 illustrates a block diagram showing select components of example logic associated with a compressed domain processor according to some implementations.
Figure 7:
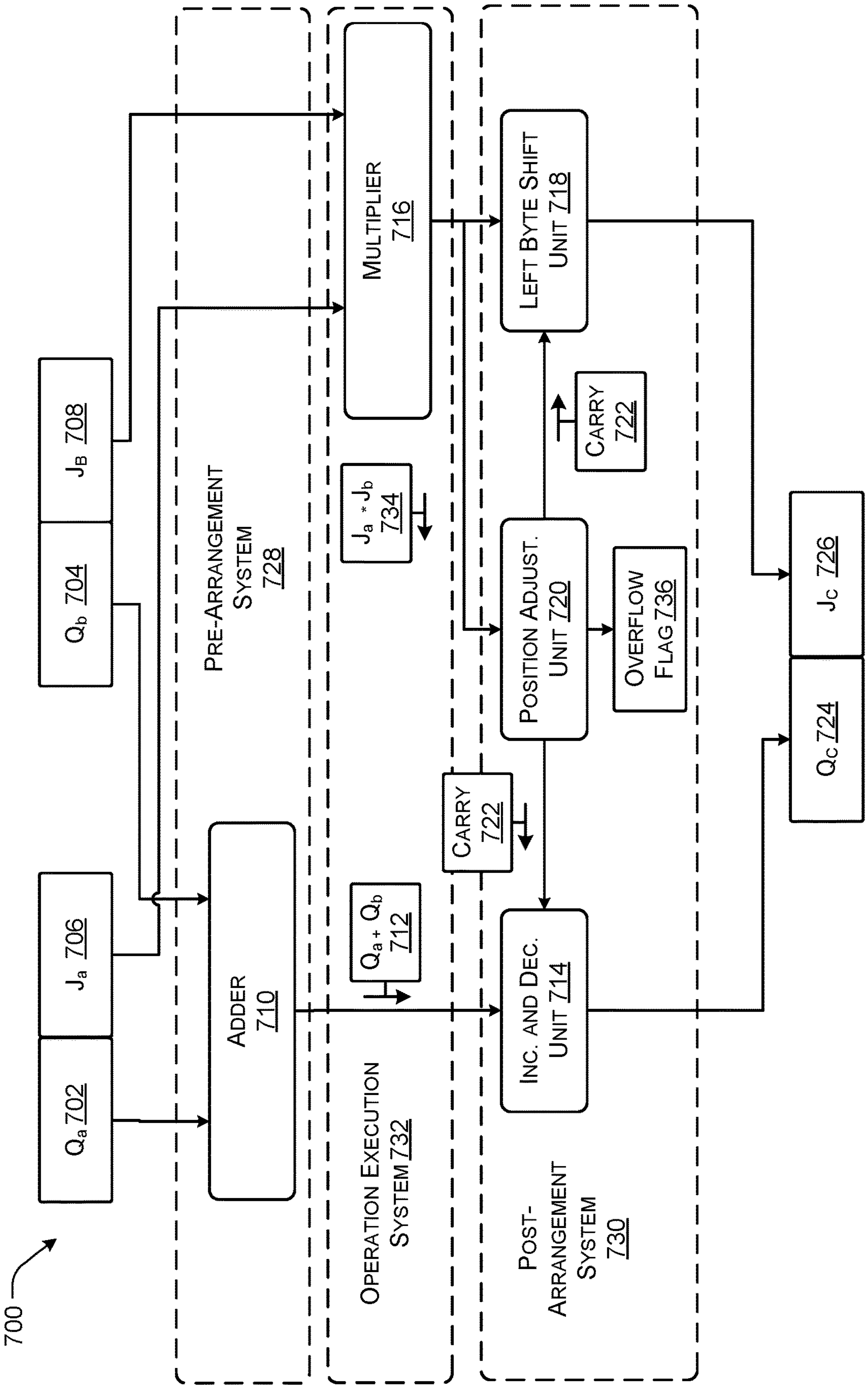
FIG. 7 illustrates a block diagram showing select components of example logic associated with a compressed domain processor according to some implementations.

FIGS. 6 and 7 illustrate examples of logic associated with a compressed domain processor using the SigBytes compression method. In some embodiments of SigBytes, the encode component is configured to receive non-negative integer values (i.e., integers that are greater than or equal to zero) represented in thirty-two-bit fixed length code scheme. For example, non-negative integers (i.e., integers that are greater than or equal to zero) constrained to 32 bits (i.e., values of less than 4294967296) may be encoded as follows. A thirty-two-bit non-negative integer k may have a binary representation of $\beta_k$ with zero or more bits of '0' prepended to the left of $\beta_k$. Let $J_k$ be the minimal representation of $\beta_k$ using bytes and let $Q_k+1$ be the minimum number of bytes required to represent $\beta_k$ (i.e., $Q_k+1$ is the number of bytes in $J_k$). The component $J_k$ is referred to as the byte-frustum of k. For thirty-two-bit fixed length integers the range of possible values for $Q_k+1$ are 1, 2, 3, and 4. Hence, the range of values for $Q_k$ is 0, 1, 2, and 3; and $Q_k$ can be represented with a 2-bit fixed length header. In the following we use the notation $E(k)=\langle Q_k, J_k\rangle$ for the SigBytes representation of k.

For instance, in one specific embodiment of SigBytes, if we set k=9, then the thirty-two-bit representation of k is '00000000000000000000000000001001', In this case, $\beta_9$ is equal to '1001.' Thus, $J_9$ is equal to '00001001'. Furthermore, in this case, $Q_k+1=1$, and, hence, $Q_k=0$ and it can be represented as '00.' Thus, E(9), the encoded representation of the integer 9 under SigBytes, may have the form: $E(9)=\langle Q_9, j_9\rangle=\langle 00,00001001\rangle$='0000001001'. SigBytes encoded integers may be packed by combining the headers of four integers into one byte and the byte-frustums of these integers in consecutive bytes. It should be noted that variations of the SigBytes method exist and their implementation in a compressed domain process is similar to the embodiment described here.

FIG. 6 illustrates a block diagram showing select components of example logic associated with a compressed domain processor 600 for preforming addition on compressed integers according to some implementations. For example, the illustrated logic may be configured to process bytes of data as opposed to the logic of FIG. 4 that processes bits of data. In the current example, we consider compressed integers, E(a) and E(b), according to some byte oriented encoding implementations. Thus, $E(a)=\langle Q_a, J_a\rangle$ and E(b)=

$\langle Q_b, J_b \rangle$, where $Q_a$ is illustrated as 602, $Q_b$ is illustrated as 604, $J_a$ is illustrated as 606, and $J_b$ is illustrated as 608.

For instance, in the illustrated example, the compressed domain processor 600 may include a pre-arrangement-system 610, that prepares the operands to be provided to the operation-execution-system 640, which performs the operation and provides the intermediate result, to a post-arrangement-system 650, that rearranges the intermediate result in a form that complies with the encoding scheme, as discussed above with respect to FIG. 2.

The pre-arrangement-system 610 aligns the two byte-frustums so that the least significant bytes of both operands are located in the same position within temporary registers, to enable adding same position bytes. The alignment is achieved by calculating the number of byte-difference between the two operands' Q headers and shifting the smallest byte-frustums by the adequate number of bytes to the right. The pre-arrangement-system then feeds the two aligned operands to the operation-execution-system 640. The result 622 of the addition operation performed by the operation-execution-system 640 and may, in some situations, have a carry.

For instance, in one situation, the result 622 is four bytes and a carry is generated, then an overflow situation has occurred and the corrected result may not be represented in four bytes. Thus, in this case, an overflow flag 652 may be set. In a second case, the result 622 may be less than four bytes and a carry 628 is generated, the post-arrangement-system 650 adjusts the result 622 by shifting the result 622 to the right by one byte. The adjusted result 622 is the new byte-frustum ($J_c$) of the SigBytes code and $Q_c$ is set to be $Q_c$=max($Q_a$, $Q_b$)+1. In a third case, no carry 628 has been generated. In this case, the result 622 is the new byte-frustum ($J_c$) of the SigBytes code and $Q_c$ is set to be $Q_c$=max($Q_a$, $Q_b$).

In one specific example, the fixed length headers $Q_a$ 602 and $Q_b$ 604 are provided to a position subtract component 636. Given that $Q_a$ 602 and $Q_b$ 604 are two-bits components, the position subtract can actually be implemented via a simple combinatorial logic. In this example, the position subtract component 636 subtracts the value of $Q_a$ 602 from $Q_b$ 604 to determine a sign 612 and value 634. It should also be understood that the position subtract component 636 may, alternatively, subtracts the value of $Q_b$ 604 from $Q_a$ 602 to determine the sign 612 and the value 634. Additionally, in some implementations, the position subtract component 636 may be configured to subtract the larger value from the smaller value or vice versa.

The sign 612 is provided to a multiplexer MUX 614 and to a swap unit 616. The MUX 614 also receives $Q_a$ 602 and $Q_b$ 604 as inputs and generates the position Q as the max ($Q_a$, $Q_b$), generally indicated by 638. As discussed above, the swap unit 616 receives the sign 612 from the position subtract component 636 as well as $J_a$ 606 and $J_b$ 608 (e.g., the byte-frustums of the integers a and b).

The swap unit 616 is able to determine which of $J_a$ 606 and $J_b$ 608 has more bytes using the sign 612. The swap unit 616 provides the smaller byte-frustum of $J_a$ 606 and $J_b$ 608 to the right byte shift unit 618 and the larger byte-frustum of $J_a$ 606 and $J_b$ 608 to the adder 620. The right byte shift unit 618 (such as a right byte barrel shifter) may receive the value 634 determined by the position subtract component 636 and based on the value 634 shifts the smaller byte-frustum of $J_a$ 606 and $J_b$ 608 to align the bytes of the two byte-frustums $J_a$ 606 and $J_b$ 608 prior to adding the two byte-frustums $J_a$ 606 and $J_b$ 608. Once the right byte shift unit 618 has aligned the smaller of the two byte-frustums $J_a$ 606 and $J_b$ 608, the aligned byte-frustums of $J_a$ 606 and $J_b$ 608 are provided to the adder 620.

Once both the larger of the two byte-frustums $J_a$ 606 and $J_b$ 608 and the aligned smaller of the two byte-frustums $J_a$ 606 and $J_b$ 608 are received by the adder 620. The adder 620 may add the two aligned byte-frustums $J_a$ 606 and $J_b$ 608 together. The results 622 from the adder 620 is provided to a right byte shift unit 624 and to a detect carry and overflow unit 626.

In the case of a carry 628 the detect carry and overflow unit 626 determines that an additional byte has to be prepended to the result 622. The detect carry and overflow unit 626 then provides an indication of the carry 628 to the right byte shift unit 624 to cause the right shift unit 624 to add a byte with a value of 1 to the result 622 when necessary and thereby generate $J_c$ 630. The indication of the carry 628 as well as the max ($Q_a$, $Q_b$) 638 is received by an increment and decrement unit 632. The increment and decrement unit 632 may be configured to increase the value of max ($Q_a$, $Q_b$) 638 when a byte is added to generate $Q_c$ 652. In some cases, $Q_c$ 652 may be concatenated with the $J_c$ 630 to form the compressed representation of the integer c resulting from adding the compressed representation of the integers a and b.

In some specific examples, the carry 628 may also be prepended to the result 622 by the detect carry overflow unit 626. Additionally, in some cases, the carry 628 detected by the detect carry and overflow unit 626 may cause an overflow (e.g., when adding a byte to the result 622 causes the value to exceed a limit of the scheme being implemented by a device). In these cases, the detect carry and overflow unit 626 may set an overflow flag 652.

SigBytes can be extended to include signed number representation. In this case, subtraction may be implemented in a way that is similar to the addition described above. With the extension of the adder logic to include subtraction logic and expansion of the result byte shifter to enable additional shifting capabilities associated with the subtraction result to allow for the execution of subtraction operations on the compressed integers.

In the current example, the compressed domain processor 600 is shown with the adder 620, but in other implementations the adder 620 using 2's complement logic or a subtractor unit may be used to perform subtraction as well as addition on the compressed integers E(a) and E(b).

FIG. 7 illustrates a block diagram showing select components of example logic associated with a compressed domain processor 700 for preforming multiplication on compressed integers according to some implementations. For example, the illustrated logic may be configured to process bytes of data as opposed to the logic of FIG. 4 that processes bits of data.

The pre-arrangement-system 728 aligns the two byte-frustums so that the least significant bytes of both operands are located in the same position within temporary registers, to enable adding same position bytes. The alignment is achieved by calculating the number of byte-difference between the two operands' Q headers and shifting the smallest byte-frustums by the adequate number of bytes to the right.

The pre-arrangement-system feeds the two byte-frustums $J_a$ 706 and $J_b$ 708, to the multiplier, at the same time it calculates the number of bytes of the result by adding the two fixed length headers $Q_a$ 702 and $Q_b$ 704. The result of the multiplication done by the operation-execution-system 732 has either $Q_a$+$Q_b$+1 or $Q_a$+$Q_b$+2 bytes, depending on whether the most significant byte of the multiplier result is zero or has any value different from zero in it.

The post-arrangement-system 730 takes the result of the multiplier and adjusts it based on the value of the most significant byte. If the most significant byte has a value different from zero, the multiplier result is the byte-frustum of the result $J_c$, and $Q_c$, is calculated as $Q_a+Q_b+1$ represented as a number of bytes equal to $Q_a+Q_b+2$ to create the compressed representation of the result. If the most significant byte has a value of zero, the multiplier result is shifted left by one byte to generate the byte-frustums of the result $J_c$, and $Q_c$ is calculated as $Q_a+Q_b$ to create the compressed representation of the result. The post-arrangement-system 730 sets an overflow flag 736 if an overflow condition was met when the new calculated $Q_c$ for the result is larger than 3 (e.g. the result is 4 bytes).

In the current example, compressed integers, E(a) and E(b), according to some implementations, are considered. Thus, $E(a)=\langle Q_a, J_a\rangle$ and $E(b)=\langle Q_b J_b\rangle$. The result is denoted as, $E(c)=\langle Q_c, J_c\rangle$. In the current example, the fixed length headers $Q_a$ 702 and $Q_b$ 704 are provided to an adder component 710 in a pre-arrangement-system 728. In this example, the adder component 710 adds the value of $Q_a$ 702 and $Q_b$ 704 to determine $Q_a+Q_b$ 712. The value of $Q_a+Q_b$ 712 is provided to an increment and decrement unit 714 of a post-arrangement-system 730. The two byte-frustums $J_a$ 706 and $J_b$ 708 are provided to a multiplier component 716 of an operation execution-system 732 and a result of the multiplication, $J_a \times J_b$ 734, is provided to a left byte shift unit 718 (such as a byte left barrel shifter) and a position adjust unit 720

The position adjust unit 720 may detect if the most significant byte of the multiplier result has a value different than zero. An indication of whether the most significant byte is equal to zero may be sent to the increment and decrement unit 714 and to the left byte shift unit 718 (i.e., carry 722). In the case that the most significant byte is not equal to zero, the increment and decrement unit 714 may set $Q_c$ to be $Q_c=Q_a+Q_b$+1, i.e., incrementing $Q_a+Q_b$ 712 by one to represent the additional byte, thereby, generating $Q_c$ 724. In the case that the most significant byte is equal to zero, the increment and decrement unit 714 passes the value of $Q_a+Q_b$ 712 as is, thereby, generating $Q_c$ 724. Likewise, the left byte shift unit 718 may remove the most significant byte from the byte-frustum $J_a \times J_b$ 734 if the most significant byte is equal to zero or pass it as is if it was not equal to zero and, thereby, generate $J_c$ 726.

In one specific example, the multiplier 716 may be a thirty-two-bit multiplier and the compressed domain processor 700 may first set $Q'_l=Q_a+Q_b$. The compressed domain processor 700 may then set $X_c=J_a \times J_b$. For instance, $J_a$ and $J_b$ are left aligned and each have a most significant non-zero byte in the position of byte four in a four-byte integer representation. Additionally, in this example, let $X_c$ be an eight-byte register, which can hold the maximal value of the two four-byte integer multiplication. The compressed domain processor 700 may also detect if the most significant byte of the result $X_c$ is equal to zero (e.g., the most significant byte has a zero value), in the case that it is zero, then $Q_c=Q'_l$ otherwise, if the most significant byte of $X_c$ has a value different than zero, then $Q_c=Q'_l+1$. If the resultant $Q_c$ is larger than three (e.g., more than four bytes are needed to represent the result of the multiplication of a and b), then the compressed domain processor 700 sets an overflow flag denoting that an overflow occurred. Furthermore, if the most significant byte of $X_c$ is equal to zero, the result $X_c$ is shifted left by one byte by the left byte shift unit 718 to generate $J_c$. 726. If the most significant byte of $X_c$ is not equal to zero $X_c$ is used directly to generate $J_c$, and $E(c)=\langle Q_c, J_c\rangle$.

It should be understood, that division and modulo operations can be implemented on the compressed integers with the addition of a hardware divider that divides the two compressed J components, $J_a$ 706 and $J_b$ 708, calculates the result $Q_c$ based on $Q_a$ , $Q_b$, and adjusts the result via one or more shift components to remove leading zero bytes.

Figure 8:
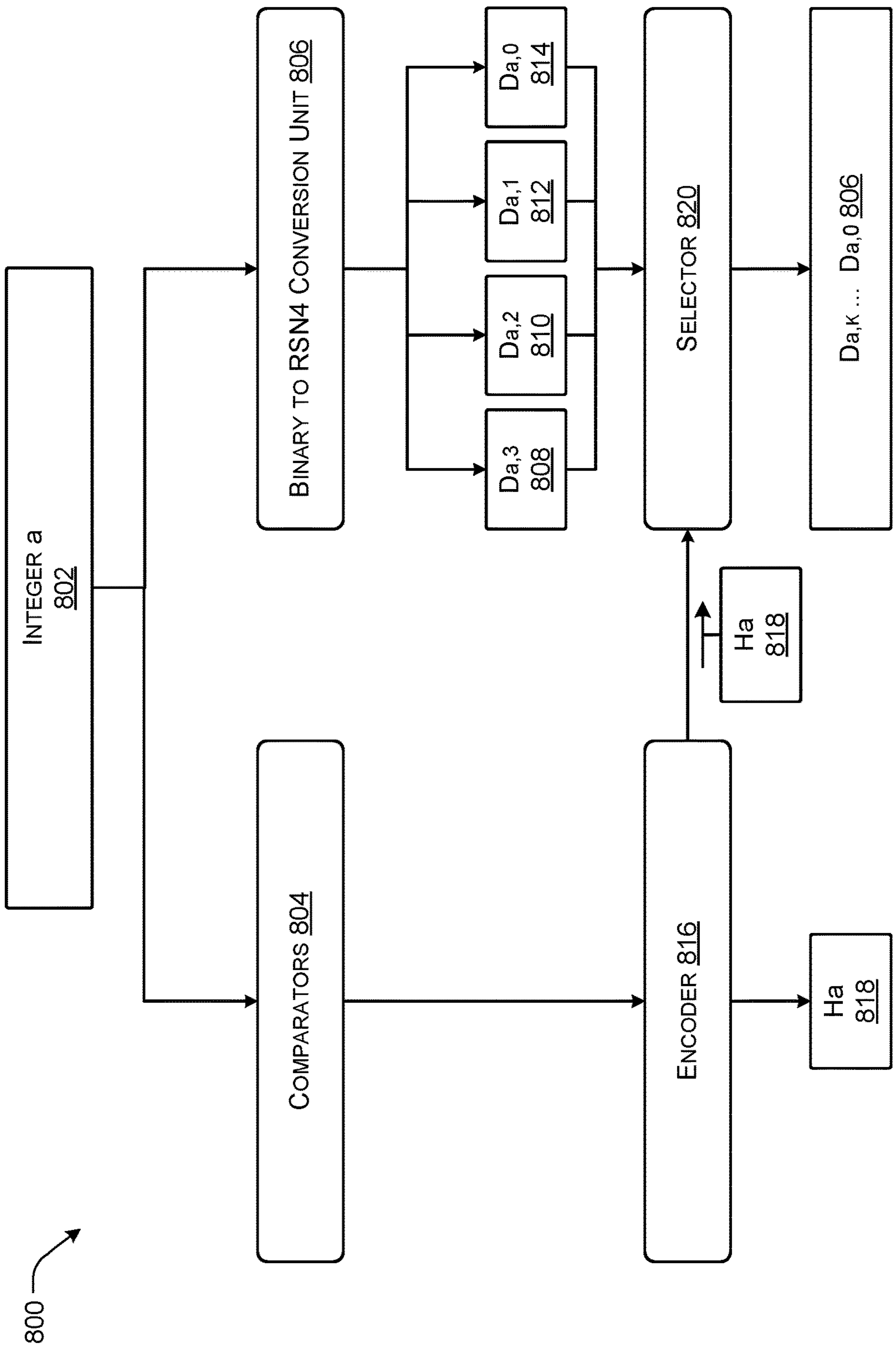
FIG. 8 illustrates a block diagram showing select components of example logic associated with a compression system according to some implementations.
Figure 9:
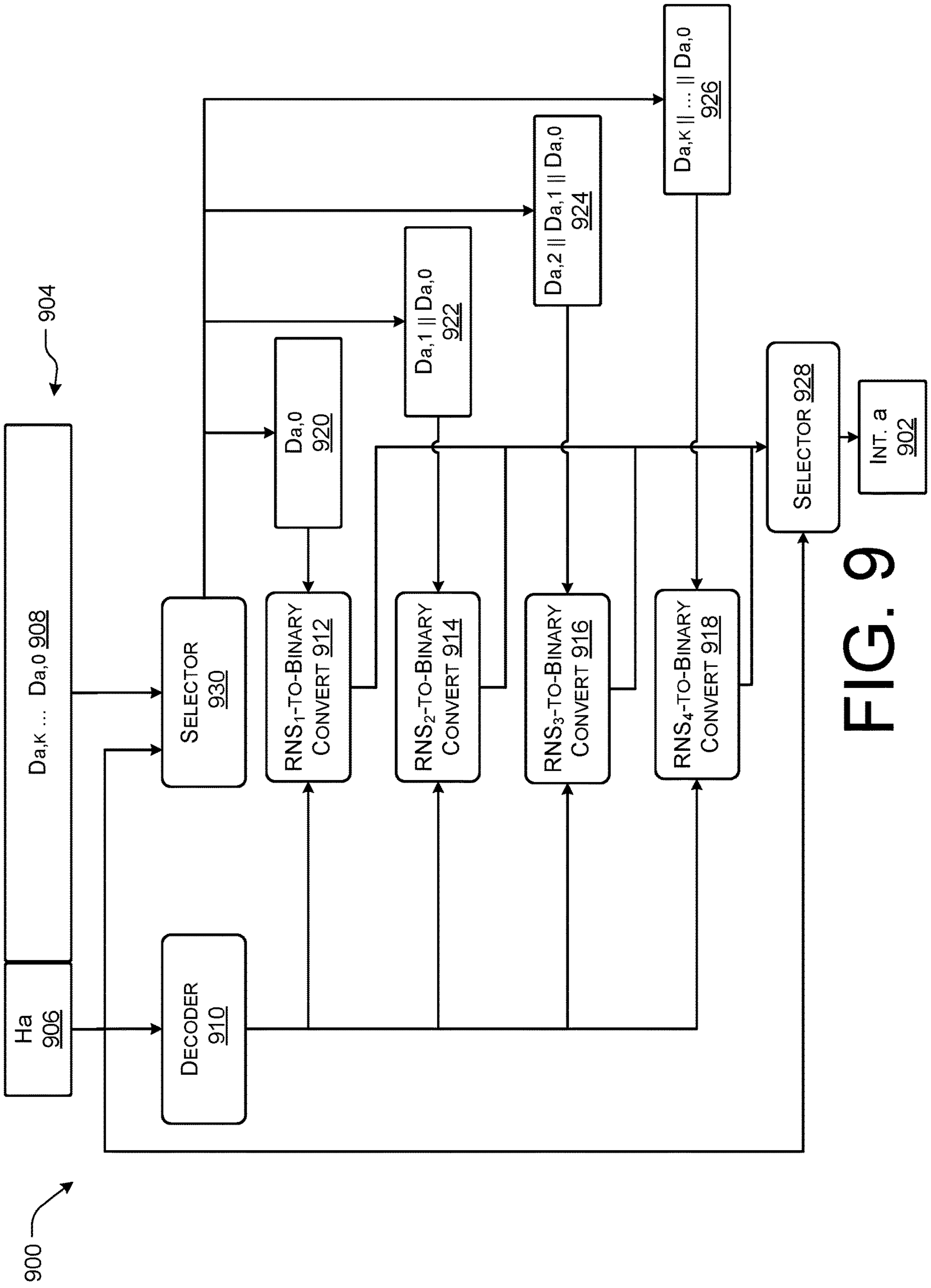
FIG. 9 illustrates a block diagram showing select components of example logic associated with a decompression system according to some implementations.

FIGS. 8 and 9 illustrate select components of example logic associated with a compression and decompression system for performing compression of integers according to some implementations. In some examples, a variable length code Residue Number System (VLC-RNS) implementation is discussed. RNS is used in numerous applications including signal processing, high performance computing, and encryption. One advantage of the RNS is that each of the operations of addition, subtraction, and multiplication, may be implemented on the individual residues of a numeral in parallel and without regard to carry. Moreover, the individual residues of a number represented in RNS are smaller than the underlying fixed length integers and this provides further efficiency for the RNS processors. Further, the compact VLC-RNS encoding, discussed herein, produces more efficient integer compression. Thus, the VLC-RNS systems allow for reduction in storage space while improving throughput, latency, and energy consumption. Moreover, it enables a compressed domain processor, that operates in the VLC-RNS domain. It should be noted that RNS exploits the Chinese Remainder Theorem which guarantees that up to a specific modulus (say k) there is a unique RNS representation for any integer J (RNS(J)) and that the "inverse" of the RNS representation of J is J mod k. That is $RNS^{-1}(RNS(J))=J \bmod k$.

For example, a non-negative integer (i.e., an integer that is greater than or equal to 0) may be represented by a set of moduli that might be distinct. Under one such system the moduli selected may be co-primes. For instance, consider an RNS using numerals under the moduli $\{r_2, r_1, r_0\}=\{5, 3, 2\}$. Under this system an integer $[0 \le a \le 29]$ is represented by three RNS digits $\langle d_2, d_1, d_0\rangle$ where $d_0$, the least significant digit, is obtained as $d_0=a \bmod r_0$. The next digit, $d_1$ is obtained by $d_1=a \bmod r_1$ and the most significant digit $d_2$ is obtained through the equation $d_2=a \bmod r_2$. Hence, under this system the number 21 may be represented as: $d_2=21 \bmod 5=1$, $d_1$ is obtained by $d_1=21 \bmod 3=0$, and $d_0$ is obtained through $d_0=21 \bmod 2=1$ or as $\langle 1, 0, 1\rangle$. Further, it should be understood that the actual digits may be represented using binary representation, such as an uniquely decodable truncated binary representation or other uniquely decodable formats.

The VLC-RNS system discussed herein is configured to enable reduction in the number of moduli of a conventional RNS in a uniquely decodable method. For example, if the VLC-RNS system utilizes an RNS with the moduli $\{r_{k-1}, \ldots r_0\}$ where each pair of moduli $\{r_i, r_j\}$ is a co-prime pair, each of the RNS digits have reminders or residual values $d_j$ from $[0, \ldots, r_i-1]$. The resulting residual RNS digits may be used to represent every integer in the range $(0+k, \ldots, (r_0 \times r_1 \times, \ldots, \times r_{k-1})+k-1)$, where k is any given integer constant. The order of the moduli is important, predetermined, and, in some implementations, is assumed to be known to the encoder and to the decoder of the system, as will be discussed below. The value of k can be used to shift the so that it includes negative integers (for k<0). Hence, it can be used as a method for representing 0, positive integers, and negative integers. In the current example we assume that k<0.

It should be understood that for small integers, some of the moduli are not necessary. This provide the encoding system with the capability to select which moduli to use for specific integers. First, some moduli might be labeled as "Must" the meaning is that these moduli must be used for the encoding of every integer. The "Must" moduli are global. That is, they apply for all of the integers in the range and are known to the encoder and the decoder prior to the encoding. Next, for each integer to be encoded, we may want to mark specific moduli as "Use" vs. "Do not use" for that integer encoding. This entails the following possible decisions concerning the RNS encoding of an integer:

Stop (stop the encoding at the current modulus).
Must (the modulus $r_i$ must be used for the encoding)
  Skip $r_i$
The remainder WRT $r_i$ is $o_j$; Continue.
The remainder WRT $r_i$ is $o_j$; Stop.

The decisions above, can be used as flags appended to individual modulus, exceptions within the modulus, and UD counters. These flags can be grouped and serve as headers for a group of encoded integers. For example, a VLC-RNS system (11, 7, 5, 2) which can cover the integers [0, . . . ,769] may utilize the RNS (5, 2) to represent the integers [0, . . . , 9]. Hence, for these integers the system may stop encoding at the modulus '5.'

In some examples, the system may utilize a FLC-FLC-RNS with the basis moduli $\{r_{k-1}, \ldots r_0\}$. Each of the RNS digits $(d_i)$ may have a residual value from $[0, \ldots, r_i-1]$ and each of the values of the digits $d_i$ may be represented by a fixed length binary code. Hence, $D_a$, the fixed length code of an integer a, is $D_a = \langle d_{a,k-1}, \ldots, d_{a,1}, d_{a,0}\rangle$) In this case, the number of bits allocated to each member of $D_a$ (e.g., $d_{a,i}$) is $[\log_2(r_i)]$.

In some examples, one bit (e.g., a flag bit) may be added to each of the elements of $D_i$ where the one bit ($f_i$) is used to denote either "use and continue modulus" or a "use and stop modulus." In this example, the system may be referred to as VLC-FLC-RNS. Other methods for producing a compact VLC representation, some of which are detailed here, exist. Additionally, note that often the method might be further improved via the use of minimal UD truncated binary code for each member of $D_a = \langle d_{a,k-1}, \ldots, d_{a,1}, d_{a,0}\rangle$). This, system, referred to as VLC-VLC-RNS, is discussed below. Finally, the term FLC-VLC-RNS refers to a system where all the moduli are used but the coding of individual digits is a truncated binary code.

As an example, consider a simple illustration using the RNS (7, 5, 3). Under FLC-FLC-RNS coding of this system, the system may allocate two bits for the modulus '3', three bits for the modulus '5', and three bits for the modulus '7'. The system may generate the following set of possible digits: (7, 5, 3)={{000, 001, . . . , 110}, {000, 001, . . . 100}, {00, 01, 10}. Next, the system may prepend a bit of '0' to each code and assume that it denotes "Use and continue" and prepend bit of '1' that denotes "Use and stop" to a digit. Under this encoding, the components of the modulus '3' can get the following values: {3}={C, B, A}={{011, 111 }, {100, 101, 110}, {000, 001, 010}}. Thus, the two least significant bits of the members of {A} denote the actual residue digit and the instructions to move to the next modulus (5). Similarly, the members of {B} denote the actual residue digit and the instructions to stop the decoding. Finally, the codes of {C} can be used to denote {'Skip', Stop'}. It should be understood that a similar approach may be used for the other moduli (5 and 7).

In another example, a VLC-VLC-RNS encoding may be used. In this example, the use of the modulus '2' may be mandated by the system. Hence, one bit is allocated to the modulus '2' and this modulus is used for every integer in the range. For the modulus '3' the system may denote '000' as "continue with a RNS digit of '0'," and '100' as "the RNS digit is '0'; stop" in a similar way '001' denotes "continue with a RNS digit of '1'," while '101' may stand for "the RNS digit is '1', stop". Further, the code '010' and '110' are used for the RNS digit '2' of the modulus '3'. Finally, '011' may denoting a "Skip" command and '111' as the stop imperative. It should be understood that a similar approach with the modulus '5' may be implemented. In numerous applications, the probability of occurrence of small integers is larger than the probability of occurrence of large integers, thus, the VLC-VLC-RNS coding may be considered more efficient than the FLC-FLC-RNS discussed above.

In another example, a VLC-FLC-RNS coding with the basis moduli (251, 253,255,256) is discussed. In this example, only the "Use and continue" and "Use and stop" flags are available. Hence, the system implies a partition of the integers [0, . . . ,256×251×253×255−1], which is almost the entire range of 32 bit integers, into the partitions {[0, . . . , 255], [256, . . . 256×255−1], [256× 255, . . . ,256×255×253−1], and [256×255×253, . . . ,256× 255×253×251−1]}.

While the FLC-FLC-RNS encoding system may allocate eight bits for the encoding of each RNS digit, the VLC-FLC-RNS encoding system allocates nine-bits for the first modulus ('256'), nine-bits for the modulus '255', nine-bits for the modulus '253', and eight bits for the modulus '251' (since the last modulus may also denotes a global stop). In this example, the system is modified so that initially the system prepends a flag bit of 0 in front of the code for the modulus '256' digit, the code of the modulus '255' digit, and the code of the modulus '253' digit. The flag bit may later be changed to reflect the actual range.

For instance, the input to the compression engine system may be an integer a along with the modified FLC-FLC-RNS representation of a, where a flag bit of 0 has been appended to the first three moduli. The system may encode the integer a using comparators in the form of subtractors or in the form of combinatorial logic to determine the partition of the integer a.

Once the range is identified, the FLC-FLC-RNS code of a is generated and the appropriate MSB of the RNS digit code is changed to '1'. For a specific system, a comparator of A≡[a >255], a comparator B≡[a>256×255−1], and a third comparator of the form C≡[a>256×255*253−1] may be used.

In each of the cases above, assume that initially the output of the modified FLC-FLC-RNS encoding is of the form: [zzzzzzzz‖0yyyyyyyyy‖0xxxxxxxx‖0wwwwwwww]. Next, this form is changed based on the comparators value. For an integer a<256 the value of the comparators 'ABC'='001' which denotes that the form: [1wwwwwwww] should be used as the VLC-FLC-RNS code. In the case that 256≤a<256×255 the value of 'ABC'='011' this denotes that [1xxxxxxxx‖0wwwwwwww] should be used as the VLC-FLC-RNS code. Next, for the value 256×255≤a<256× 255*253 the output 'ABC'='100' this denotes that [1yyyyyyyyy‖0xxxxxxxx‖0wwwwwwww] should be used as the VLC-FLC-RNS code. Finally, for the case 256×255× 253−1<a, 'ABC'='100' and the original schema [zzzzzzzz‖0yyyyyyyyy‖0xxxxxxxx‖0wwwwwwww] is the modified FLC-FLC-RNS code.

In another example, the compression system may utilize a VLC-RNS compression technique. Several variants of the VLC-RNS, such as the those discussed above can be considered. In some embodiments of VLC-RNS coding, the compression system may be configured to receive non-negative integers (i.e., integers that are greater than or equal to zero) represented in thirty-two-bit fixed length code scheme (i.e., values of less than 4294967296). A thirty-two-bit integer a may have a binary representation of $\beta_a$ with zero or more bits of '0' prepended to the left of $\beta_a$. In this example, the integer a is represented via a variable number of residues that are sufficient for its representation. For instance, the current example, utilizes four moduli $\{r_3=253, r_2=255, r_1=255, \text{ and } r_0=511\}$. Hence, the system may represent integers in the range [K+0, K+8439594239], where K is any integer constant. Note that the actual range of integers covered by this embodiment is greater than $2^{32}$ and smaller than $2^{33}$.

Furthermore, the described method can be enhanced to represent negative integers in several ways. First, the constant K defined above can accept any negative value. Additionally, methods such as sign and magnitude or mapping of positive (negative) integers to even (odd) integers and other sign representation methods.

According to the VLC-RNS embodiments discussed above, the integer a may be represented via a variable number of moduli. In this example, four moduli $\{r_3=253, r_2=255, r_1=256, \text{ and } r_0=511\}$ are selected but it should be understood that other moduli and/or other order of moduli may be used.

In the current example, each integer in the range of [0, 4294967295] requires between 1 and 4 RNS digits for its RNS representation. Hence, for the VLC-RNS a two-bit header that denotes the minimal number of RNS digits may be used. For instance, let $C_0=r_0$, $C_1=r_0\times r_1$, $C_2=r_0\times r_1\times r_2$, and $C_3=r_0\times r_1\times r_2\times r_3$. The encoding schema E(a) for an integer a is the following:

$$E(a)=\begin{cases}\langle 00, a\bmod r_0\rangle & 0\le a<C_0\\ \langle 01, a\bmod r_1, a\bmod r_0\rangle & C_0\le a<C_1\\ \langle 10, a\bmod r_2, a\bmod r_1, a\bmod r_0\rangle & C_1\le a<C_2\\ \langle 11, a\bmod r_3, a\bmod r_2, a\bmod r_2, a\bmod r_0\rangle & C_2\le a<C_3\end{cases}$$

The RNS digits (e.g., 'a mod $r_2$') may be represented in binary format, without applying truncation. Hence, the length of the proposed VLC-RNS (L(a)) for a thirty-two-bit non-negative integer (a) may be:

$$L(a)=\begin{cases}11-\text{bits} & 0\le a<C_0\\ 19-\text{bits} & C_0\le a<C_1\\ 27-\text{bits} & C_1\le a<C_2\\ 36-\text{bits} & C_2\le a<C_3\end{cases}$$

This provides efficient compression and at the same time enables exploiting the benefits of RNS. In general, the representation of a thirty-two-bits integer a is $E(a)=\langle H_{a,k-1}, \ldots, d_{a,0}\rangle$ where $1\le k\le 4$ and $d_{a,0}, \ldots, d_{a,k-1}$ is the set of minimal RNS digits required to represent a. Furthermore, $H_a$ is a two-bit header representing k−1. The RNS digits are represented in binary representation where each $d_i$ is represented by $\lceil\log_2 r_i\rceil$ bits, ($\lceil x\rceil$ is the ceiling of x). In general, the representation of an integer, with k RNS digits may be referred to, herein, as RNSk.

To provide some specific examples, consider the integers $l_1=128$, $l_2=16384$, $l_3=2097152$, and $l_4=33358081$. Using the notation for E(a) described above and the constants $C_i$ defined above:

$$E(l_1)=\langle 00, l_1 \bmod r_0\rangle=\langle 00,128\rangle=\text{'00 010000000'}.$$

$$E(l_2)=\langle 01, l_2 \bmod r_1, l_2 \bmod r_0\rangle=\langle 01,0,32\rangle=\text{'01 000000000 00100000'}.$$

$$E(l_3)=\langle 10, l_3 \bmod r_2, l_3 \bmod r_1, l_3 \bmod r_0\rangle$$

$$E(l_3)=\langle 10, 35, 0, 8\rangle=\text{'10 00100011 00000000 000001000'}.$$

$$E(l_4)=\langle 11, l_4\bmod r_3, l_4\bmod r_2, l_4\bmod r_1, l_4\bmod r_0\rangle=\langle 11, 181, 31, 1, 1\rangle=\text{'11 10110101 0001111100000001 000000001'}.$$

FIG. 8 illustrates a block diagram showing select components of example logic associated with a compression system 800 for performing compression of integers according to some implementations. In this example, an integer a 802 may be a thirty-two-bit FLC encoded integer then, the compressed representation, E(a) is given by $E(a)=\langle H_a, d_{a,k-1}, \ldots, d_{a,0}\rangle$. The integer a 802 is routed to a set of three comparators, generally indicated by 804, and to a Binary-to-RNS4 conversion unit 806 where the moduli are $\{r_3, r_2, r_1, r_0\}$. In one specific example, $\{r_3, r_2, r_1, r_0\}=\{253, 255, 256, 511\}$. The Binary-to-RNS4 conversion unit 806 generates the four RNS digits: $\{d_{a,3}$ 808, $d_{a,2}$ 810, $d_{a,1}$ 812, $d_{a,0}$ 814$\}$. The RNS digits 808-814 may be represented as: $\{a \bmod r_3, a \bmod r_2, a \bmod r_1, a \bmod r_0\}$.

In this example, let $C_0=r_0$, $C_1=r_0\times r_1$, $C_2=r_0\times r_1\times r_2$, and $C_3=r_0\times r_1\times r_2\times r_3$. The three comparators 804 check: a) $C_0\le a$; b) $C_1\le a$; and c) $C_2\le a$ and based on the output of the comparators 804 the value of a can be mapped into one of four regions:

$$\text{Region}(a)=\begin{cases}k=0=\text{'00'} & 0\le a<C_0\\ k=1=\text{'01'} & C_0\le a<C_1\\ k=2=\text{'10'} & C_1\le a<C_2\\ k=3=\text{'11'} & C_2\le a<C_3\end{cases}$$

The region mapping is done by an encoder 816. For example, the encoder 816 may include a lookup table that receives the output of the three comparators 804 and produces a corresponding two-bit code.

The two-bit $H_a$ 818 is output from the encoder 816 and, as such, $H_a$ 818 is part of the compressed representation E(a). The $H_a$ 818 may also serve as the control input for a selector 820 that selects only the first n+1 ($0\le n\le 3$) bit-codes of the RNS digits 808-814, and removes the rest. The remaining RNS digits 808-814 are concatenated to the header $H_a$ 818 to form the compressed representation E(a) including $H_a$ 818 and $d_{a,k-1}, \ldots, d_{a,0}$ 822.

Finally, in order to support the pack unit described below, the compression system uses $H_a$ 818 to compute L(a), the number of bits used for encoding a and outputs this value. The computation may involve a look up table and may be done by the number of bits calculation unit 820 providing as output the number of bits signal 822, which denotes the number of bits used for encoding.

FIG. 9 illustrates a block diagram showing select components of example logic associated with a decompression system 900 for performing decompression of encoded integers according to some implementations. In the current example, the decompression system 900 may utilize a VLC-RNS compression technique described above. It should be understood that the system 900 may be used with several other variants of the VLC-RNS, such as the those discussed previously. In the illustrated example, let a 902 be a thirty-two-bit FLC encoded integer encoded as E(a)=⟨$H_a$, $d_{a,k}$, . . . , $d_{a,0}$⟩ 904, where 0≤k≤3. For example, the integer a 902 may be encoded by the system 900 of FIG. 9.

In this example, the compressed representation E(a) 904 is provided to the system 900 where it is partitioned into the header $H_a$ 906 and the RNS digit frustum 908 defined as ⟨$d_{a,k}$, . . . , $d_{a,0}$⟩ (0≤k≤3). The decompression system 900 provides $H_a$ 906 to a 4×1 decoder 910. The output of the decoder 910 acts as an enable signal to set of RNSi-to-binary conversion units, generally indicated by 912-918, thereby enabling the units 912-918 relevant to E(a) 904. In the present case, unit0 912 is an RNS1-to-binary converter using the modulus {$r_0$} and generating the digit {$d_0$}. Unit1 914 is an RNS2-to-binary converter using the moduli {$r_1$, $r_0$} and generating the digit {$d_1$, $d_0$}. Unit2 916 is an RNS3-to-binary converter using the moduli {$r_2$, $r_1$, $r_0$} and generating the digit {$d_2$, $d_1$, $d_0$}. Finally, unit3 918 is an RNS4-to-binary converter using the moduli {$r_k$, $r_{k-1}$, . . . , $r_{01}$} and generating the digit {$d_k$, . . . , $d_0$}.

The value of $H_a$ 906 is also provided as a control signal to a selector 930 which produces the right frustum 920-926 and routes the frustum 920-926 to the appropriate RNSi-to-binary conversion unit 912-918. Additionally, the value of $H_a$ 906 is provided as a control signal to a selector 928. The value of $H_a$ 906 is also provided as a control signal to a selector 928 and the outputs of the RNSi-to-binary units 912-918 are provided as input signals to the selector 928. The selector 928 selects the valid inputs based on the control input $H_a$ 906 and generates integer a 902.

Figure 10:
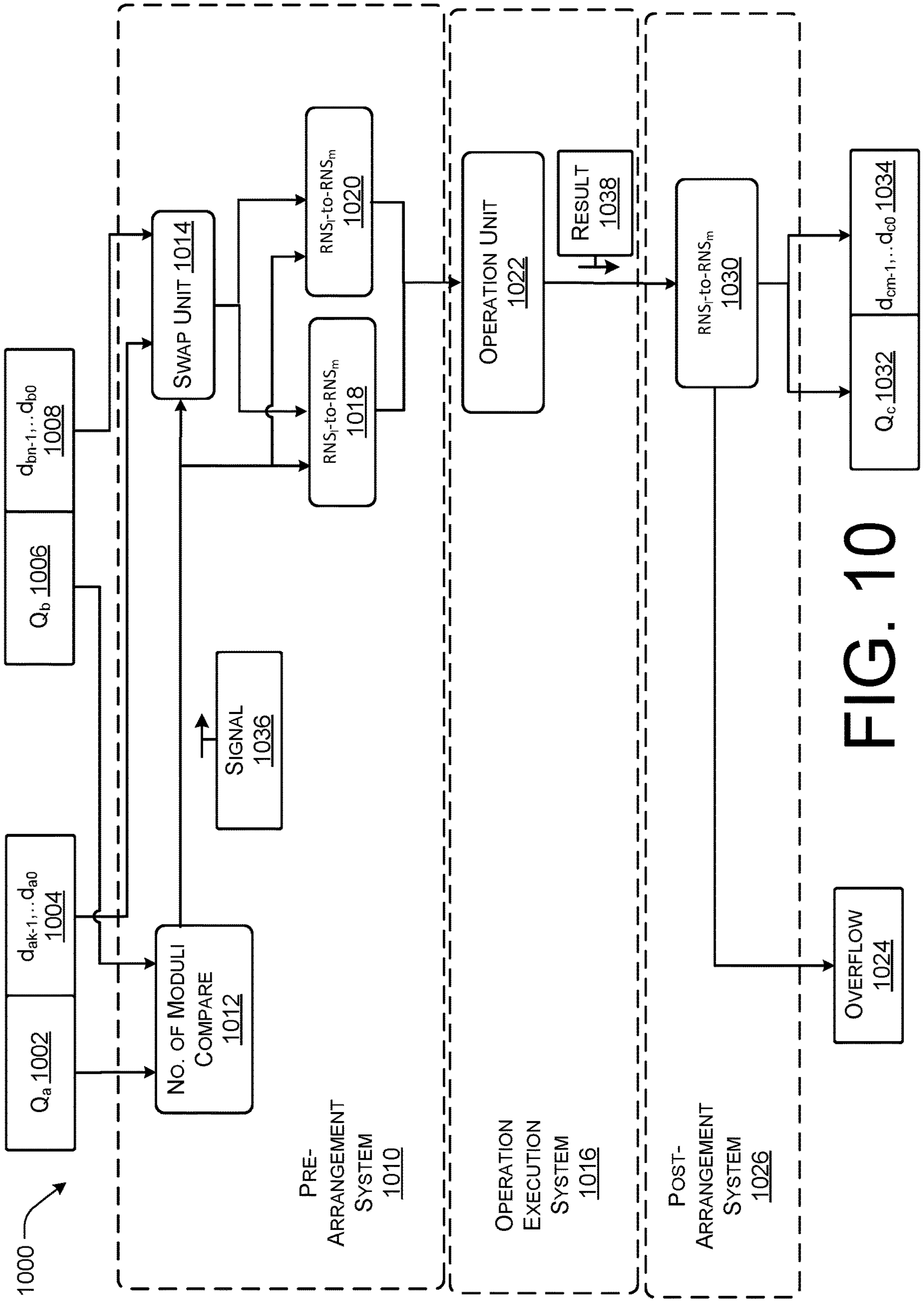
FIG. 10 illustrates example of logic associated with a compressed domain processor according to some implementations.

FIG. 10 illustrates example of logic associated with a compressed domain processor 1000 using an example VLC-RNS compression method. Several variants of the VLC-RNS can be considered. In this example, we assume that the integers are compressed according to the example provided for the VLC-RNS compression engine above. Other variants have similar properties and their use for a VLC-RNS domain processor can be inferred by a person who is skilled in the art. The method presented appends a fixed length header to each RNS numeral, where the header denotes the number of moduli to be used. The example provided assume RNS with 4 digits, examples with other numbers of digits are similar.

FIG. 10 illustrates example of logic associated with a compressed domain processor 1000 using an example VLC-RNS compression method. Several variants of the VLC-RNS can be considered. In this example we assume that non-negative integers, that is integers in the range [0, . . . , 429496729], are compressed according to the example provided for the VLC-RNS compression engine described above with an RNS system of up to 4 digits (RNS4). Other variants have similar features and their use for a VLC-RNS domain processor can be inferred by a person who is skilled in the art. The method presented appends a fixed length header to each RNS numeral, where the header denotes the number of moduli to be used. Furthermore, details of the VLC-RNS CDP components for non-negative integer addition are provided herein. Components for other operations such as multiplication, subtraction, division etc. are similar and their design may be inferred from the VLC-RNS CDP components for non-negative integer addition discussed here.

FIG. 10 illustrates a block diagram showing select components of an example logic associated with a compressed domain processor 1000 for preforming RNS addition on VLC-RNS encoded thirty-two-bit integers. Let a and b be two integers and let E(a)=⟨$Q_a$ 1002, $d_{ak-1}$, . . . , $d_{a0}$ 1004⟩ and E(b)=⟨$Q_b$ 1006, $d_{bn-1}$, . . . , $d_{b0}$ 1008⟩. The VLC-RNS of a and b is provided to the compressed domain processor system 1000. In the first step, the pre-arrangement-system 1010 receives the two integers. For example, a number of moduli compare unit 1012 receives $Q_a$ 1002 and $Q_b$ 1006 and compares the number of moduli of the two integers. This may result in one of two cases of interest: 1) k=n, 2) k<n. In this example, the compare unit 1012 sends a two bit signal 1036 (representing if k=n, k<n, or k>n) to a swap unit 1014 of the pre-arrangement-system 1010 and the swap unit 1014 switches the roles of a and b when k>n. Hence, without loss of generality, the current example assumes that k≤n.

When k=n, the pre-arrangement-system 1010 removes the headers $Q_a$ 1002 and $Q_b$ 1006 from the VLC-RNS representation of the VLC-RNS representation of operands and provides the set of moduli digits of a and b without swapping to the operation-execution-system 1016 (the swap operation may be avoided in response to the signal 1036 described below). The set of moduli digits of a and b are going through an RNS1-to-RNSm conversion units 1018 and 1020 with l=k and with m=n+1. The result is that both integers are represented in the format of RNSn+1. In the case where k<n denoted by the two bit signal 1036, the pre-arrangement-system 1010 removes the header $Q_b$ 1006 of b and provides the set of moduli digits of b to an RNS1-to-RNSm 1020 with l=n and m=n+1. At the same time, the pre-arrangement-system 1010 uses the RNS1-to-RNSm conversion unit 1020 with l=k and with m=n+1 to prepare the operand a for the operation unit 1022. Again, the result is that both integers are represented in the format of RNSn+1. Next, the pre-arrangement system 1010 provides the two numbers a and b represented in the format of RNSn+1 to the operation-execution-system 1016. Note that the implementation of RNS1-to-RNSm should be understood herein.

The operation-execution-system 1016 includes an operation unit 1022 that is configured to perform a set of operations on RNS numbers. The set of operations may include, addition, subtraction, multiplication, division, compare operations, etc. Note that numerous implementations of components for these RNS operations are known. The current example concentrates on addition. A subtraction unit is almost identical to the addition unit (with addition replaced by subtraction). Multiplication might require performing intermediate operations on RNS2n.

The result 1038 of the operation unit 1022 of the operation-execution-system 1016 is in RNSn+1, where n+1≤5. Note that due to the nature of RNS the result is correct up to a modulus of the form $((r_0 \times r_1 \times, \ldots, \times r_n)-1)$, where $r_i$ is the i'th modulus. An overflow flag 1024 alerts the system if the result is not absolutely accurate and is accurate only up to the modulus above.

The post-arrangement-system 1026 accepts the result 1038 of the RNS operations (c) where c is represented in RNSn+1. In some cases, however, only n moduli digits are needed to represent the result. Hence the result c, is being sent to an RNS1-to-RNSm 1030 unit (described below) where m is the minimal number of moduli digits required for representing c. Using the principle of FLC-RNS to VLC-RNS described for the RNS CE above, the unit determines the minimum number of moduli digits required for representing and performs the conversion. In the case that m>4, an overflow flag 1024 is generated. Next the post arrangement system 1026, prepends a two-bit header $Q_c$ 1032 with the value of m−1 to the RNSm representation of c thereby generating the encoded representation of the result c, (E(c)=⟨$Q_c$ 1032, $d_{cm-1}$, . . . , $d_{c0}$ 1034⟩).

In the illustrated example, the compressed domain processor 1000 may be configured to process non-negative integers according to the proposed embodiment of the VLC-RNS coding using a maximum of thirty-two-bits for the encoding. In the current example, we consider compressed integers, E(a) and E(b), according to some VLC-RNS encoding implementations (e.g., the one described for the VLC-RNS-CE above). Thus, $E(a)=\langle Q_{ak-1}, d_{a1}, \ldots, d_{a0}\rangle$ and $E(b)=\langle Q_b, d_{bn-1}, \ldots, d_{b0}\rangle$. The notation 'moduli sequence' is used to denote a set of moduli digits of the form '$d_{nx-1}, \ldots, d_{x0}$.'

For instance, in the illustrated example, the compressed domain processor 1000 may include a pre-arrangement-system 1010, that prepares the operands to be fed to the operation-execution-system 1016. The operation execution unit performs the operation and provides the intermediate result 1038, and a post-arrangement-system 1026, that rearranges the intermediate result 1038, along with a header $Q_c$, in a form that complies with the encoding scheme, as discussed above.

The pre-arrangement-system 1010 aligns the two moduli sequences of both operands so that both contain the same number of moduli digits within temporary registers, to enable operating on same position moduli digits. The alignment is achieved by calculating the number of moduli digits difference between the two operands' Q headers and modifying both operand to be of the form RNSn+1. The pre-arrangement-system 1010 then feeds the two aligned operands to the operation-execution-system 1016. The result 1038 of the operation performed by the operation-execution-system 1016 might produce any number in the range as well as overflow and in some operations such as subtraction an underflow. As described above, an overflow is detected by the RNS1-to-RNSm 1030. In case that overflow/underflow conditions are met, an overflow/underflow flag 1024 may be set.

In one specific example, the fixed length headers $Q_a$ 1002 and $Q_b$ 306 are provided to a comparator 1012. Given that $Q_a$ 1002 and $Q_b$ 1006 are two-bits components, the comparator can actually be implemented via a simple combinatorial logic. In this example, the comparator 1012 checks whether $Q_a$ 1302<$Q_b$ 1006, in which case the comparator 1012 sets the two bits signal 1036 representing one of 3 cases 1) $Q_a$ 1002<$Q_b$ 1006, 2) $Q_a$ 1002=$Q_b$ 1006, and 3) $Q_a$ 1002>$Q_b$ 1006. It should also be understood that the comparator component 1012 may be implemented via a subtractor. In this case the two bit signal 1036 is set based on the sign of subtraction and/or if the result of subtraction is '0'. The subtractor may subtract the value of $Q_a$ 1002 from $Q_b$ 1008. Alternatively, it may subtract the value of $Q_b$ 1006 from $Q_a$ 1002 to determine the values of the line $Q_a$ 1002=$Q_b$ 1006. Additionally, in some implementations, the subtractor may be configured to subtract the larger value from the smaller value or vice versa.

The swap unit 1014 receives the two bit signal 1036 from the comparator component 1012 as well as $D_a=d_{ak-1}, \ldots, d_{a0}$ 1004 and $D_b=d_{bn-1}, \ldots, d_{b0}$ 1008 (e.g., the sequence of moduli digits representing the integers a and b).

The swap unit 1014 is able to determine which of $D_a$ 1004 and $D_b$ 1008 has more moduli digits using the bit values of the signal 1036. The swap unit 1014 provides the set of moduli digits of b to RNS1-to-RNSm 1020 with l=n and m=n+1 and the set of set of moduli digits of a to RNS1-to-RNSm 1018 with l=k and m=n+1.

Once both of the aligned modulus sequences $D_a$ 1004 and $D_b$ 1008 (i.e., both are with a cardinality of n+1) are received by the operation-execution-system 1016, the operation execution system 1016 may perform RNSn+1-by-RNSn+1 operations on the two operands (this is denoted as RNSn+1 op RNSn+1) and produce an RNSn+1 result 1038. As described above, an overflow is detected by the RNS1-to-RNSm 1030 and the unit may set an overflow/underflow flag 1024.

The results 1038 from the operation-execution-system 1316 ($Q_c=d_{cl-1}, \ldots, d_{c0}$) for some l, is provided to the post-arrangement-system 1026.

The post-arrangement-system 1026 accepts the result 1038 of the RNS operations (c), where c is represented in RNSn+1. In some cases, however, only n moduli digits are needed to represent the result. Hence the result c, is being sent to an RNS1-to-RNSm 1030 unit where m is the minimal number of moduli digits required for representing c. Using the principle of FLC-RNS to VLC-RNS described for the RNS CE above, the unit determines the minimum number of modulus digits required for representing and performs the conversion. In the case that m>4, an overflow flag 1024 is generated. Next, the post arrangement, prepends a two-bit header $Q_c$ 1032 with the value of m−1 to the RNSm representation of c thereby generating the encoded representation of the result c, ($E(c)=\langle Q_c$ 1032, $d_{cm-1}, \ldots, d_{c0}$ 1034$\rangle$).

If no overflow/underflow has occurred and l>1 the post-arrangement-system 1026 may adjust the cardinality of the $Q_c$ to the minimum cardinality needed (say m) by passing it through a RNS-to-MRS and MRs-to-RNS conversion units (not shown).

However, if l=1 then the unit 1330 is bypassed and disabled. Finally, the post-arrangement-system 1026 prepends a header with the value of $Q_c$=m−1 to the adjusted (if needed) $Q_c$, and produces the result $E(c)=\langle Q_c, d_{cm-1}, \ldots, d_{c0}\rangle$. The results 1038 from the operation-execution-system 1016 ($D_c=d_{cn-1}, \ldots, d_{c0}$) is provided to the post-arrangement-system 1026.

The VLC-RNS can be used to represent signed number, e.g., using sign and magnitude representation. Additionally, note that variants of the VLC-RNS which use different moduli and/or different VLC schemes can be handled by a compressed domain processor that is modified accordingly. It should be noted that the VLC-RNS can be used to represent un-bounded integers (e.g., using the set of all prime numbers as moduli and a stop sign that denotes the last prime used). Furthermore, some of the representations of un-bounded integers using VLC-RNS are universal. Hence, the compressed domain processor can be designed for any given bound or range.

Figure 11:
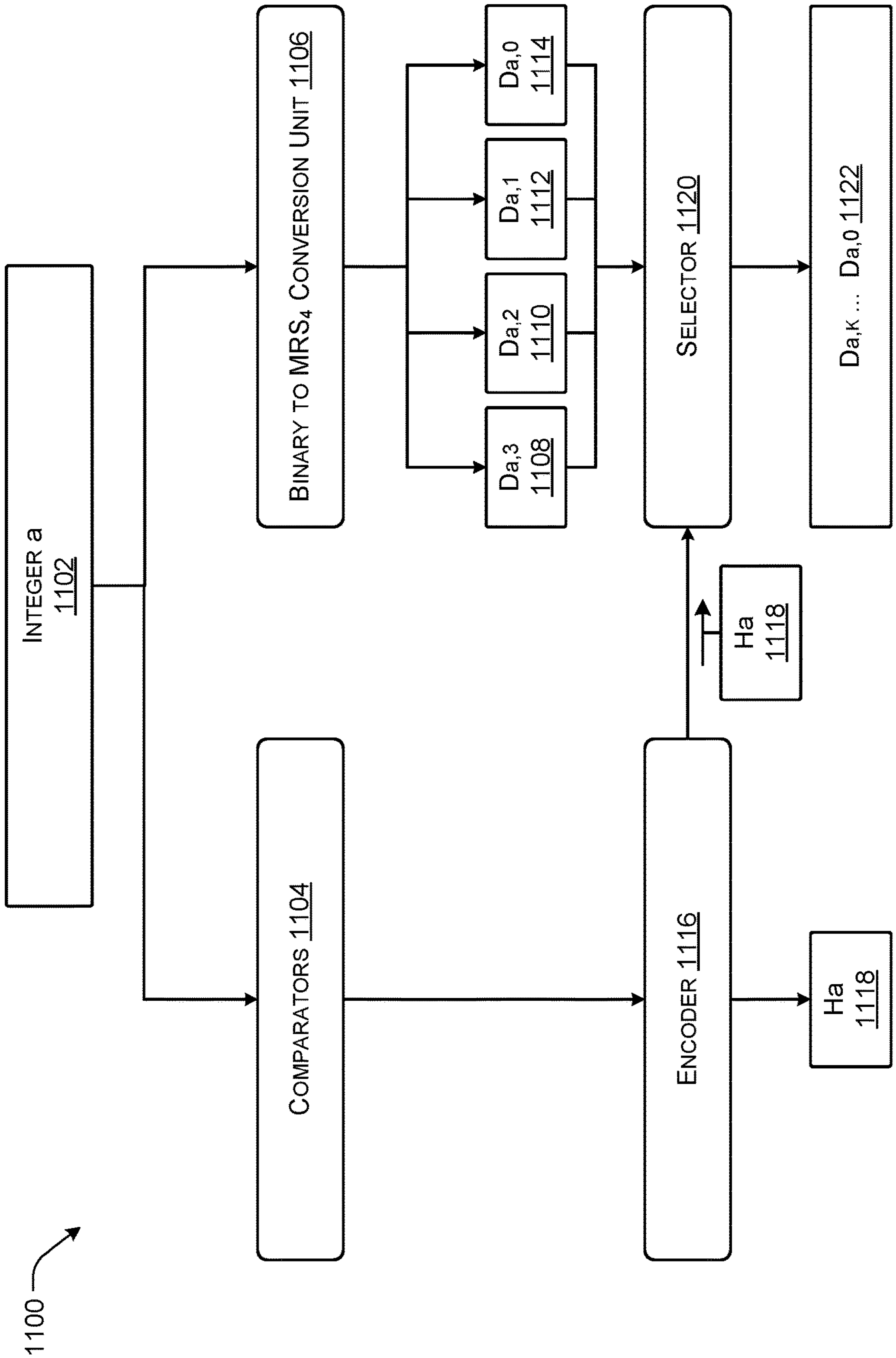
FIG. 11 illustrates a block diagram showing select components of example logic associated with a compression system according to some implementations.
Figure 12:
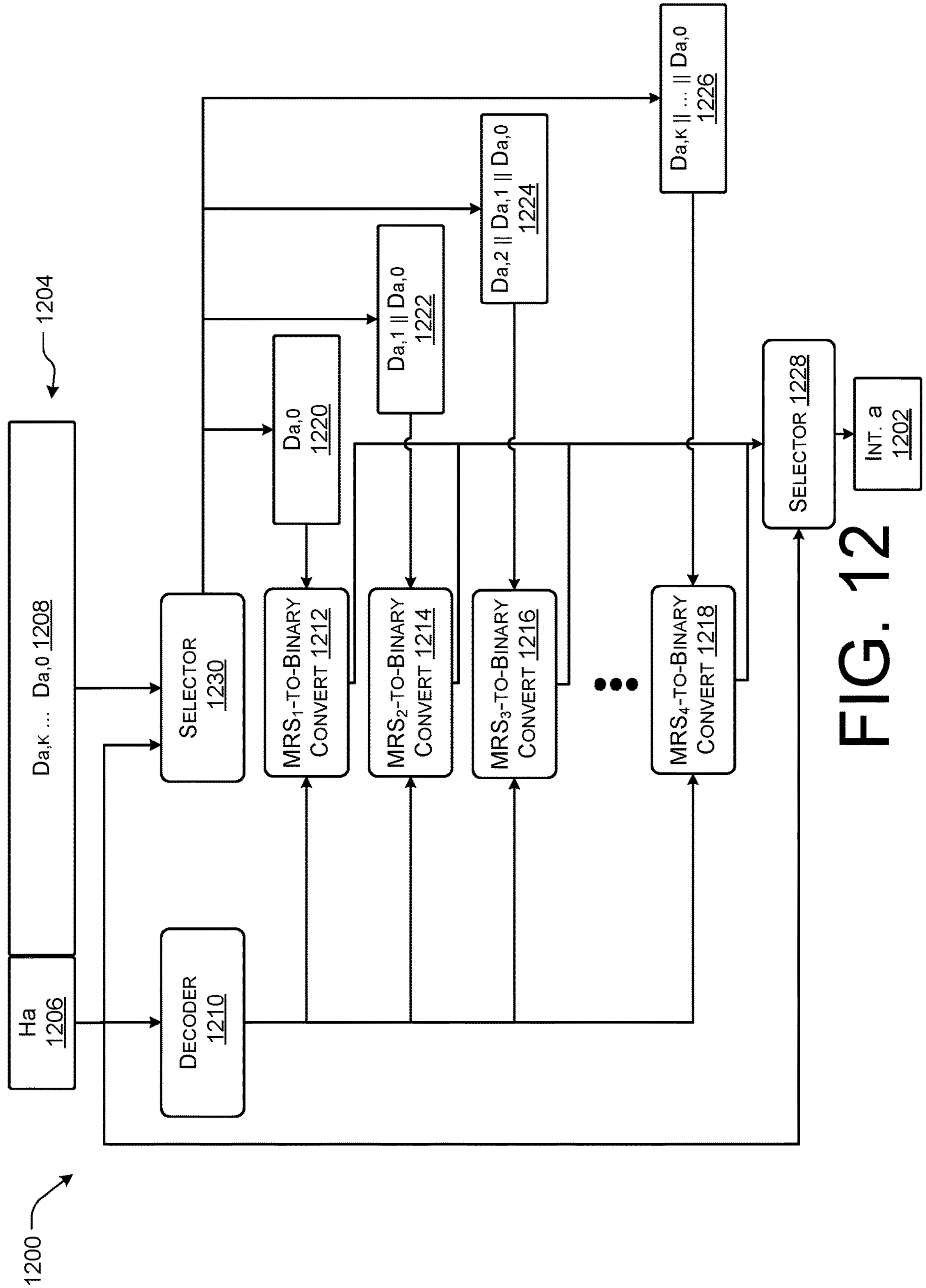
FIG. 12 illustrates a block diagram showing select components of example logic associated with a decompression system according to some implementations.

FIGS. 11 and 12 illustrate select components of example logic associated with a compression and decompression system for performing compression of integers according to some implementations. In some examples, a variable length code Mixed Radix Number System (VLC-MRS) implementation is discussed. MRS is used in numerous applications including signal processing, high performance computing, and encryption. MRS is predominantly used as a part of Residue Number Systems (RNS). One advantage of the RNS is that each of the operations of addition, subtraction, and multiplication, may be implemented on the individual residues of a numeral in parallel and without regard to carry. However, RNS is deficient in performing several operations such as checking for overflow in an integer operation as well as when comparing integers. The MRS system can support overflow detection and compare operations. Moreover, generally the conversion from MRS to RNS and from RNS to MRS lends itself to a hardware implementation that is less expensive than conversion from RNS to binary and from binary to RNS. Hence, often a mixture of RNS and MRS units as well as units for RNS to MRS and MRS to RNS conversion are embedded in and RNS-based systems. A compact encoding of MRS, referred to as variable length mixed radix system (VLC-MRS), discussed herein, along with a compressed domain processor that operates in the VLC-MRS domain allows for reduction in storage space while improving throughput, latency, and energy consumption.

For example, a non-negative integer (i.e., an integer that is greater than or equal to 0) may be represented by a set of radices that might be distinct. Under one such system the radices selected may be co-primes. For instance, consider an MRS using numerals under the radices $\{r_2, r_1, r_0\}=\{5, 3, 2\}$. Under this system an integer $[0 \le a \le 29]$ is represented by three MRS digits $\langle d_2, d_1, d_0\rangle$ where $d_0$, the least significant digit, is obtained as $d_0 = a \bmod r_0$. The next digit, $d_1$ is obtained by $d_1 = (a \text{ div } r_0) \bmod r_1$ (as used herein, div stands for the quotient of integer division), and the most significant digit $d_2$ is obtained through $d_2 = ((a \text{ div } r_0) \text{ div } r_1) \bmod r_2)$. Hence, under this system the number 21 may be represented as: $d_0 = 21 \bmod 2 = 1$, $d_1$ is obtained by $d_1 = (21 \text{ div } 2) \bmod 3 = 1$, and $d_2$ is obtained through $d_2 = ((21 \text{ div } 2) \text{ div } 3) \bmod 5 = 3$ or as (3, 1, 1). Further, it should be understood that the actual digits may be represented using binary representation, such as a uniquely decodable truncated binary representation or other uniquely decodable formats.

The VLC-MRS system discussed herein is configured to enable reduction in the number radices of a conventional MRS in a uniquely decodable method. For example, if the VLC-MRS system utilizes an MRS with the radices $\{r_{k-1}, \ldots, r_0\}$ where each pair of radices $\{r_i, r_j\}$ is a co-prime pair, each of the radix digits have reminders or residual values $d_j$ from $[0, \ldots, r_i-1]$. The resulting residual radix digits may be used to represent every integer in the range $(0, \ldots, (r_0 \times r_1 \times, \ldots, \times r_{k-1})-1)$. The order of the radices is important, predetermined, and, in some cases, is assumed to be known to the encoder and to the decoder of the system, as will be discussed below.

It should be understood that for small integers, some of the radixes are not necessary. This provide the encoding system with the capability to select which radixes to use for specific integers. First, some radixes might be labeled as "Must" the meaning is that these radixes must be used for the encoding of every integer. The "Must" radixes are global. That is, they apply for all of the integers in the range and are known to the encoder and the decoder prior to the encoding. Next, for each integer to be encoded, we may want to mark specific radixes as "Use" vs. "Do not use" for that integer encoding. This entails the following possible decisions concerning the MRS encoding of an integer:

Stop (stop the encoding at the current radix).

Must (the radix $r_i$ must be used for the encoding)

Skip $r_i$

The remainder WRT $r_i$ is $o_j$; Continue.

The remainder WRT $r_i$ is $o_j$; Stop.

The decisions above, can be used as flags appended to individual radix, exceptions within the radix, and UD counters. These flags can be grouped and serve as headers for a group of encoded integers. For example, a VLC-MRS system (11, 7, 5, 2) which can cover the integers [0, . . . , 769] may utilize the MRS (5,2) to represent the integers [0, . . . , 9]. Hence, for these integers the system may stop encoding integers in the range [0, . . . , 9] at the radix '5.'

In some examples, the system may utilize a FLC-FLC-MRS with the basis radixes $\{r_{k-1}, \ldots r_0\}$. Each of the MRS digits $(d_i)$ may have a residual value from $[0, \ldots, r_{i-1}]$ and each of the values of the digits $d_i$ may be represented by a fixed length binary code. Hence, $D_a$, the fixed length code of an integer a, is $D_a = \langle d_{a,k}-1, \ldots, d_{a,1}, d_{a,0}\rangle$). In this case, the number of bits allocated to each member of $D_a$ (e.g., $d_{a,i}$) is $[\log_2(r_i)]$.

In some examples, one bit (e.g., a flag bit) may be added to each of the elements of $D_i$ where this bit $(f_i)$ is used to denote either "use and continue radix" or a "use and stop radix." In this example, the system may be referred to as VLC-FLC-MRS. Other methods for producing a compact VLC representation, some of which are detailed here, exist. Additionally, note that often the method might be further improved via the use of minimal UD truncated binary code for each member of $D_a = \langle d_{a,k-1}, \ldots, d_{a,1}, d_{a,0}\rangle$) This, system, referred to as VLC-VLC-MRS, is discussed below. Finally, the term FLC-VLC-MRS refers to a system where all the radixes are used but the coding of individual digits is a truncated binary code.

As an example, consider a simple illustration using the MRS (7, 5, 3). Under FLC-FLC-MRS coding of this system, the system may allocate two bits for the radix '3', three bits for the radix '5', and three bits for the radix '7'. The system may generate the following set of possible digits: (7, 5, 3)={{000, 001, . . . , 110}, {000, 001, . . . 100}, {00, 01, 10}. Next, the system may prepend a bit of '0' to each code and assume that it denotes "Use and continue" and prepend bit of '1' that denotes "Use and stop" to a digit. Under this encoding, the components of the radix '3' can get the following values: {3}={C, B, A}={{011, 111}, {100, 101, 110}, {000, 001, 010}}. Thus, the two least significant bits of the members of {A} denote the actual residue digit and the instructions to move to the next radix (5). Similarly, the members of {B} denote the actual residue digit and the instructions to stop the decoding. Finally, the codes of {C} can be used to denote {'Skip', 'Stop'}. It should be understood that a similar approach may be used for the other radices (5 and 7).

In another example, a VLC-VLC-MRS encoding may be used. In this example, the use of radix '2' may be, in some cases, mandated by the system. Hence, one bit is allocated to the radix '2' and this radix is used for every integer in the range. For the radix '3' we denote '000' as "continue with a radix digit of '0'," and '100' as "the radix digit is '0'; stop" in a similar way '001' denotes "continue with a radix digit of '1'," while '101' may stand for "the radix digit is '1', stop". Further, the code '010' and '110' are used for the radix digit '2' of the radix '3'. Finally, '011' may denoting a "Skip" command and '111' as the stop imperative. It should be understood that a similar approach with the radix '5' may be implemented. In numerous applications, the probability of occurrence of small integers is larger than the probability of occurrence of large integers, thus, the VLC-VLC-MRS coding may be considered more efficient than the FLC-FLC-MRS discussed above.

In another example, a VLC-FLC-MRS with the basis radices (251, 253,255,256) is explained. In this example, only the "Use and continue" and "Use and stop" imperatives are available. Hence, the system implies a partition of the integers $[0, \ldots, 256 \times 251 \times 253 \times 255-1]$, which is almost the entire range of 32 bit integers, into the partitions $\{[0, \ldots, 255], [256, \ldots, 256 \times 255-1], [256 \times 255, \ldots, 256 \times 255 \times 253-1]$, and $[256 \times 255 \times 253, \ldots, 256 \times 255 \times 253 \times 251-1]\}$.

While the FLC-FLC-MRS encoding system would allocate eight bits for the encoding of each MRS digit, the VLC-FLC-MRS encoding system allocates nine-bits for the first radix ('256'), nine-bits for the radix '255', nine-bits for the radix '253', and eight bits for the radix '251' (since it the last radix it may also denotes a global stop). In this example, the system is modified so that initially it prepends a flag bit of 0 in front of the code for the radix '256' digit, the code of the radix '255' digit, and the code of the radix '253' digit. The flag bit may later be changed to reflect the actual range.

For instance, the input to the compression engine system may be an integer a along with the modified FLC-FLC-MRS representation of a, where a flag bit of 0 has been appended to the first three radixes. The system may encode the integer a using comparators in the form of subtractors or in the form of combinatorial logic to determine the partition of the integer a.

Once the range is identified, the FLC-FLC-MRS code of a is generated and the appropriate MSB of the MRS digit code is changed to '1'. For a specific system, a comparator of A≡[a>255], a comparator B≡[a>256×255 1], and a third comparator of the form C≡[a>256×255*253−1] may be used.

In all the cases of this example, assume that initially the output of the modified FLC-FLC-MRS encoding is of the form:

[zzzzzzzz||0yyyyyyyyyy||0xxxxxxxx||0wwwwwwwww].

Next, this form is changed based on the comparators value. For an integer a<256 the value of the comparators 'ABC'='001' which denotes that the form: [1wwwwwwwww] should be used as the VLC-FLC-MRS code. In the case that 256≤a<256×255 the value of 'ABC'='011' this denotes that [1xxxxxxxx||0wwwwwwwww] should be used as the VLC-FLC-MRS code. Next, for the value 256×255≤a<256×255*253 the output 'ABC'='100' this denotes that [1yyyyyyyyy||0xxxxxxxx||0wwwwwwwww] should be used as the VLC-FLC-MRS code. Finally, for the case 256×255×253 1<a, 'ABC'='100' and the original schema [zzzzzzzz||0yyyyyyyyy||0xxxxxxxx||0wwwwwwwww] is the modified FLC-FLC-MRS code.

In another example, the compression system may utilize a VLC-MRS compression technique. Several variants of the VLC-MRS, such as the those discussed above can be considered. In some embodiments of VLC-MRS coding, the compression system may be configured to receive non-negative integers (i.e., integers that are greater than or equal to zero) represented in thirty-two-bit fixed length code scheme (i.e., values of less than 4294967296). A thirty-two-bit integer a may have a binary representation of $\beta_a$ with zero or more bits of '0' prepended to the left of $\beta_a$. In this example, the integer a is represented via a variable number of radixes that are sufficient for its representation. For instance, the current example, utilizes four radixes $\{r_3=253, r_2=255, r_1=255, \text{ and } r_0=511\}$. Hence, in at least some implementations, the system may represent integers in the range [0, 8439594239]. Note that the actual range of integers covered by this embodiment is greater than $2^{32}$ and smaller than $2^{33}$.

Furthermore, the described method can be enhanced to represent negative integers in several ways including using methods such as sign and magnitude or mapping of positive (negative) integers to even (odd) integers and other sign representation methods.

According to the VLC-MRS embodiments discussed above, the integer a may be represented via a variable number of radixes. In this example, four radixes $\{r_0=511, r_1=256, r_2=253, \text{ and } r_3=251\}$ are selected but it should be understood that other radixes and/or other order of radixes may be used.

In the current example, each integer in the range of [0, 4294967295] requires between 1 and 4 MRS digits for its MRS representation. Hence, for the VLC-MRS a two-bit header that denotes the minimal number of MRS digits may be used. For instance, let $C_0=r_0$, $C_1=r_0\times r_1$, $C_2=r_0\times r_1\times r_2$, and $C_3=r_0\times r_1\times r_2\times r_3$. The encoding schema E(a) for an integer a is the following:

$$E(a) == \begin{cases} \langle 00, a \bmod r_0 \rangle & 0 \le a < C_0 \\ \langle 01, (a \operatorname{div} r_0) \bmod r_1, a \bmod r_0 \rangle & C_0 \le a < C_1 \\ \langle 10, ((a \operatorname{div} r_0) \operatorname{div} r_1) \bmod r_2, ((a \operatorname{div} r_0) \bmod r_1) a \bmod r_0 \rangle & C_1 \le a < C_2 \\ \left\langle \begin{array}{l} 11, (((a \operatorname{div} r_0) \operatorname{div} r_1) \operatorname{div} r_2) \bmod r_3, \\ ((a \operatorname{div} r_0) \operatorname{div} r_1) \bmod r_2, \\ (a \operatorname{div} r_0) \bmod r_1, a \bmod r_0 \end{array} \right\rangle & C_2 \le a < C_3 \end{cases}$$

The MRS digits (e.g., '(a div $r_0$) mod $r_1$') may be represented in binary format, without applying truncation. Hence, the length of the proposed VLC-MRS (L(a)) for a thirty-two-bit non-negative integer (a) may be:

$$L(a) = \begin{cases} 11-\text{bits} & 0 \le a < C_0 \\ 19-\text{bits} & C_0 \le a < C_1 \\ 27-\text{bits} & C_1 \le a < C_2 \\ 36-\text{bits} & C_2 \le a < C_3 \end{cases}$$

This provides efficient compression and at the same time enables exploiting the benefits of MRS. In general, the representation of a thirty-two-bits integer a is $E(a)=\langle H_a, d_{a,k-1}, \ldots, d_{a,0} \rangle$ where 1≤k≤4 and $d_{a,k-1}, \ldots, d_{a0}$ is the set of minimal MRS digits required to represent a. Furthermore, $H_a$ is a two-bit header representing k−1. The MRS digits are represented in binary representation where each $d_i$ is represented by $\lceil \log_2 r_i \rceil$ bits, ([x] is the ceiling of x). Yet a uniquely decodable truncated binary representation may be used to reduce the number of bits used for the representation. In general, the representation of an integer, with k MRS digits may be referred to, herein, as MRSk.

To provide some specific examples, consider the integers $l_1=128$, $l_2=16384$, $l_3=2097152$, and $l_4=33358081$. Using the notation for E(a) described above and the constants $C_i$ defined above:

$$E(l_1)=\langle 00, l_1 \bmod r_0 \rangle = \langle 00,128 \rangle = \text{'00 010000000'}$$

$$E(l_2)=\langle 01, (l_2 \operatorname{div} r_0) \bmod r_1, l_2 \bmod r_0 \rangle = \langle 01, 32,32 \rangle = \text{'01 00100000 000100000'}.$$

$$E(l_3)=\langle 10, (l_3 \operatorname{div} (r_0\times r_1)) \bmod r_2, (l_3 \operatorname{div} r_0) \bmod r_1, l_3 \bmod r_0 \rangle$$

$$E(l_1)=\langle 10,16,8,8 \rangle = \text{'10 00010000 00001000 000001000'}$$

$$E(l_1)=\langle 11, (l_4 \operatorname{div} r_0\times r_1\times r_2) \bmod r_3, (l_4 \operatorname{div} r_0\times r_1) \bmod r_2, (l_4 \operatorname{div} r_1) \bmod r_2, l_4 \bmod r_0 \rangle = \langle 11,1,0,0,1 \rangle = \text{'11 00000001 00000000 00000000 000000001'}.$$

FIG. 11 illustrates a block diagram showing select components of example logic associated with a compressing system 1100 for performing compression of integers according to some implementations. In this example, an integer a 1102 may be a thirty-two-bit FLC encoded integer then, the compressed representation, E(a), is given by $E(a)=(H_a, d_{a,k-1}, \ldots d_{a,0})$. The integer a 1102 is routed to a set of three comparators, generally indicated by 1104, and to a Binaryto-MRS4 conversion unit 1106 where the radices are $\{r_3, r_2, r_1, r_0\}$. In one specific example, $\{r_3, r_2, r_1, r_0\}=\{253, 255, 256, 511\}$. The Binary-to-MRS4 conversion unit 1106 generates the four radix digits: $\{d_{a,3}, d_{a,2}, d_{a,1}, d_{a,0}\}$. The radix digits 1108-1114 may be represented as: {(a div $C_2$)mod $r_3$, (a div $C_1$)mod $r_2$,(a div $r_0$) mod $r_1$, a mod $r_0$}.

In this example, let $C_0=r_0$, $C_1=r_0\times r_1$, $C_2=r_0\times r_1\times r_2$, and $C_3=r_0\times r_1\times r_2\times r_3$. The three comparators 2304 check: a) $C_0\leq a$; b) $C_1\leq a$; and c) $C_2\leq a$ and based on the output of the comparators 1104 the value of a can be maimed into one of four regions:

$$\text{Region}(a) = \begin{cases} k = 0 = \text{'}00\text{'} & 0 \leq a < C_0 \\ k = 1 = \text{'}01\text{'} & C_0 \leq a < C_1 \\ k = 2 = \text{'}10\text{'} & C_1 \leq a < C_2 \\ k = 3 = \text{'}11\text{'} & C_2 \leq a < C_3 \end{cases}$$

The region mapping is done by an encoder 1116. For example, the encoder 1116 may include a lookup table that receives the output of the three comparators 1104 and produces a corresponding two-bit code. The two-bit $H_a$ 1118 is output from the encoder 1116 and, as such, $H_a$ 1118 is part of the compressed representation E(a). The $H_a$ 1118 may also serve as the control input for a selector 1120 that selects only the first n+1 (0≤n≤3) bit-codes of the MRS digits 1108-1114, and removes the rest. The remaining MRS digits 1108-1114 are concatenated to the header $H_a$ 1118 to form the compressed representation E(a) including $H_a$ 1118 and $d_{a,k-1}, \ldots, d_{a,0}$ 1122.

Finally, in order to support the pack unit described below, the compression system uses $H_a$ 1118 to compute L(a), the number of bits used for encoding a and outputs this value. The computation may involve a simple look up table and may be done by the number of bits calculation unit 1124 providing as output the number of bits signal 1126, which denotes the number of bits used for encoding.

FIG. 12 illustrates a block diagram showing select components of example logic associated with a decompression system 1200 for performing decompression of encoded integers according to some implementations. In the current example, the decompression system 1200 may utilize a VLC-MRS compression technique described above. It should be understood that the system 1200 may be used with several other variants of the VLC-MRS, such as the those discussed previously. In the illustrated example, let a 1202 be a thirty-two-bit FLC encoded integer encoded as E(a)= $\langle H_a, d_{a,k}, \ldots, d_{a,0}\rangle$ 1204, where 0≤k≤3.

In this example, the compressed representation E(a) 1204 is provided to the system 1200 where it is partitioned into the header $H_a$ 1206 and the MRS digit frustum 1208 defined as $\langle d_{a,k}, \ldots, d_{a,0}\rangle$ (0≤k≤3). The decompression system 1200 provides $H_a$ 1906 to a 4×1 decoder 1210. The output of the decoder 1210 acts as an enable signal to set of MRSi-to-binary conversion units, generally indicated by 1212-1218, thereby enabling the units 1212-1218 relevant to E(a) 1204. In the present case, unit0 1212 is an MRS1-to-binary converter using the radix $\{r_0\}$ and generating the digit $\{d_0\}$. Unit1 1214 is an MRS2-to-binary converter using the radixes $\{r_1, r_0\}$ and generating the digit $\{d_1, d_0\}$. Unit2 1216 is an MRS3-to-binary converter using the radixes $\{r_2, r_1, r_0\}$ and generating the digit $\{d_2, d_1, d_0\}$. Finally, Unit3 1218 is an MRS4-to-binary converter using the radixes $\{r_k, r_{k-1}, \ldots, r_{01}\}$ and generating the digit $\{d_k, \ldots, d_0\}$.

The value of $H_a$ 1206 is also provided as a control signal to the selector 1230 which produces the right frustum 1220-1226 and routes the frustum 1220-1226 to the appropriate MRSi-to-binary conversion unit 1212-1218. The value of $H_a$ 1206 is also provided as a control signal to a selector 1228 and the outputs of the MRSi-to-binary units 1212-1218 are provided as input signals to the selector 1228. The selector 1228 selects the valid inputs based on the control input $H_a$ 1206 and generates integer a 1202.

Figure 13:
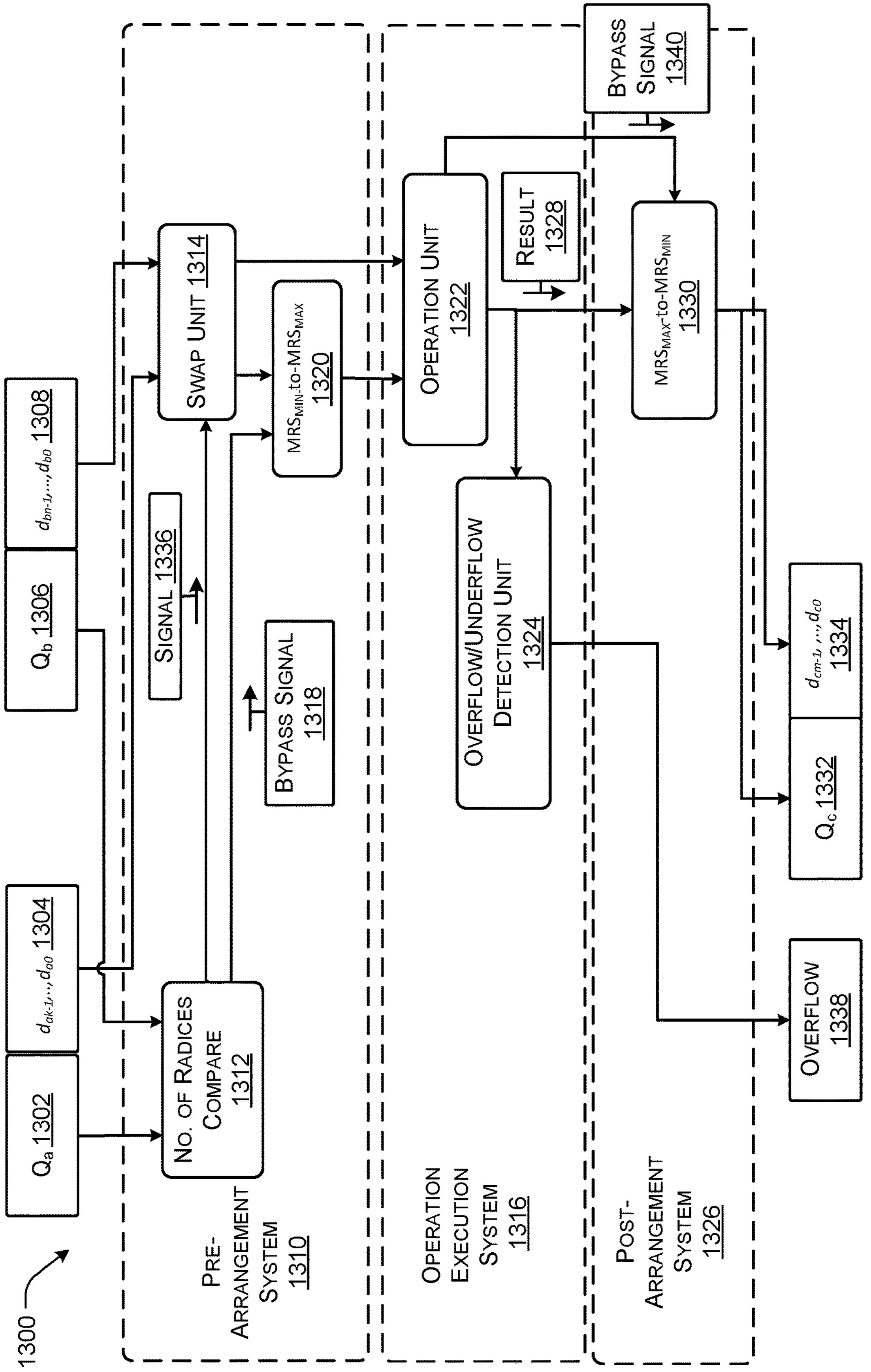
FIG. 13 illustrates a block diagram showing select components of example logic associated with a compressed domain processor according to some implementations.

FIG. 13 illustrates example of logic associated with a compressed domain processor 1300 using an example VLC-MRS compression method. Several variants of the VLC-MRS can be considered. In this example we assume that non-negative integers, that is integers in the range [0, . . . , 429496729], are compressed according to the example provided for the VLC-MRS compression engine described above with an MRS system of up to 4 digits (MRS4). Other variants have similar features and their use for a VLC-MRS domain processor can be inferred by a person who is skilled in the art. The method presented appends a fixed length header to each MRS numeral, where the header denotes the number of radixes to be used. Furthermore, details of the VLC-MRS CDP components for non-negative integer addition are provided herein. Components for other operations such as multiplication, subtraction, division etc. are similar and their design may be inferred from the VLC-MRS CDP components for non-negative integer addition discussed here. One difference, however, is that some of the operations, e.g., subtraction might generate a result that is smaller than its operands, which is discussed further below.

FIG. 13 illustrates a block diagram showing select components of an example logic associated with a compressed domain processor 1300 for preforming MRS addition on VLC-MRS encoded thirty-two-bit integers. Let a and b be two integers and let E(a)=$\langle Q_a$ 1302, $d_{ak-1}, \ldots, d_{a0}$ 1304$\rangle$ and E(b)=$\langle Q_b$ 1306, $d_{bn-1}, \ldots, d_{b0}$ 1308$\rangle$. The VLC-MRS of a and b is provided to the compressed domain processor system 1300. In the first step, the pre-arrangement-system 1310 receives the two integers. For example, a compare unit 1312 receives $Q_a$ 1302 and $Q_b$ 1306 and compares the number of radices of the two integers. This may result in one of two cases of interest: 1) k=n, 2) k<n. In the case that k>n, in similarity to the description provided for the SigBytes CDP, the compare unit 1312 sends signal 1336 to a swap unit 1314 of the pre-arrangement-system 1310 and the swap unit 1314 switches the roles of a and b. Hence, without loss of generality, the current example assumes that k≤n.

When k=n, the pre-arrangement-system 1310 removes the headers $Q_a$ 1302 and Qb 1306 from the VLC-MRS representation of the VLC-MRS representation of operands and provides the set of mixed radix digits of a and b without swapping to the operation-execution-system 1316 (the swap operation may be avoided in response to the signal 1336 described below). In this case, a bypass signal 1318 disables the operation of the MRSk-to-MRSn unit 1320 (described below). A value of '0' in the bypass signal 1318 disables the operation of the MRSk-to-MRSn unit 1320 and a value of '1' enables the unit, The result is that both integers are represented in the format of MRSn. In the case where k<n, the pre-arrangement-system 1310 removes the header $Q_b$ 1306 of b and provides the set of mixed radix digits of b to the operation-execution-system 1316. At the same time, the pre-arrangement-system 1310 uses an MRSk-to-MRSn conversion unit 1320 to prepare the operand a for the operation unit 1322. Next, the pre-arrangement system 1310 provides the two numbers a and b represented in the format of MRSn to the operation-execution-system 1316. Note that the implementation of MRSk-to-MRSn consists of prepending n−k mixed radix digits of 0.

The operation-execution-system 1316 includes an operation unit 1322 that is configured to perform a set of operations on MRS numbers. The set of operations may include, addition, subtraction, multiplication, division, compare operations, etc. Note that numerous implementations of components for these MRS operations are known. The current example concentrates on addition.

The result 1328 of the operation-execution-system 1316 is in MRSn, format potentially with a carry out from the n−1 mixed radix digit (referred to as $C_n$). If no carry has occurred, the result is valid and need not be corrected. In the case of $C_n$ where n<4, a radix digit with a value of 1 is prepended to the result. The obtained corrected result is in MRSn+1. The signal $C_n$ for n=4 ($C_4$), however denotes an overflow, which may be detected by an overflow/underflow detection unit 1324. Nevertheless, in some cases (e.g., subtraction) there may be other indications of overflow. In general, the operation-execution-system 1316, and in specific the overflow/underflow detection unit 1324, may check if the result of the operation caused an overflow (i.e., a result that is larger than the maximal integer that can be represented by the system encoding scheme) or underflow (i.e., result that is smaller than the minimal integer that can be represented by the system encoding scheme) and set an overflow/underflow flag 1338 as appropriate. For VLC-MRS addition of non-negative integers, the result 1328 of the operation-execution-system 1316 is in MRSn or MRSn+1 format and if there is no overflow/underflow it is a valid result 1328.

The post-arrangement-system 1326 accepts the result 1328 of the MRS operations (c) where c is represented in MRSm for some m (e.g., m=n or m=n+1 in the case of non-negative integers addition). Assuming that c is a valid result (e.g., no overflow/underflow occurred), and m is the minimal number of radix digits required to represent the result, the post-arrangement-system bypasses the MRS1-to-MRSm 1330 unit (described below) via a bypass signal 1340, prepends a two-bit header $H_c$ 1332 with the value of m−1 to the MRSm representation of c thereby generating the encoded representation of the result c, ($E(c)=\langle Q_c$ 1332, $d_{cm-1}, \ldots, d_{c0}$ 1334$\rangle$). For VLC-MRS addition, m is indeed the minimal number of radix digits required to represent the result.

For some CDP operation (e.g., subtraction), however, the obtained result is in the form MRS1, where the value of l might be smaller than n. In these cases, the MRS1-to-MRSm 1330 unit may be enabled. This is further discussed below. In these cases, the post-arrangement-system 1326 may use a MRS1-to-MRSm conversion unit 1330, where m is the minimal number of mixed radix digits needed to represent c. Next, in these cases, the post-arrangement-system 1326 may prepend the two-bit header $Q_c$ 1332 with the value of m−1 to the MRSm representation of c thereby generating the encoded representation of the result c, ($E(c)=\langle Q_c$ 1332, $d_{cm-1}, \ldots, d_{c0}$1334$\rangle$). In general, the MRS1-to-MRSm 1330 may remove the most significant mixed radix digits with value of ‘0’.

In the illustrated example, the compressed domain processor 1300 may be configured to process non-negative integers according to the proposed embodiment of the VLC-MRS coding using a maximum of thirty-two-bits for the encoding. In the current example, we consider compressed integers, E(a) and E(b), according to some VLC-MRS encoding implementations (e.g., the one described for the VLC-MRS-CE above. Thus, $E(a)=\langle Q_a, d_{ak-1}, \ldots, d_{a0}\rangle$ and $E(b)=\langle Q_b, d_{bn-1}, \ldots, d_{b0}\rangle$. The notation ‘radix sequence’ is used to denote a set of mixed radix digits of the form ‘$d_{xn-1}, \ldots, d_{x0}$.’

For instance, in the illustrated example, the compressed domain processor 1300 may include a pre-arrangement-system 1310, that prepares the operands to be received by the operation-execution-system 1316, which performs the operation and provides the intermediate result 1328, and a post-arrangement-system 1326, that rearranges the intermediate result 1328, along with a header $Q_c$ 1332, in a form that complies with the encoding scheme, as discussed above.

The pre-arrangement-system 1310 aligns the two radix sequences of both operands so that both contain the same number of mixed radix digits within temporary registers, to enable operating on same position mixed radix digits. The alignment is achieved by calculating the number of mixed radix digits difference between the two operands’ Q headers and modifying the representation of the numeral with less mixed radix digits to contain the same number of mixed radix digits as the other numeral. If the two numerals have the same number of mixed radix digits, then alignment is not needed and is not being performed. The pre-arrangement-system 1310 provides the two aligned operands to the operation-execution-system 1316. The result 1328 of the operation performed by the operation-execution-system 1316 might produce, any number in the range as well as overflow and in some operations, such as subtraction an underflow. In some examples, such as when non-negative integers are subject to VLC-MRS addition or subtraction operations, an overflow/underflow may be detected by a carry or borrow from the last mixed radix digit. The system, however, can be extended to include negative number representation using methods such as sign and magnitude. In case that overflow/underflow conditions are met they are detected by the overflow/underflow detection unit 1324, an overflow/underflow flag 1338 may be set.

In one specific example, the fixed length headers $Q_a$ 1302 and $Q_b$ 1306 are provided to a comparator 1312. Given that $Q_a$ 1302 and $Q_b$ 1306 are two-bits components, the comparator can actually be implemented via a simple combinatorial logic. In this example, the comparator 1312 checks whether $Q_a$ 1302<$Q_b$ 1306, in which case the comparator 1312 sets the signal 1336 representing $Q_a$ 1302<$Q_b$ 1306 to ‘1’, thereby enabling the swap unit 1314. Otherwise, the signal 1336 representing $Q_a$ 1302<$Q_b$ 1306 is set to ‘0’ and the swap unit 1314 is disabled. Additionally, the comparator 1312 checks whether $Q_a$ 1302=$Q_b$ 1306 in which case the comparator 1312 sets the line $Q_a$ 1302=$Q_b$ 1306 (or the bypass signal 1318) to ‘0’ and disables the MRS1-to-MRSm conversion unit 1330. Otherwise, the line $Q_a$ 1302=$Q_b$ 1306 (or the bypass signal 1318) is set to ‘1’ and enables the MRS1-to-MRSm conversion unit 1330. It should also be understood that the comparator component 1312 may be implemented via a subtractor. In this case the signal 1336 $Q_a$ 1302<$Q_b$ 1306 is set based on the sign of subtraction and the signal 1318 $Q_a$ 1302=$Q_b$ 1306 is set to ‘1’ if the result of subtraction is 0. The subtractor may subtract the value of $Q_a$ 1302 from $Q_b$ 1308. Alternatively, it may subtract the value of $Q_b$ 1306 from $Q_a$ 1302 to determine the values of the line $Q_a$ 1302=$Q_b$ 1306. Additionally, in some implementations, the subtractor may be configured to subtract the larger value from the smaller value or vice versa.

The signal 1336 representing $Q_a$ 1302<$Q_b$ 1306 is provided to a swap unit 1314. The swap unit 1314 receives the signal 1336 from the comparator component 1312 as well as the MRS digits sequence $Q_a=d_{ak-1}, \ldots, d_{a0}$ 1304 and the MRS digits $Q_b = d_{bn}-1, \ldots, d_{b0}$ 1308 (e.g., the sequence of mixed radix digits representing the integers a and b).

The swap unit 1314 is able to determine which of $Q_a$ 1304 and $Q_b$ 1308 has more mixed radix digits using the value of the signal 1336. The swap unit 1314 provides the radix sequence with larger cardinality (e.g., n) to the operation-execution-unit 1322. The radix sequence with smaller cardinality (e.g., k) is provided to an MRSk-to-MRSn conversion unit 1320. However, this unit is controlled by the bypass signal 1318. If the value of the line $Q_a$ 1302=$Q_b$ 1306 (or the bypass signal 1318) is '0' the RNSMIN-to-MRS unit 1320 is disabled and bypassed. In general, the MRSk-to-MRSn unit 1320 may prepend n−k radix digits with a value of '0' to the MRSk representation.

Once both of the aligned radix sequences $D_a$ 1304 and $D_b$ 1308 (i.e., both are with a cardinality of n) are received by the operation-execution-system 1316, the operation execution system 1316 may perform MRSn-by-MRSn operations on the two operands (this is denoted as MRSn op MRSn) and produce an MRSm result 1328 for some m. In the case of non-negative integer addition, m is either n or n+1. An overflow/underflow detection unit 1324 may determine if an overflow or underflow has occurred (e.g., in the case of subtraction). If any of these two conditions holds the unit 1324 sets an overflow/underflow flag 1338.

The results 1328 from the operation-execution-system 1316 ($Q_c = d_{cl-1}, \ldots, d_{c0}$) for some l, is provided to the post-arrangement-system 1326. If no overflow/underflow has occurred and l>1 the post-arrangement-system 1326 adjusts the cardinality of the $Q_c$ to the minimum cardinality needed (say m) by passing it through a MRS1-to-MRSm 1330 conversion unit.

However, if l=1 then the unit 1330 is bypassed and disabled. Finally, the post-arrangement-system 1328 prepends a header with the value of $Q_c = m-1$ to the adjusted (if needed) $Q_c$, and produces the result $E(c) = \langle Q_c, d_{cm-1}, \ldots, d_{c0} \rangle$ The VLC-MRS can be used to represent signed number, e.g., using sign and magnitude representation. Additionally, note that variants of the VLC-MRS which use different radices and/or different VLC schemes can be handled by a compressed domain processor that is modified accordingly. It should be noted that the VLC-MRS can be used to represent un-bounded integers (e.g., using the set of all prime numbers as radices and a stop sign that denotes the last prime used). Furthermore, some of the representations of un-bounded integers using VLC-MRS are universal. Hence, the compressed domain processor can be designed for any given bound or range.

In addition to the systems and methods for integer compression and decompression discussed above, compression and pack system as well as decompression and unpacking system may be configured to utilize other compression techniques, such as comma code. Under the comma code encoding, discussed herein, integers are represented in base-x, where $x \neq 2^n$. Hence, if every digit of the base-x representation of an integer is coded via a binary combination or representation, at least one of the combinations is unused and can be used as a special symbol, e.g., a comma that separates integers. Typically, comma code uses a base—x such that $x = 2^n - 1$, for some n.

Commonly used bases are x=3, x=7, and x=15. In the case of x=3, the digits {0, 1, 2} of base-3 integer representation can be encoded by {00, 01, 10} respectively. This leaves the combination '11' as unused. This combination however, can be used to denote a comma (e.g., to denote the end of an integer in a given stream). The digits of the trinary representation of an integer may be referred to as trits.

In one example, assume that the source transmits two integers: 35 followed by 61. Given that $(35)_{10} = (1022)_3$ and $(61)_{10} = (2021)_3$, the sequence is represented as '01 00 10 10 11 10 00 10 01 11', where the blanks have been inserted for readability. Following the discussion above, the encoder for comma code for an integer J given in binary, can be implemented via conversion from base-2 to base-x where $(x \neq 2^n)$ followed by binary decoding of the base-x digits of J in base-x and insertion of the comma. The decoding of an integer J can be implemented via the conversion of J from base-x to base-2. An implementation of the encoder and the decoder is provided below.

The current example illustrates logic associated with a compression and decompression systems using the Ternary comma code compression method (comma-3). In the comma-3 system, the system may represent integers in base-3 notation. In the base-3 notation a digit or integer may be referred to as a trit.

In this comma-3 encoding technique, E(i) has the form: $\langle t_{i,n-1}, \ldots, t_{i,1}, t_{i,0}, 11 \rangle$ where $t_{i,k}$ is the 2-bit binary representation of trit k in the n-trits ternary representation of the integer i. Additionally, to represent a 32-bit binary integer the system may require 22 trits (i.e., for $3^{21} < 2^{32} < 3^{21}$). Hence, the resulting encoded representation may be of up to twenty-two trits or forty-four bits (each trit may be represented by two bits), or twenty-three trits or forty-six bits including the comma symbol.

The compression system for the current comma-3 example may include transforming the fixed length binary representation to a variable length ternary representation using the minimal number of trits needed, followed by the comma trit at the end of the string of trits representing the integer.

In some cases, Comma code may be extended to include signed number representation, e.g., by adding a sign bit or a sign trit. Other methods for representing negative integers e.g., 3-complement and mappings the set of non-negative integers to the set of even (odd) integers and mapping the set of negative integers to the set of odd integers can be used. These representations may be implemented in a compressed domain process that is similar to the embodiment described in this document.

However, it should be understood that other forms of comma code compression, using other radices, such as 7, 15, etc., may be utilized. For instance, base-7 can be used for comma encoding, e.g., comma-7 with similar implementations as discussed above. It should be further noted that variations of the comma code, which differ in implementation details, such the representation of '0', exist and their implementation in a compressed domain process is similar to the embodiment described here.

In one example, comma-7 may be used to represent variable length integers. In this case efficient conversion from base-2 to base-7 might be required and, 12 base-7 digits may be used for representing the set of 32-bit integers. In this example, the binary combinations '000' to '110' may be used to represent the base-7 digits and '111' represents the comma. However, it should be understood that this method can be expended to any number of bits.

Figure 14:
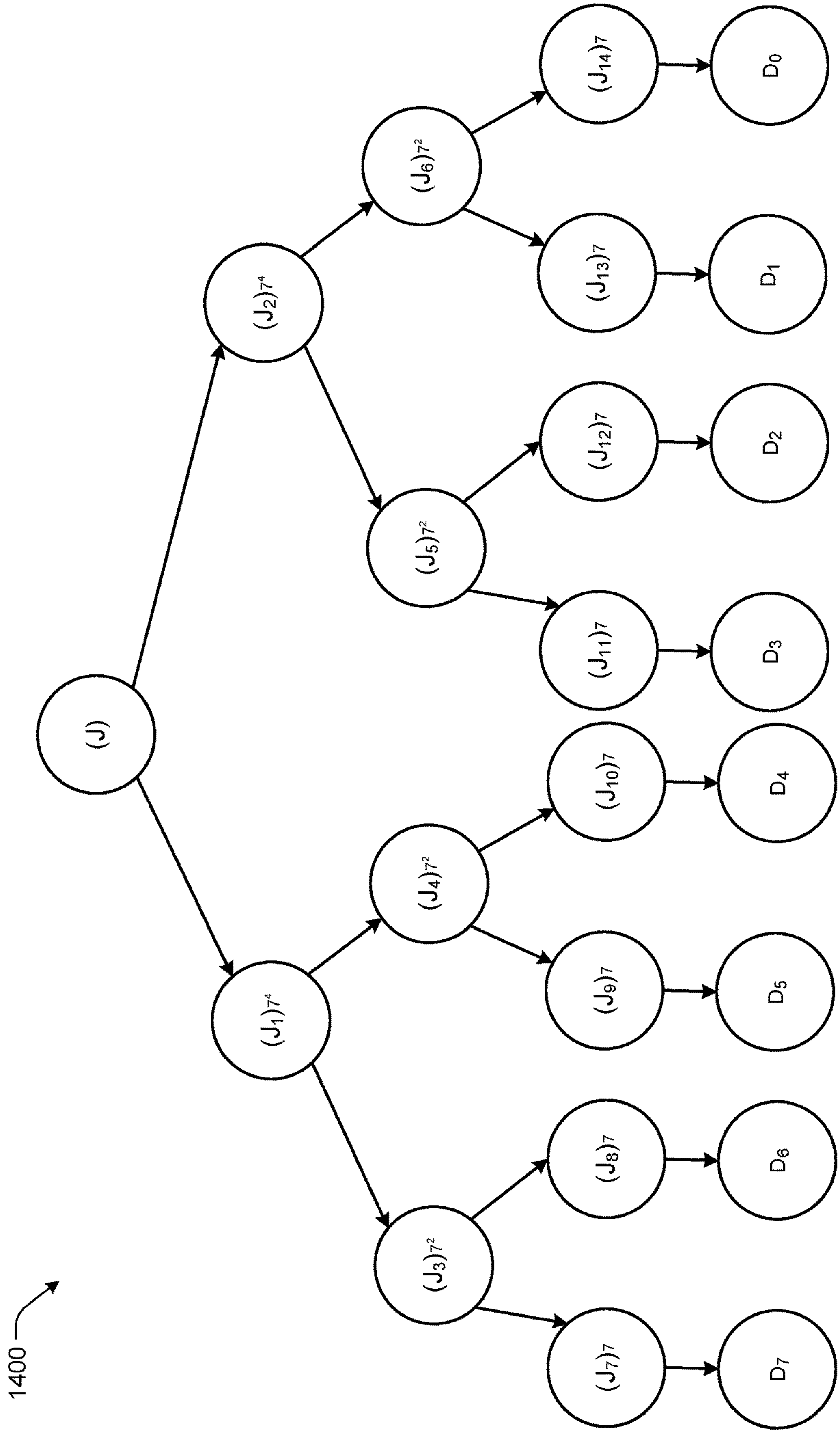
FIG. 14 illustrates example of graphical representation of a radix conversion according to some implementations.

FIG. 14 illustrates an example of converting integers in the range [0, 576480] into base-7 representation. In this case, up to 8 base-7 digits may be required. The same principle can be applied to conversion of integers in different ranges to other bases such as base-3.

The conversion process from base-2 to base-x (e.g., x=7) can be implemented using a conversion tree. For example, in the process of converting an integer in the range [0, $2^{1\ 1}$] to base x, under the assumption that $2^{l-1}<x^k\leq 2^l$ and the assumption that $k=2^n$ for some n (that is, k is a power of 2), the system may construct a conversion tree 1400, in which the system may first convert to base-$x^{k/2}$. Next, the system may convert each of the digits of the base-$x^{k/2}$ representation to digits represented in base-$x^{k/4}$. Then, the conversion proceeds with base-$x^{k/8}$ and so on and so force. The system may continue to recursively process each of the digits until the system reaches $x^1$. In this case, the conversion from one step to the next may be done by the operations of DIV and MOD. The operations may be implemented by a divider or a via a lookup table. In some cases, the process may be pipelined to further improve performance.

In one specific example of the process, as depicted in FIGS. 14, x=7 and l=8 (hence, n=3). The value of $\log_2(7^8)\approx 22.46$. Therefore, this illustration can be applied to integers with up to 22 bits (that is integers in the range [0, 222-1]). In this example, the input is J, where J is in the given range.

For example, the system may convert the binary representation of the decimal number 1234567 (which falls into the said range) into a base-7 number using the depicted tree. Note that $(1234567)_{10}=(13331215)_7$, and given that $7^4=2401$ and $\mathbf{7}^2=49$ then, $(1234567)_{10}=[(514)_{2401}, (453)_{2401}]=[[(10)_{49}, (24)_{49}], [(9)_{49}, (12)_{49}]]=[(13)_7, (33)_7, (12)_7, (15)_7](13331215)_7$ As illustrated in Table 3, the process depicted in FIG. 14 may be pipelined. In the table, it is assumed that $I_1, I_2, \ldots, I_7$ is an input stream of integers. Note that some stages in the pipeline might be implemented via a lookup tables, in which at the low-end of the tree one lookup table can generate more than one digit.

TABLE 3

| Pipelining the process | | | | | | | |
|---|---|---|---|---|---|---|---|
| Pipeline Stage | | | | | | | |
| In | $I_1$ | $I_2$ | $I_3$ | $I_4$ | $I_5$ | $I_6$ | $I_7$ |
| base-$x^4$ | | $I_1$ | $I_2$ | $I_3$ | $I_4$ | $I_5$ | $I_6$ |
| base-$x^2$ | | | $I_1$ | $I_2$ | $I_3$ | $I_4$ | $I_5$ |
| base-x | | | | $I_1$ | $I_2$ | $I_3$ | $I_4$ |
| Out | | | | | $I_1$ | $I_2$ | $I_3$ |

In addition, in order to support the pack unit described below, the compression system computes the number of bits used for the representation of the encoded integer a and outputs this value. The computation may involve a look up table that maps the number of base-x digits produced by the conversion procedure to the number of bits needed to represent these digits.

Figure 15:
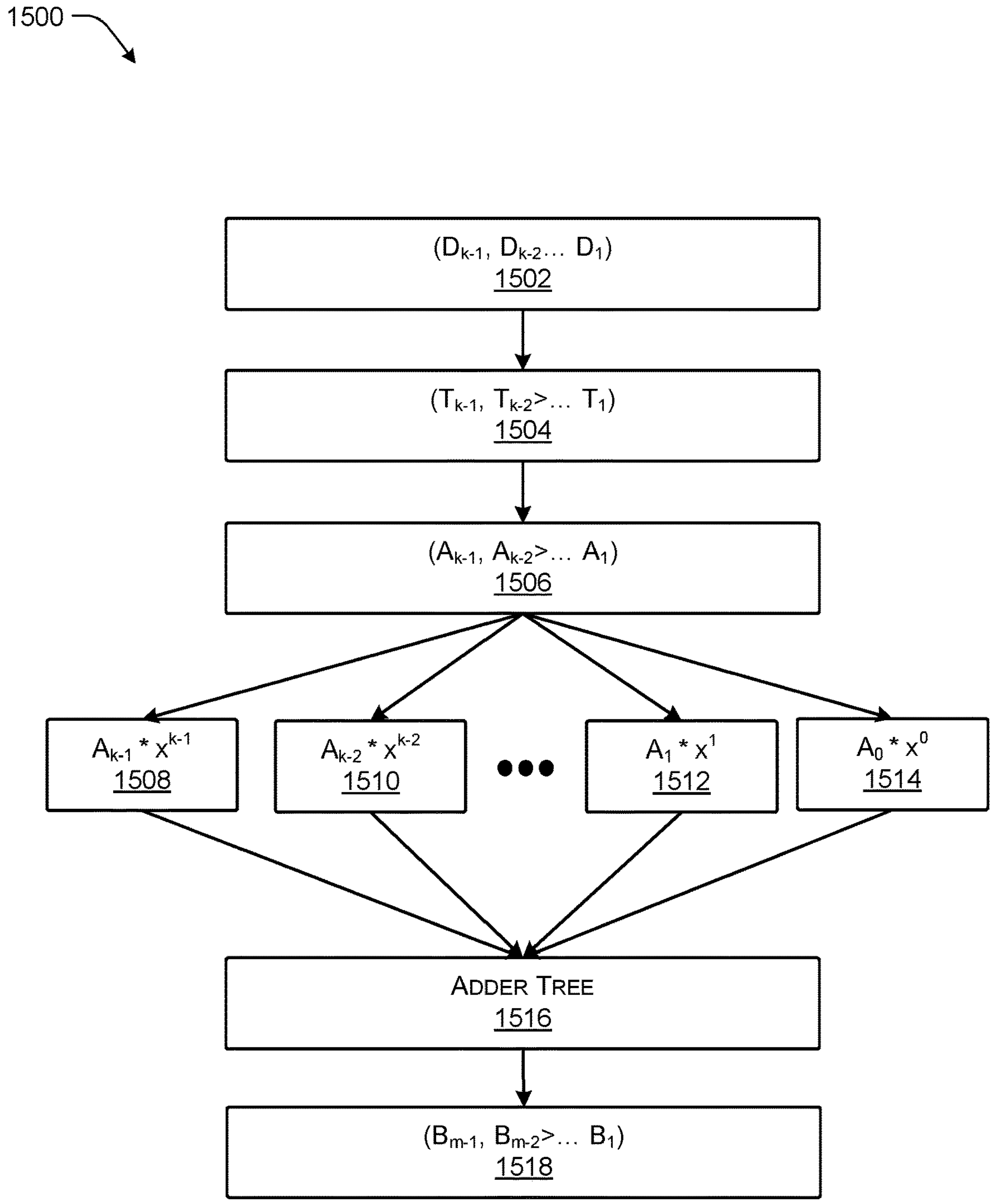
FIG. 15 illustrates an example decoder according to some implementations.

FIG. 15 illustrates an example decoder 1500 according to some implementations. In this example, the decoder 1500 obtains the binary equivalent of each of the digits 1502 and implements a base conversion to encode each of these digits. For example, consider converting from base x to base 2, an integer J represented in base x having each digit of J ($d_n$) in the range {0 . . . x−1}. Further, let l be given by $l=\log_2(\lceil x-1\rceil)$, where $\lceil y\rceil$ denotes the ceiling of y. In this case, each of the digits off may be represented by l bits. Based on the assumptions that govern the comma code encoding $x<2^l$ for some l. Let $(d_{k-1}, d_{k-2}, \ldots, d_1, d_0)$ be the representation off in base-x. The encoder represents each digit of J ($d_n$) with l bits using the binary representation of (4). Under the assumption that $x<2^l$, however, at least one combination of l bits, e.g., the binary representation of the comma, is not a valid representation of a base-x digit.

For instance, when x=7 the combination '111' represents an invalid base-7 digit and is used as the comma. Under the above assumptions, the conversion of J from base-x to binary can be done in the following way.

First, the decoder 1500 may divide the comma code of J, excluding the comma into groups of l-bits, potentially prepending 0s in front of the comma code of J. A group of l-bits, however, might contain combinations that represent invalid base-x digits (e.g., the comma). These combinations are considered as exceptions. the combinations have to be treated in a special way that reflect the exception. The comma exception is used to identify the end of an integer. Hence the end of the integer is discarded. Each of the valid combinations of bits is referred to as a token 1504. Let $(t_{k-1}, t_{k-2}, \ldots, t_0)$ be the set of tokens 1504 representing J. The actual integer value of each digit in each token 1504 is represented in binary via the representation $(A_{k-1}, A_{k-2}, \ldots, A_1, A_0)$ 1506. The next step in the conversion from Base-x to binary is to multiply the correct integer value ($A_n$) in 1506 of each token, $t_n$ in 1504 by $x^n$ obtaining the set of values $A_i\times x^i$ (1508, 1510 . . . 1512, 1514) and accumulating the results e.g., using an adder tree 1516. The output of the adder tree is used to generate the bits of the binary representation 1518 of the input code.

The multiplications and accumulation can be implement via a multiply accumulate hardware. Alternatively, the products $A_i\times x^i$ generally indicated by 1508-1514 can be accumulated via an adder tree (e.g., 1516). In this case, the multiplication can be accomplished by a table lookup. This might be efficient since generally x is small. Moreover, since the multiplication can be applied independently to each digit (as shown by 1508-1514), the process can be accelerated by pipelining and by performing multiplications in parallel and the accumulation via an adder tree 1516. Furthermore, the conversion can be applied to groups of digits rather than one digit at a time. For example, $(61)_{10}=(2021)_3=[(2)_{27}, (7)_{27}]$ (i.e., a digit that represents 2 in base 27 and a digit that represents 7 in base 27). An example of possible parallel multiplication along with an adder tree 1516 is given below.

For example, consider $(61)_{10}$ which is equal to $(2021)_3$. One tokenized representation of {0,1, 2} can be {00, 01,10}. Hence, the tokenized representation of $(2021)_3$ is (10 00 10 01). The conversion of $(2021)_3$ is obtained by $(2\times 3^3+0\times 3^2+2\times 3^1+1\times 1)3°\ _{10}=(2\times 27+0\times 9+2\times 3+1\times 1)_{10}$. This can be implemented in binary hardware by representing the powers in binary and the trits via the binary equivalent of their tokens. The binary representation of {27, 9, 3, 1} is {11011, 1001, 11, 1}. Hence, $(2\times 27+0\times 9+2\times 3+1\times 1)_{10}=(10x\ 11011+00\times 1001+10\times 11+01\times 1)_2=(111101)$. In some cases, this may be done via multiply accumulate.

In the following examples, methods for generating sequences of pseudo random numbers for symmetric encryption are discussed (referred to herein as pseudo random numbers generation as PRNG). In some cases, the sequences are generated according to several procedures of constructing the Collatz trajectory (defined below) or the Collatz tree (defined below). For example, the PRNG may first utilize the Collatz recursion and the Collatz conjecture. Collatz recursion may be applied to integers in the following way:

1. C(1)=1
2. Given an integer n, let C(n)=n. Next:
   a. If n is even, then C(n)=n/2.
   b. If n is odd, then C(n)=3×n+1

The Collatz conjectures states that for every integer n, applying the Collatz recursion described above to n repeatedly, results in C(1) (where C(1)=1). The Collatz trajectory of n is the set of integers obtained throughout the recursive procedure of starting with C(n)=n and ending with C(1).

The following is a procedure that may be applied to verify that the Collatz conjecture holds for the integers in the range [1 . . , k].

1. Construct the list of integers from 1 to k.
2. For each integer check whether it complies with the conjecture using the Collatz recursion.

Note that (2) generates the trajectory of k for each k. Also note that (2) "touches" many integers (e.g., 16, 8, 4, 2) more than one time. Using exhaustive and non-exhaustive verification methods the validity of the conjecture has been verified for integers up to 264.

The following assumes that the Collatz conjecture holds and describes one example of PRNG using the Collatz recursion. Other method for using the recursion for PRNG exist. Herein, the Collatz recursion is implemented as backwards traversal. Since, the Collatz recursion starts with an integer k and ends up with 1.

1. Select an integer n.
2. Generate the Collatz trajectory of n.
3. Let l be the length of the Collatz trajectory of n. Output l.
4. Repeat the process with n+1.

The Inverse Collatz recursion on integers (or forward traversal routine as the Inverse Collatz recursion starts with 1 and ends with a set of integers greater than or equal to 1) in the following way:

1. Given an integer n, the successors of n ({S(n)}) are given in the following way:

$$\{S(n)\} = \begin{cases} \{2 \times n\} & n \bmod 3 <> 1 \\ \left\{2 \times n, \frac{n-1}{3}\right\} & n \text{ is even and } n \bmod 3 = 1 \end{cases}$$

It should be noted that the inverse recursion, as specified above, includes the cycle {1,2,4,1}. Thus, for practical reasons, and due to the fact that the sequence {1,2,4,8} is trivial, the inverse recursion may start with 8.

Hence, depending on the value of n mod 3, n has either one successor ({2×n}) or two successors $$\left\{2 \times n, \frac{n-1}{3}\right\}.$$

Note that the definition of the successor[s] of an integer n, induces the definition of the predecessor of any integer n.

The Collatz graph T, consisting of the vertices v(i) may be defined in the following way:

1. T contains the vertex v(8)=8.
2. For every vertex v(i)=i, if v(i) is a vertex in T, then the successor[s] of v(i) ({s(i)}) are vertices in T. For each vertex v(i) in T, a directed edge connects v(i) with its predecessor vertex.
3. Additionally, T contains the path {v(1), v(2), v(4), v(8)}. Along with the directed edge from v(8) to v(4), the directed edge from v(4) to v(2), and the directed edge from v(2) to v(1). The directed edge from v(4) to v(1), however, is excluded from T.

Under the assumption that the Collatz conjecture holds, the graph T, described above is acyclic and contains all of the integers along with their respective edges. Hence the graph T is an acyclic connected directed graph and the graph T may be considered a directed tree; referred to as the Collatz tree.

In some cases, a system may use several tree traversal methods for Collatz tree based PRNG. The integers encountered during traversals constitute a sequence which may fit the requirements of a PRN sequence. In some cases, it can be shown, that a depth-first traversal might run into traversing an infinite path, generating a sequence that does not qualify as high quality PRN sequence (e.g., it can get stuck on the $2^n$ path). Hence, the system herein may utilize variants of a breadth-first traversal routine for tree traversal; generally implemented using a Queue, i.e., a list managed in a first in first out fashion (FIFO or Q for short). The tree traversal methods may differ in the ways the methods traverse and prune the tree depending on a specific que management procedure. For instance, in one example, the tree traversal methods might include:

1. Managing the traversal via a sorted queue while removing every even integer (say k) that comply with one of the following conditions:
   i. K is even and k=0 mod 3,
   ii. k=2 mod 3. And,
2. Other methods for tree traversal such as uniform cost traversal, heuristics-based traversal and combinations of breadth-first and depth-first traversal (e.g., bounded-cost traversal) might be practical.

The following example considers an unsorted and non-pruned breadth-first traversal:

1. Assume that 1, 2, and 4 are already on the tree (this is done to avoid the {1, 4, 1, 4, . . . cycle})
2. Place 8 on a queue (FIFO, Q).
3. Perform (ad infinite):
   a. For each vertex j in Q
      i. Remove j from Q
      ii. Add j along with the edge that connects it to its predecessor to the graph. The edge is directed from j to its predecessor
      iii. Add the Collatz successor[s] of j to Q In a possible numerical example of tree traversal (using unsorted and non-pruned breadth-first traversal):

1, 2, 3, and 4 are on the tree and 8 is on the Q.
 T={1←2←3←4}; Q=[8]
Remove 8 from the Q, add it to the tree, and connect it to its Collatz predecessor (4)
 T={1←2←3←4←8}.
Add the Collatz successor of 8 (16) to the Q
 T={1←2←3←4←8}; Q=[16]
Remove 16 from the Q, add it to the tree, and connect it to its Collatz predecessor
 T={1←2←34←8←16}.
Add the Collatz successors of 16 (32, 5)) to the Q
 T={1←2←3←4←8←16}; Q=[32,5]
Remove 32 from the Q, add it to the tree, and connect it to its Collatz predecessor.
 T={1←2←3←4←8←16←32}
Add the Collatz successors of 32 (64) to the Q
 T={1←2←3←4←8←16←32}; Q=[5, 64]
Remove 5 from the Q, add it to the tree and connect it to its Collatz predecessor (16).
 T={1←2←3←4←8←16←32}∩{16←5}}

Add the Collatz successor of 5 (10) to the Q

T={1←2←3←4←8←16←32}∩{16←5}}; Q=[64, 10]

The Collatz recursion involves two basic operations: 1)

$$C(n)=\frac{n}{2},$$

and 2) C(n)=3×n+1=2×n+n+1. Hence, under binary representation, the first operation can be implemented by a right-shift instruction and the second operation can be implemented via left shift, addition, and an increment instruction. This implementation lends itself to a very efficient hardware implementation. The inverse Collatz recursion involves another set of operations: 1) C(n)=2×n=3×n−n, and 2) C(n)=(n−1)/3. Both operations can be done efficiently using base-3 representation of integers, where multiplication by two is shift left and subtract. Division by three is right shift. Hence, this method may well-fit a Comma-3 compression engine as well as a Comma-3 compressed domain processor. Hence, it can be used as a part of the encryption of Comma-3 compressed integers.

On the other hand, the Collatz recursion-based methodology traverses the path from an integer n to the integer 1. However, the process traverses identical sub-paths (e.g., {16, 8, 4, 2, 1}) numerous times. Hence, in terms of time performance, the process may not be efficient. The recursion based traversal can be implemented via a depth-first routine. Hence it can be implemented with linear space complexity. The inverse-Collatz-based tree traversal evaluates each integer only one time. Thus, the process discussed herein is more efficient than the Collatz based recursion in terms of time complexity.

Figure 16:
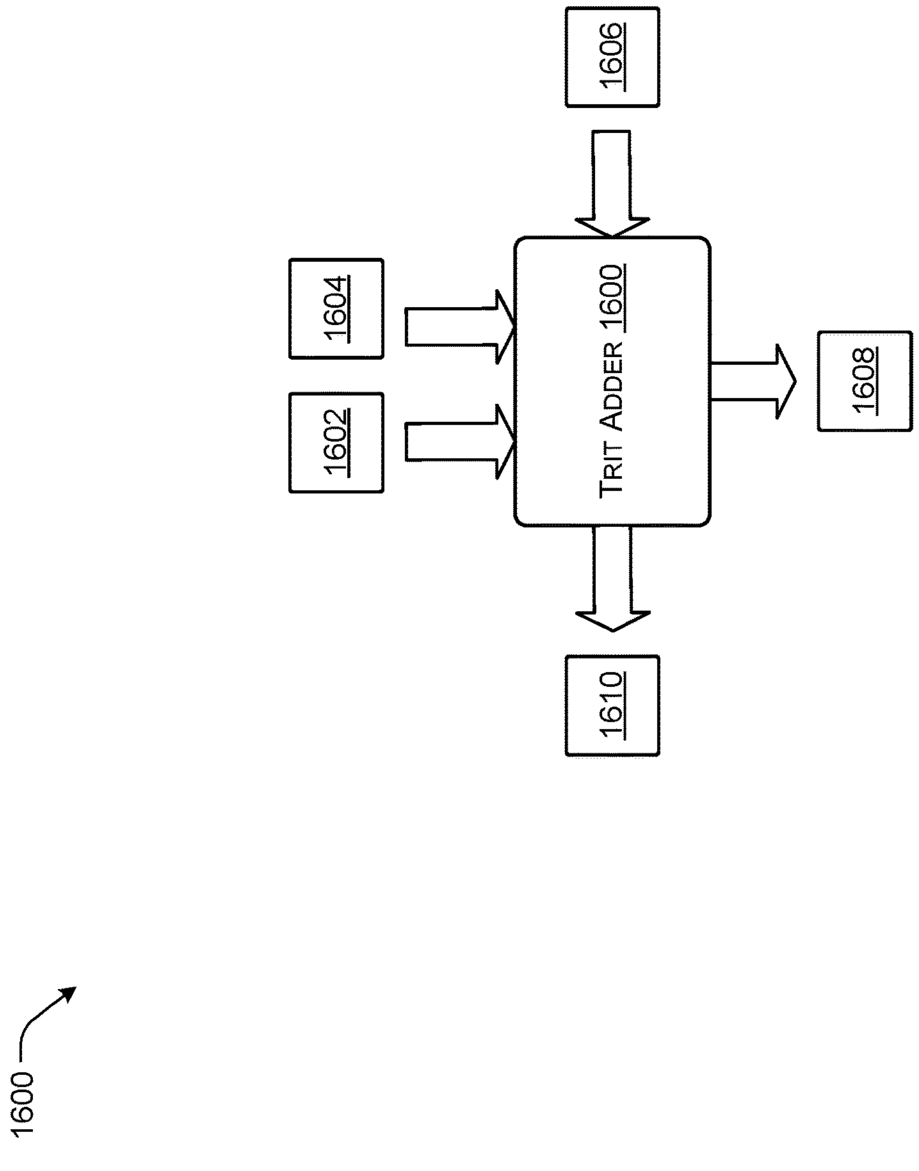
FIG. 16 illustrates a block diagram showing select components of example logic associated with a compressed domain processor according to some implementations.
Figure 17:
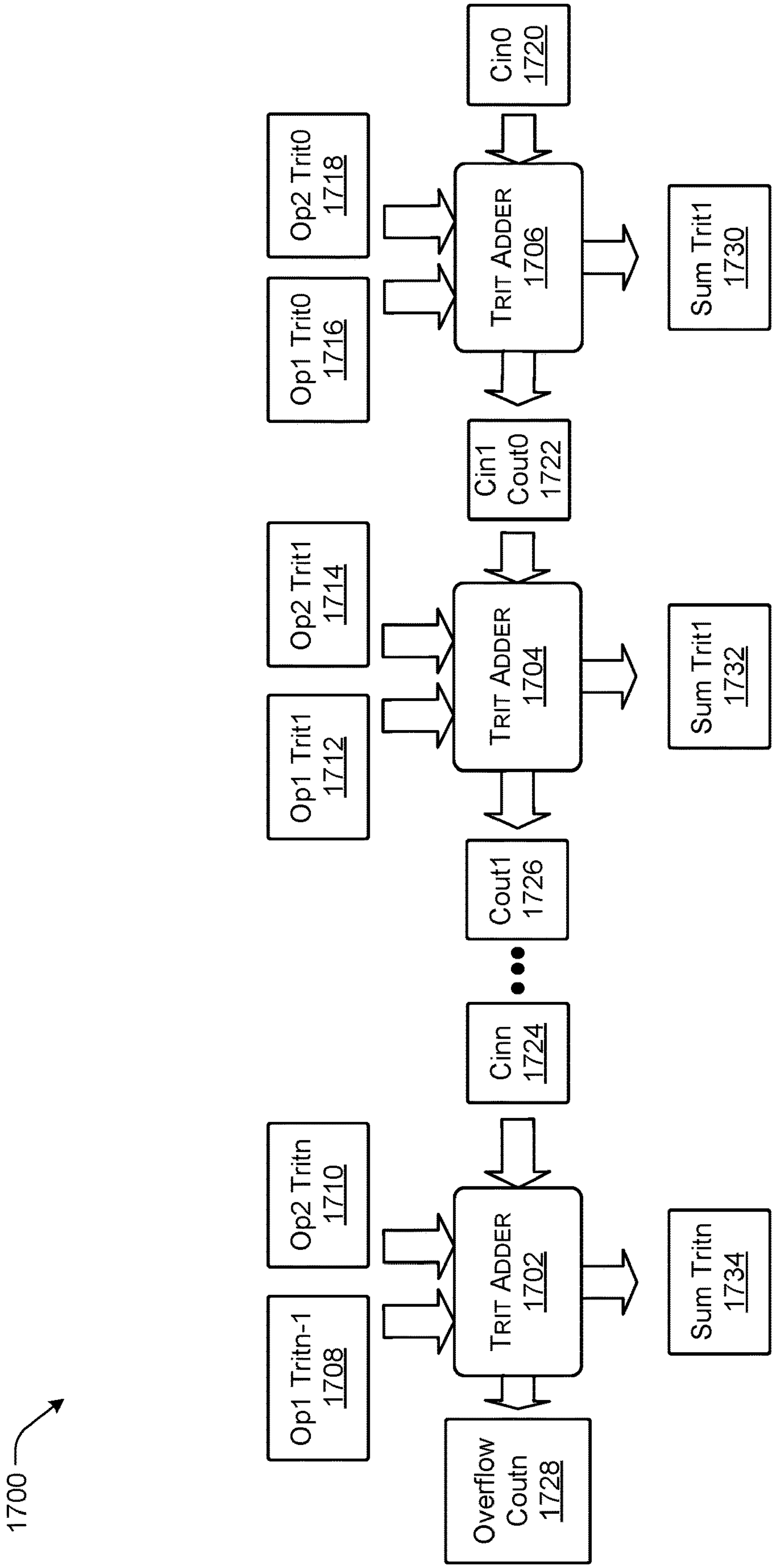
FIG. 17 illustrates a block diagram showing select components of example logic associated with an operation-execution-system of a compressed domain processor according to some implementations.
Figure 18:
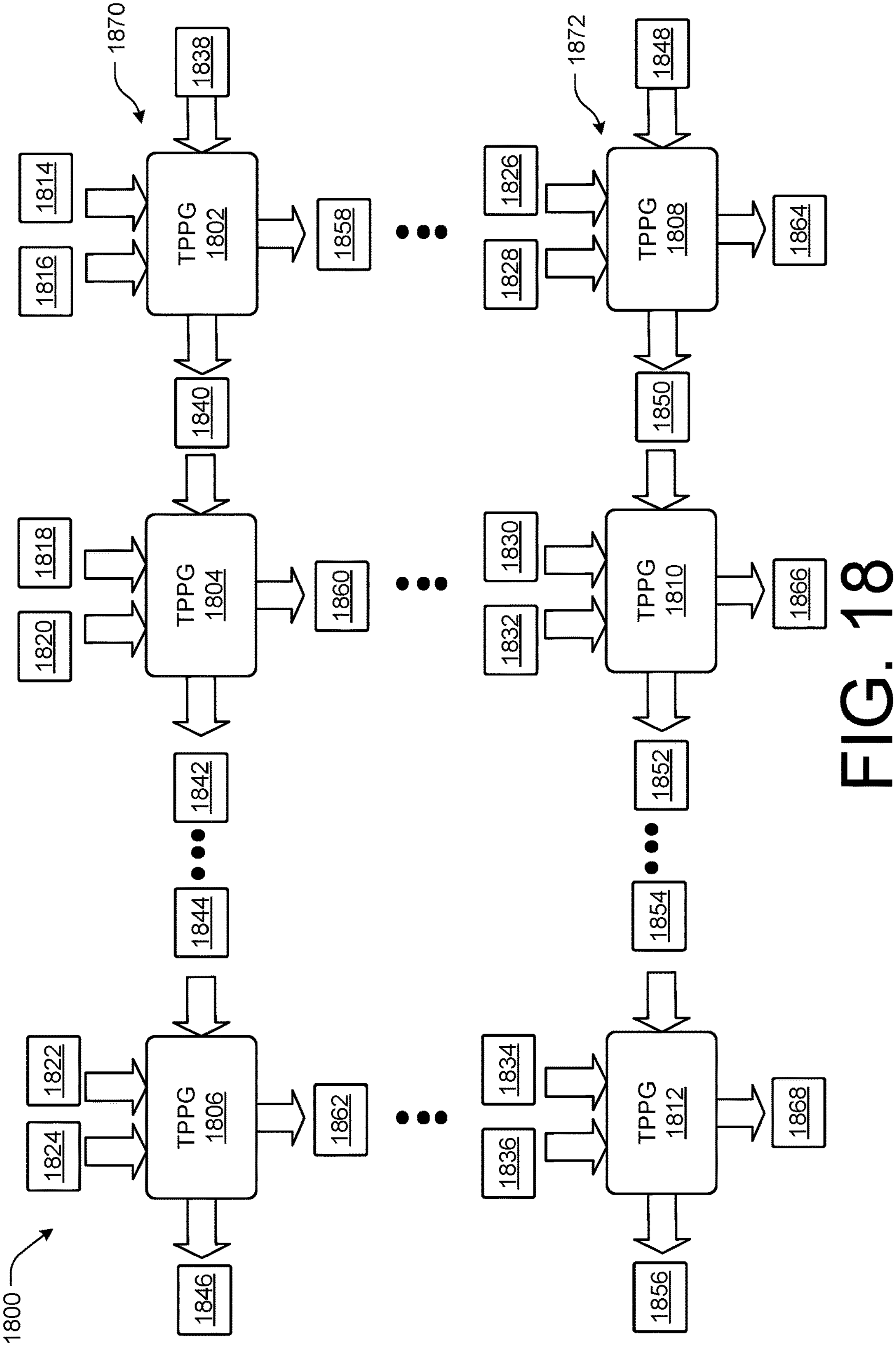
FIG. 18 illustrates a block diagram showing select components of an example logic associated with an operation-execution-system of a compressed domain processor according to some implementations.

FIGS. 16, 17 and 18 illustrate examples of logic associated with a compressed domain processor using the Ternary comma code compression method (referred to herein as comma-3). The illustrated, compressed domain processors are configured to operate on trits. As discussed herein, a trit is the basic unit in a ternary number representation system. The ternary number representation system represents integers in radix-3, where under the radix-3 notation a digit is referred to as a trit. However, it should be understood that other forms the ternary number representation system may use other comma code compression methods, using other radices, such as 7, 15, etc. It should be further noted that variations of the comma code, which differ in implementation details, such the representation of '0', exist and their implementation in a compressed domain process is similar to the embodiment described here.

Under the binary representation of trits, each trit is represented by two binary bits: 0≡'00', 1≡'01', 2≡'10'. Under this representation, '11' denotes a comma (denoted as c≡'11'). The comma represents the boundaries between integers encoded in the comma encoding method. In the comma-3 encoding method, E(i) has the form: $\langle t_{i,n-1}, \ldots, t_{i,1}, t_{i,0}, 11\rangle$ where $t_{i,k}$ is the 2-bit binary representation of trit k in the n-trits ternary representation of the integer i.

In the comma-3 implementation of the compressed domain processor, the pre-arrangement-system passes the encoded operands, aligned to the right, to the operation-execution-system after removing the comma from the right end of the encoded representation. The operation-execution-system is a specialized system dedicated to performing operation on trits. The result is provided to the post-arrangement-system and this system attaches a comma symbol at the right end of the encoding to conform to the encoding method. Additionally, in one example, if m=n=22, (i.e., the smallest radix-3 integer that is greater than the maximal unsigned thirty-two-bit integer) the resulting sum may be of up to twenty-two trits or forty-four bits (each trit is represented by two bits) without causing an overflow, or forty-six bits including the comma symbol.

Prior to attaching the comma, the post-arrangement-system ensures that the result can be represented within the system limitations of the encoding scheme, for example not exceeding the maximum value that the system implementation allows to be represented. It should be understood that in some embodiments other radices, such as radix-7 can be used for comma encoding, e.g. comma-7 with similar implementations.

FIG. 16 illustrates a block diagram showing select components of example single trit adder 1600 associated with a compressed domain processor for preforming addition on compressed integers according to some implementations. For example, the adder 1600 may be constructed for the addition of two trit-operands. The adder 1600 may receive two trit-operands under a binary representation of two-bit pairs, '00', '01', or '10', for each trit generally indicated by 1602 and 1604, respectively. The adder 1600 may also receive, as an input, a carry-in ($C_{in}$) 1606, for instance, from a previous level. The 1-trit adder 1600 adds the operands in the form of the trit 1602, the trit 1604, and the $C_{in}$ 1606 (where the $C_{in}$ is represented by one bit) returning the trit value 1608 of the sum as binary represented trit and provides a trit-carry-out ($C_{out}$) 1610 represented by one bit if the decimal value of the sum is, for instance, 3, 4 or 5. Table 1 shows the truth table for the adder operation. In Table 1 below, the left most column depicts the operation in decimal notation, the rest of the columns provide the bit representation of the input and output trits.

TABLE 1

The Truth Table of the 1-Trit Adder.

| $C_{in}$ + $OP_2$ + $OP_1$ | $C_{in}$ | $OP_2$ | $OP_1$ | $C_{out}$ | Sum |
|---|---|---|---|---|---|
| 0 + 0 + 0 = 0 | 0 | 00 | 00 | 0 | 00 |
| 0 + 0 + 1 = 1 | 0 | 00 | 01 | 0 | 01 |
| 0 + 0 + 2 = 2 | 0 | 00 | 10 | 0 | 10 |
| 0 + 1 + 0 = 1 | 0 | 01 | 00 | 0 | 01 |
| 0 + 1 + 1 = 2 | 0 | 01 | 01 | 0 | 10 |
| 0 + 1 + 2 = 3 | 0 | 01 | 10 | 1 | 00 |
| 0 + 2 + 0 = 2 | 0 | 10 | 00 | 0 | 10 |
| 0 + 2 + 1 = 3 | 0 | 10 | 01 | 1 | 00 |
| 0 + 2 + 2 = 4 | 0 | 10 | 10 | 1 | 01 |
| 1 + 0 + 0 = 1 | 1 | 00 | 00 | 0 | 01 |
| 1 + 0 + 1 = 2 | 1 | 00 | 01 | 0 | 10 |
| 1 + 0 + 2 = 3 | 1 | 00 | 10 | 1 | 00 |
| 1 + 1 + 0 = 2 | 1 | 01 | 00 | 0 | 10 |
| 1 + 1 + 1 = 3 | 1 | 01 | 01 | 1 | 00 |
| 1 + 1 + 2 = 4 | 1 | 01 | 10 | 1 | 01 |
| 1 + 2 + 0 = 3 | 1 | 10 | 00 | 1 | 00 |
| 1 + 2 + 1 = 4 | 1 | 10 | 01 | 1 | 01 |
| 1 + 2 + 2 = 5 | 1 | 10 | 10 | 1 | 10 |

The Comma code can, in some cases, be extended to include signed number representation, e.g., by adding a sign bit or a sign trit. In these cases, it should be understood that subtraction may be implemented in a way that is similar to the addition described above, where a borrow may replace the carry. However, in the instance of subtraction, the value of the borrow in the subtraction table entries are not the same as the values of the carry in the addition table entries above. Alternatively, 2's or 3's complements can be considered.

Additionally, in a similar fashion, one can construct the table for a single trit multiplier and a single trit divider FIG. 17 illustrates a block diagram showing select components of example logic associated with an operation-execution-system of a compressed domain processor 1700 for preforming addition on comma-3 compressed integers using multiple single trit adders, as discussed herein and, according to some implementations. For instance, let $E(i)=\langle t_{i,n-1}, \ldots, t_{i,1}, t_{i,0}, 11\rangle$, $E(j)=\langle t_{j,m-1}, \ldots, t_{j,1}, t_{j,0}, 11\rangle$, and $l=i+j$ where i and j are compressed using comma-3 encoding. Furthermore, in some instances, $j\leq i$. In these instances, $m\leq n$ and depending on the carry of the most significant trit of the trit-addition performed by the compressed domain processor 1700, the result, E(l), is either $\langle t_{l,n-1}, \ldots, t_{l,1}, t_{l,0}, 11\rangle$ or $\langle t_{l,n}, t_{l,n-1}, \ldots, t_{l,1}, t_{l,0}, 11\rangle$.

In this example, the compressed domain processor 1700 may perform addition operations on compressed numbers using a plurality of 1-trit trit-adders 1702, 1704, and 1706 in a manner defined by Table 1 above. In some cases, a carry propagation (or carry ripple) addition and/or serial adder may be used as a component of the compressed domain processor 1700. For example, each of the trit adders 1702-1706 may receive two trits 1708-1718 in pairs, as discussed above, and carry-in, $C_{in}$,generally indicated by 1720-1724. Each of the trit adders 1702-1706 may output a carry out, $C_{out}$, generally indicated by 1722, 1726, and 1728 as well as a sum trit, generally indicated by 1730-1734. The sum trits 1730-1734 may be combined to generate the output integer in the compressed domain. It should be noted, that in the illustrated example the carry 1728 may be used as an overflow flag.

For instance, in some cases, the compressed domain processor 1700 may use 22 trits to represent 32-bit integers in trits. Thus, in one specific example, the compressed domain processor 1700 may perform add operations on integers represented by 22 trits and may include the setting $\langle C_{out,0}, t_{l,0}\rangle=t_{i,0}+t_{j,0}+0$, $\langle C_{out,1}, t_{l,1}\rangle=t_{i,1}+t_{j,1}+C_{out,0}$ . . . $\langle C_{out,n}, t_{l,n-1}\rangle=t_{i,n-1}+t_{j,n-1}+C_{out,n-2}$ . . . $\langle C_{out,21}, t_{l,21}\rangle=t_{i,21}+t_{j,21}+C_{out,20}$ and in this case over flow=$C_{out,21}$. Once the values for Coutn−1 and t1,n are determined, the compressed domain processor 1700 may check for an overflow (or a value larger than the integer scheme that the compressed domain processor 1700, can handle). If an overflow has not occurred, the compressed domain processor 1700 may append '11' at the right end and discard leading zero-value trits ('00' pairs) by shifting the pairs to the left and the resulting compressed integer (not shown) has n or n+1 trits and 2×(n+1) or 2×(n+2) bits including the comma symbol. Thus, the resulting compressed integer 1 may be represented as $E(l)=\langle t_{l,n-1}, \ldots, t_{i,1}, t_{l,0}, 11\rangle$ or $\langle t_{l,n}, t_{l,n-1}, \ldots, t_{l,1}, t_{l,0}, 11\rangle$. Note that the provided example is a carry ripple example. In other embodiments, the n-trit adder can use carry look ahead or other methods that accelerate the process of trit addition.

Table 2 shows the truth table for a binary represented 1-trit-parial-product-generator (TPPG) operation that may be used in a high throughput hardware implementation of a base-3 multiplier. The left most column depicts the operation in decimal notation, the rest of the columns provide the bit representation of the input and output trits.

TABLE 2

The Truth Table of the 1-Trit TPPG

| $C_{in}$ + $OP_2$ × $OP_1$ | $C_{in}$ | $OP_2$ | $OP_1$ | $C_{out}$ | Sum |
|---|---|---|---|---|---|
| 0 + 0 × 0 = 0 | 0 | 00 | 00 | 0 | 00 |
| 0 + 0 × 1 = 0 | 0 | 00 | 01 | 0 | 00 |
| 0 + 0 × 2 = 0 | 0 | 00 | 10 | 0 | 00 |
| 0 + 1 × 0 = 0 | 0 | 01 | 00 | 0 | 00 |
| 0 + 1 × 1 = 1 | 0 | 01 | 01 | 0 | 01 |
| 0 + 1 × 2 = 2 | 0 | 01 | 10 | 0 | 10 |
| 0 + 2 × 0 = 0 | 0 | 10 | 00 | 0 | 00 |
| 0 + 2 × 1 = 2 | 0 | 10 | 01 | 0 | 10 |
| 0 + 2 × 2 = 4 | 0 | 10 | 10 | 1 | 01 |
| 1 + 0 × 0 = 1 | 1 | 00 | 00 | 0 | 01 |
| 1 + 0 × 1 = 1 | 1 | 00 | 01 | 0 | 01 |
| 1 + 0 × 2 = 1 | 1 | 00 | 10 | 0 | 01 |
| 1 + 1 × 0 = 1 | 1 | 01 | 00 | 0 | 01 |
| 1 + 1 × 1 = 2 | 1 | 01 | 01 | 0 | 10 |
| 1 + 1 × 2 = 3 | 1 | 01 | 10 | 1 | 00 |
| 1 + 2 × 0 = 0 | 1 | 10 | 00 | 0 | 00 |
| 1 + 2 × 1 = 3 | 1 | 10 | 01 | 1 | 00 |
| 1 + 2 × 2 = 5 | 1 | 10 | 10 | 1 | 10 |

FIG. 18 illustrates a block diagram showing select components of example logic associated with the operation-execution-system of a compressed domain processor 1800 for preforming multiplication on compressed integers according to some implementations. In the current example, each of a multiple TPPG, generally indicated by 1802-1812, receives as inputs two trits operands, generally indicated by 1814-1856, in the binary representation, '00', '01', or '1'0, as pairs, and a single bit carry-in ($C_{in}$), generally indicated by 1838-1856, from a previous level. Each of the trit-TPPGs 1802-1812 multiplies the corresponding operands 1814-1836 and adds the corresponding binary represented trits $C_{in}$ 1838-1856. Each of the trit-multipliers 1802-1812 returns a value of the product as a binary represented trit, generally indicated by 1858-1868, and provides a trit-carry-out ($C_{out}$) represented by one bit, generally indicated by 1838-1856. In one example, each level of TPPGs (e.g., level 1870 composed of units 1802-1806, and level 1872 composed of units 1808-1812) may generate the result of multiplying each of the multiplicand trits by a single trit of the multiplier.

In one specific example, using a dedicated adder, the compressed domain processor 1800 may add the corresponding partial results generated at each level to obtain the actual multiplication result.

In some cases, the above operations may be implemented by a ripple addition of the partial-products and partial level-results via propagation of intermediate carry outs from the TPPGs and their sums. Alternatively carry look ahead mechanisms can be implemented. Following the completion of the above operations for each trit by the operation-execution-system, the post-arrangement-system may append '11' at the right end and discard leading zero pairs by shifting to the left. Thus, if there is no overflow (see below) then the final product has n+m or n+m−1 trits, resulting in 2×(n+m+1) or 2×(n+m) bits including the ending comma symbol for a comma code compression scheme and the compressed integer may be represented as $E(l)=\langle t_{l,n+m-1}, \ldots, t_{l,1}, t_{l,0}, 11\rangle$ or $\langle t_{l,n+m-2}, \ldots, t_{l,1}, t_{l,0}, 11\rangle$. If the number of bits of the final product exceed the designed limits of the system, an overflow flag (not shown) may be set. It should be understood that other multiplier acceleration techniques may be used to improve performance. Alternatively, a hardware shift and add algorithm can be applied for the multiplication, resulting in a less complex hardware at the price of reduced throughput.

In the current example, Let $E(i)=\langle t_{i,n-1}, \ldots, t_{i,1}, t_{i,0}, 11\rangle$, $E(j)=\langle t_{j,m-1}, \ldots, t_{j,1}, t_{j,0}, 11\rangle$, and $l=i\times j$. Thus, $E(l)=\langle t_{l,n+m-2}, \ldots, t_{l,1}, t_{l,0}, 11\rangle$ depending on the carry of the most or $E(l)=\langle t_{l,n+m-1}, \ldots, t_{l,1}, t_{l,0}, 11\rangle$ depending on the carry of the most significant bit of the trit multiplication result. Furthermore, in some cases, $j\leq i$. In these cases, $m\leq n$. Additionally, in one example, if m=n=22, the resulting product may be of up to '44' trits or '88' bits, or '90' bits including the comma symbol of the comma code.

It should be understood that additional operations such as division and modulo may be implemented. Further-more trit-wise operations can be performed on the trit (e.g., using Godel, Lukashevich, or other multi-value logic operations). This trit-operations might be used for operations in the trit-domain (e.g., encryption), but they do not necessarily keep the properties of bit-wise operations upon decompression of the results by consequent units.

Figure 19:
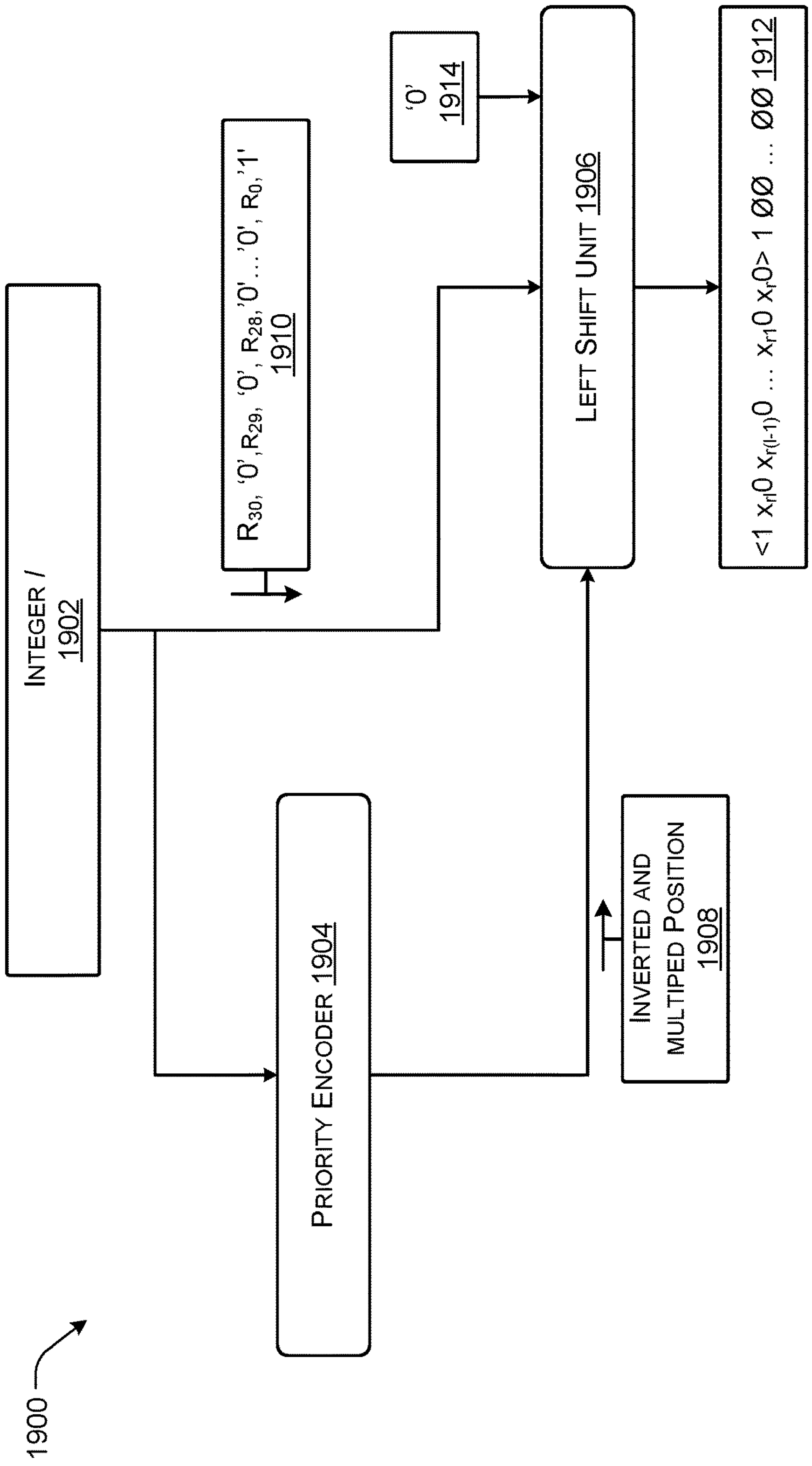
FIG. 19 illustrates a block diagram showing select components of example logic associated with a compression system according to some implementations
Figure 20:
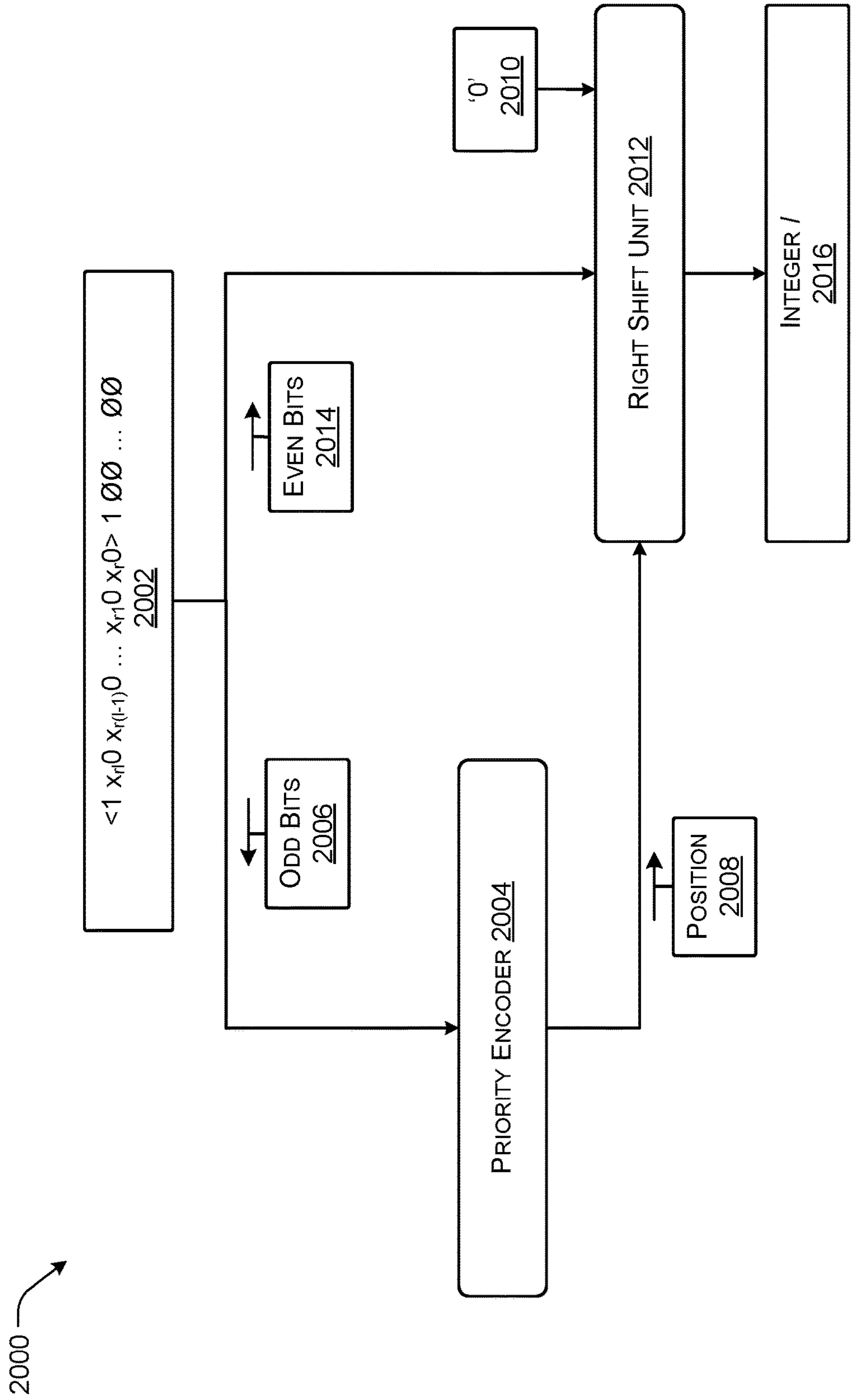
FIG. 20 illustrates a block diagram showing select components of example logic associated with a decompression system according to some implementations.

FIGS. 19 and 20 illustrate examples of logic associated with a compression system 1900 and a decompression system 2000 using the In-Between compression method. The In-Between method represents positive integers greater than 1 using only the leading one of the integer and all the bits to the right of the leading one and inserts a zero-bit between each of the integer's bits following the leading one.

An integer i>1 may be represented in binary as (i), such that $\beta(i)=\langle 1, x_{n-2}, x_{n-3}, \ldots x_1, x_0\rangle$ (where, '$x_k$' denotes either a bit of '0' or a bit of '1'). To obtain the compressed representation, E(i), bits of '0' are introduced between the bits $(x_{n-2}, x_{n-3}, \ldots x_1, x_0)$. Hence, E(i) has the form: $\langle 1, x_{n-2}, x_{n-3}, \ldots x_1, x_0\rangle$. In the same way, assuming that the binary representation of j is $\beta(j)=\langle 1, y_{m-2}, y_{m-3}, \ldots y_1, y_0\rangle$ then E(j), the In-Between representation of the integer j, has the $\langle 1, y_{m-2}, 0, y_{n-3}, 0, \ldots y_1, 0, y_0\rangle$, (where '$y_i$' denotes either a bit of '0' ora bit of '1').

In other words, in the In-Between encoding discussed herein, excluding the leading one (or left most bit having a value of '1') of $\beta(i)$, a '0' may be inserted between every two consecutive bits of $\beta(i)$. It should be noted that variations of the In-Between method, which differ in the way that bits with a value of '0' are inserted between the bits of $\beta(i)$, exist and their implementation in compression and decompression engines, as well as their implementation in a compressed domain processor, is similar to the embodiment described here.

For example, if the In-Between compression component receive the value of '9' having a fixed length code binary representation in 32 bits of '00000000000000000000000000001001', then, the compression component may generate the representation, E(9), as (100001) or '100001'. This is explained as follows. In the thirty-two-bit representation of '9' the LO is in position three. The leading zeros up to position 4 are discarded, the LO is removed and then a bit of '0' is inserted between every two consecutive bits of the frustum '001', yielding the value '00001'. Finally, the leading bit of '1' is prepended to the value '00001' to obtain '100001'. The decoder accepts '100001', removes every bit of '0' that resides in an odd location and obtains '1001'.

The in-between code is uniquely decodable. This is demonstrated as follows. Each code word is terminated by the bits $< \ldots x_{2n}x_{2n-1} = \ldots 00>$ or by the bits $< \ldots x_{2n}x_{2n-1} = \ldots 01>$. Where $x_i$ is the code bit of integer 'x' at position i. Taking into account the code of the next integer, say y, that has to start with a bit of '1', the systems 1900 and 2000 have two possible combinations: $< \ldots x_{2n}x_{2n-1}y_m \ldots >$=' . . . 001 . . . ' or $< \ldots x_{2n}x_{2n-1}y_m \ldots >$=' . . . 011 . . . ' In both cases, the systems 1900 and 2000 may observe a bit of '1' in an even place and this denotes the starting point of the code of the next integer (y). In other words, a bit of '1' in an even place denotes the first bit of the next code word.

In the illustrated examples, the compression system 1900 and decompression system 2000 may be configured to compress and decompress thirty-two-bit integers. However, it should be understood that different bit lengths may be represented using the In-Between compression method. In one specific example, the size of a compressed representation of a thirty-two-bit fixed length code integers using the In-Between coding may vary and may be up to 62 bits e.g., ⟨1101010 10101010 10101010 10101010 10101010 10101010 10101010 1010101⟩ representing the integer 4,294,967,295 or '1111 1111 1111 1111 1111 1111 1111 1111'. Hence, eight bytes (64 bits) of encoded data from the beginning of an encoded integer may contain at least one integer represented by up to 62 bits. Additionally, except for the last integer in a series of encoded integers, the 64 bits may include the first 2-bits of the subsequent integer, where the two bits have the form '10' or the form '11'.

Under the example schema the code for the integer 1 requires special attention as its coding cannot follow the algorithm provided here. Other, similar, variants of In-Between, some of which can represent the integer 1, exist and their implementation in compression and decompression engines, as well as their implementation in a compressed domain processor, is similar to the embodiment described here. Alternatively, the value of 1 can be represented by the code of 2, the value of 2 by the code of 3 and so on for the entire set of positive integers including 1. Additionally, the In-Between code may be extended to include signed number representation. For example, a sign bit may be attached to the code to denote the polarity of a number. Alternatively, methods such as radix-complement and mapping of positive integers to a subset of the integers (e.g., the odd integers) and negative integer to a second, mutually exclusive subset, (with respect to the first subset), such as the even integers may be used.

FIG. 19 illustrates an example compression system 1900 according to some implementations. The compression system 1900 receives the integer l 1902 at a thirty-two-bit priority encoder 1904 and stores the '0' interleaved and appended by '1' value $\langle r_{30}, 0, r_{29}, 0, r_{28}, \ldots r_1, 0, r_0, 1\rangle$ 1910 in a left shi unit 1906. The priority encoder 1904 and the left shifter 1906 process the integer l 1902 and its interleaved version in order to obtain the In-Between representation of the integer (e.g., E(l)). For example, the left shifter 1906 may append a bit of '1' to $r_{30}, r_{29}, \ldots r_1, r_0$ (obtaining $r_{30}, r_{29}, r_{28}, \ldots, r_1, r_0, 1$), and interlace bits of '0' between the bits $r_{30}, r_{29}, r_{28}, \ldots, r_1, r_0$ (obtaining $\langle r_{30}, 0, r_{29}, 0, r_{28}, \ldots r_1, 0, r_0, 1\rangle$). At substantially the same time, the thirty-two-bit priority encoder 1904 determines the position of the leading one in the integer l 1902. This position is inverted, via the one's complement operation, and multiplied by two, via a shift left by one operation; resulting in values between '0' and '62'. The result 1908 represents the number of left shift that the left shifter 1906 (e.g., a left barrel shifter) performs to shift $\langle r_{30}, 0, r_{29}, 0, r_{28}, 0, r_0, 1\rangle$1910. This operation ensures that the most significant bit of the shifter 1906 is the most significant bit that follows the leading one of the integer l 1902. The compression system 1900 also concatenates a bit of '1' to the left of the result of the left shift unit 1906 to restitute the most significant bit and a bit of '0' 1914 to the right of the least significant bit to produce a sixty-four-bit representation 1912 including the integer l stored in a register.

Finally, in order to support the pack unit described below, the compression system 1900 uses the value of the inverted and multiplied signal 1908 to compute the number of bits used for encoding the input integer, and outputs this value. The computation may involve a look up table and may be done by the unit 1916 providing as output the number of bits signal 1918, which denotes the number of bits used for encoding.

FIG. 20 illustrates an example decompression system 2000 according to some implementations. In the illustrated example, an encoder register 2002 receives a sixty-four-bit value that contains an integer E(l) that is aligned to the left of the register. Hence, the leading one, residing in bit 63 of the operand register is the leftmost bit. In this example, the 63rd bit and all the even numbered bits up-to and including bit 2 of the 64-bit operand register are referred to as the "even bits" (bit zero may belongs to the next encoded integer). The odd numbered bits 61 to 1, are referred to as the "odd bits."

In the current example, the decompression system 2000 includes one thirty-one-bit priority encoder 2004. The thirty-one-bit priority encoder 2004 receive the odd numbered bits 61 to 1 (e.g., the odds bits 2006 associated with the encoded integer stored in the input register 2002). The thirty-one-bit priority encoder 2004 determines a position 2008 of the first bit having a value of '1'. In the compressed representation, the odd bits 2006 are all bits with values of '0' except for leading-one bits of subsequent integers that may reside inside the input register, which are the only odd bits having a value of '1'. Hence, the position 2008 of the first bit of '1' of the bits detected by the priority encoder 2004 is the positions of the least significant bits of the encoded integer 2002 to be decompress. Hence, the output of the thirty-one-bit priority encoder 2004 may be a position 2008 of the least significant bit of the encoded integer. The position 2008 may have value between '30' and '0'. The position 2008 as well as a '0' bit, indicated by 2010, are provided to a thirty-two-bit right shifter 2012. The position 2008 may, thus, act as a control input to the thirty-two-bit right shifter 2012 and indicate a number of right shifts required to shift the even bits 2014 of the input registers to receive a right aligned 32 bit binary representation of the integer l 2016.

The In-Between code may be extended to include signed number representation. In this case, subtraction may be implemented in a way that is similar to the addition described above. Furthermore, Multiplication, division, and Modulo operations follow a similar pattern to the design pattern of the In-Between adder.

In another compression system, integers may be encoded using the 1210 method and decoded using the 1021 method. This system may convert some input bits of '1' into the pair '10' in the encoder, and some bits of '10' are converted into '1' in the decoder. In the encoding, the system may operate on a 32-bit integer and identify the location of the LO. Next, the system may start from the LO, prepend a '1' to the LO (this serves as a comma) and, excluding the comma, the LO, and the LSB, convert every bit of '1' to the bits '10'. In the decoding, excluding the comma and LSB, the system may convert every occurrence of the bits '10' to the bit '1'. In one particular example, the system may process groups of 4 bits according to Tables 4, 5, and 6 below. In one particular example, the system may process these groups of 4 bits in parallel or in a pipelined fashion. It should be noted that the first group and the last group are unique, the intermediate groups are identical. Additionally, it should be noted that other group sizes may be considered. The first group 4 bits is processed according to Table 4.

TABLE 4

| Input Bits | Output Bits | Number of bits | Comment |
|---|---|---|---|
| 0000 | none | 0 | *Remove leading zeros (LZ) |
| 0001 | 11 | 2 | Ignore leading zeros |
| 0010 | 110 | 3 | Ignore leading zeros |
| 0011 | 1110 | 4 | Ignore leading zeros |
| 0100 | 1100 | 4 | Ignore leading zeros |
| 0101 | 11010 | 5 | Ignore leading zeros |
| 0110 | 11100 | 5 | Ignore leading zeros |
| 0111 | 111010 | 6 | Ignore leading zeros |
| 1000 | 11000 | 5 | |
| 1001 | 110010 | 6 | |
| 1010 | 110100 | 6 | |
| 1011 | 1101010 | 7 | |
| 1100 | 111000 | 6 | |
| 1101 | 1110010 | 7 | |
| 1110 | 1110100 | 7 | |
| 1111 | 11101010 | 8 | |

*Note that the step of removing 0000 continues until we reach the first non-zero nibble and then we go back to this table Each intermediate group of 4 bits is processed according to Table 5.

TABLE 5

| Input Bits | Output Bits | Number of bits |
|---|---|---|
| 0000 | 0000 | 4 |
| 0001 | 00010 | 5 |
| 0010 | 00100 | 5 |
| 0011 | 001010 | 6 |
| 0100 | 01000 | 5 |
| 0101 | 010010 | 6 |
| 0110 | 010100 | 6 |
| 0111 | 0101010 | 7 |
| 1000 | 10000 | 5 |
| 1001 | 100010 | 6 |
| 1010 | 100100 | 6 |
| 1011 | 1001010 | 7 |
| 1100 | 101000 | 6 |
| 1101 | 1010010 | 7 |
| 1110 | 1010100 | 7 |
| 1111 | 10101010 | 8 |

Additionally, the last four bits is processed according to Table 6.

TABLE 6

| Input Bits | Output Bits | Number of bits |
|---|---|---|
| 0000 | 0000 | 4 |
| 0001 | 0001 | 4 |
| 0010 | 00100 | 5 |
| 0011 | 00101 | 5 |
| 0100 | 01000 | 5 |
| 0101 | 01001 | 5 |
| 0110 | 010100 | 6 |
| 0111 | 010101 | 6 |
| 1000 | 10000 | 5 |
| 1001 | 10001 | 5 |
| 1010 | 100100 | 6 |
| 1011 | 100101 | 6 |
| 1100 | 101000 | 6 |
| 1101 | 101001 | 6 |
| 1110 | 1010100 | 7 |
| 1111 | 1010101 | 7 |

After applying the tables, the system may have "strings" which may be concatenated, for instance, using barrel shifters. In the following examples the system processes 16 bit in 4 groups of 4 bits (the number in parenthesis denote number of bits produced, which is effectively the value needed in the barrel shifter):

1001 1111 0101 1011→1100010(7)||10101010(8)||010010 (6)||100101(6) 0000 0000 0001 1001→0001 1001→11 (2)||10001(5) 0000 0010 0001 0011→0010 0001 0011→110 (3)||00010 (5)||00101(5)

The decoder removes the comma and convert every combination occurrence of the bits '10' to the bit '1'. The decoder may operate on groups of n-bits in a way that implements the inverse operation of tables 4, 5, and 6. In this case, if group k ends with a bit of '0', then the decoder can make an immediate decoding of the group via the 1021 tables. However, if group k ends with a bit of '1', and the group is not the last group, then the next group must start with a bit of '0'. The decoder can decode the implied n+1 bits and operate on the next n-bits in the same fashion.

Figure 21:
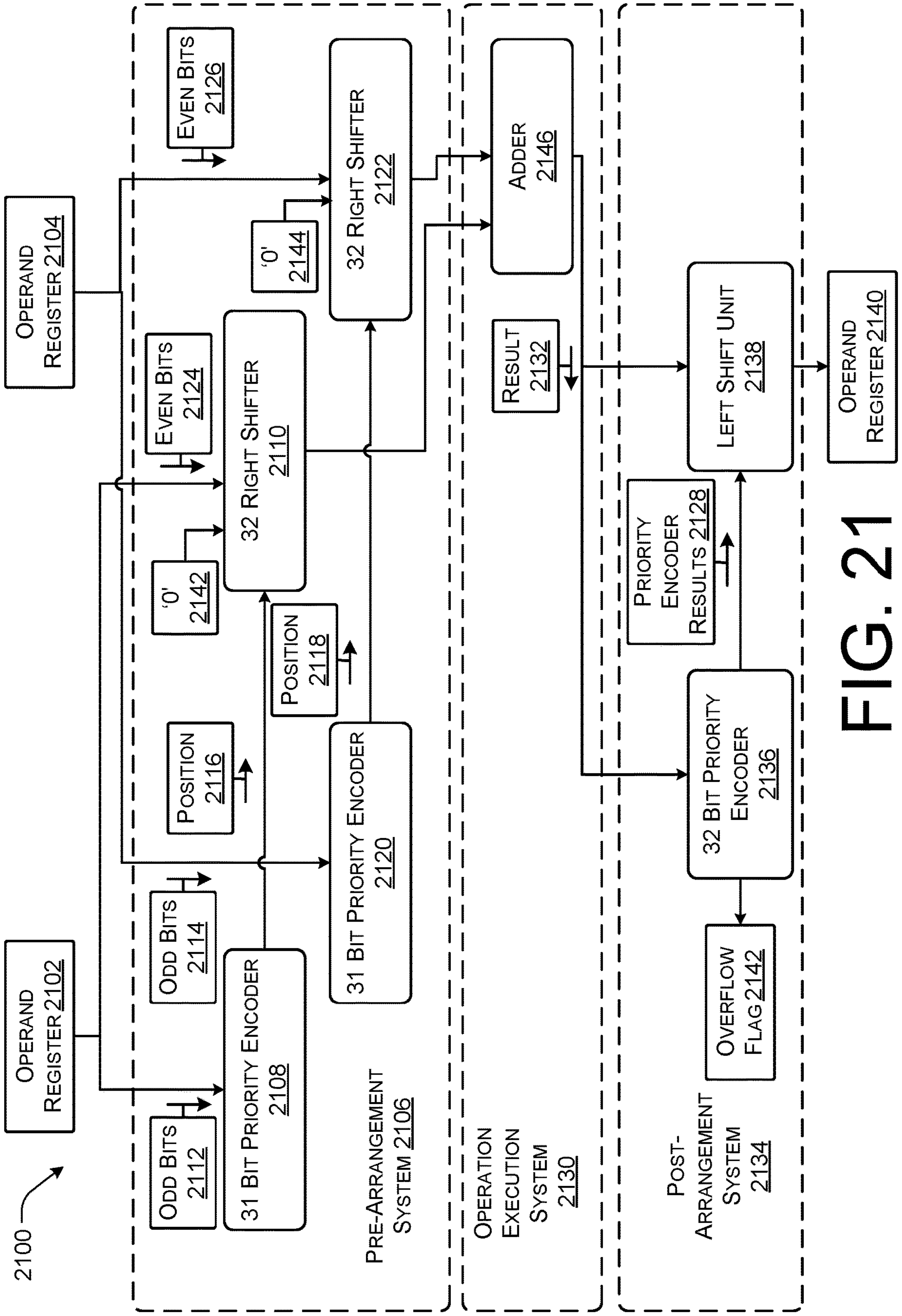
FIG. 21 illustrates a block diagram showing select components of example logic associated with a compressed domain processor according to some implementations.

FIG. 21 illustrates examples of logic associated with a compressed domain processor 2100 using the in-Between compression method discussed herein. The in-Between method represents integers using only the leading one of the integer and all the bits to the right of the leading one and inserts a zero-bit between each of the integer's bits following the leading one.

In the in-between coding, an integer, such as i, may be represented in binary as β(i), such that $\beta(i)=\langle 1, x_{n-2}, x_{n-3}, \ldots x_1, x_0\rangle$ (where, '$x_k$' denotes either a bit of '0' or a bit of '1'). To obtain the compressed representation, E(i), bits of '0' are introduced between the bits $\langle x_{n-2}, x_{n-3}, \ldots x_1, x_0\rangle$. Hence, E(i) has the form: $\langle 1, x_{n-2}, 0, x_{n-3}, 0, \ldots x_1, 0, x_0\rangle$. In the same way, assuming that the binary representation of j is $\beta(j)=\langle 1, y_{m-2}, y_{m-3}, \ldots, y_1, y_0\rangle$ then E(j), the in-between representation of the integer j, has the form $\langle 1, y_{m-2}, 0, y_{n-3}, 0, \ldots y_1, 0, y_0\rangle$, (where '$y_l$' denotes either a bit of '0' or a bit of '1').

In other words, in the in-between encoding discussed herein, excluding the leading one (or left most bit having a value of '1') of β(i), a '0' may be inserted between every two consecutive bits of β(i). It should be noted that variations of the in-between method, which differ in the way that bits with a value of '0' are inserted between the bits of β(i), exist and their implementation in a compressed domain process is similar to the embodiment described here.

In the current example the pre-arrangement-system 2106 filters out the valid data from each operand (e.g., removing the in-between zeros) to feed the valid data to the operation-execution-system 2130. In this example, the operation-execution-system 2130 performs an addition operation on the operands (in other embodiments it can multiply, divide, subtract, or execute bitwise operations). The post-arrangement-system 2134 receives the result from the operation-execution-system 2130 and adds additional information required to conform to the encoding method.

In the illustrated example, the compressed domain processor 2100 may be configured to perform parallel operations on the bits of thirty-two-bit integers. However, it should be understood that different bit lengths may be represented using the in-Between compression as well as processed by the compressed domain processor 2100. In one specific example, the size of a compressed representation of a thirty-two-bit fixed length code integers using the in-between coding may vary and can be up to 62 bits ⟨1101010 10101010 10101010 10101010 10101010 10101010 10101010 1010101⟩ representing the integer 4,294,967,295 or '1111 1111 1111 1111 1111 1111 1111 1111'. Hence, fetching eight bytes (64 bits) of encoded data from the beginning of an encoded integer results in at least one integer represented by up to 62 bits. Additionally, except for the last integer in a series of encoded integers, the 64 bits may include the first 2-bits of the subsequent integer, where the two bits have the form '10' or the form '11'.

In the illustrated example, the operand registers 2102 and 2104 are 64-bit registers and the compressed operands are aligned to the left of each register. Hence, the leading one, residing in bit 63 of the operand register is the leftmost bit. In this example, the 63rd bit and all the even numbered bits up-to and including bit 2 of the 64-bit operand register are referred to as the "even bits" (bit zero belongs to the next encoded integer). The odd numbered bits 61 to 1, are referred to as the "odd bits."

In the current example, a pre-arrangement-system 2106 includes two thirty-one-bit priority encoders 2108 and 2120. The thirty-one-bit priority encoder 2108 receive the odd numbered bits 61 to 1 e.g., the odds bits 2112 associated with the first operand stored in the operand register 2102 and the thirty-one-bit priority encoder 2120 receive the odd numbered bits 61 to 1, e.g., the odds bits 2114 associated with the second operand stored in the operand register 2104. Each of the thirty-one-bit priority encoders 2108 and 2120 determines a position of the first bit having a value of '1'. In the compressed representation, the odd bits 2112 and 2114 are all bits with values of '0' except for leading one bits of subsequent integers that reside inside the operand registers 2102 and 2104, which are the only bits having a value of '1'. Hence, the position of the first bit of '1' of the bits detected by the priority encoders 2108 and 2120 denote the positions of the least significant bits of the integers to be used as operands. Hence, the output of the thirty-one-bit priority encoders 2108 and 2120 may be a position 2116 and 2118 of the least significant bit of the respective operands. The position 2116 and/or 2118 may have value between '30' and '0'. The positions 2116 and 2118 as well as a '0' bit, respectively indicated by 2142 and 2144, are provided to the respective thirty-two-bit right shifter 2110 or 2122. The positions 2116 and 2118 may, thus, act as a control input to the thirty-two-bit right shifter 2110 or 2122 and indicate a number of right shifts required to shift the even bits 2124 and 2126 of the operand registers 2102 and 2104 to receive a right aligned representation.

The output of the thirty-two-bit right-shifters 2110 and 2122 may be provided to an adder 2146 of an operation-execution-system 2130 as the two operands to be added. In other examples, the operation-execution-system 2130 may include other components such as a multiplier, divider, subtractor, bitwi se operations unit, etc. The result 2132 of the addition may be provided to a post-arrangement-system 2134. In addition, the operation-execution-system may set an overflow flag 2148 when the result of the operation is an integer with a value larger than the system encoding scheme can handle.

The post-arrangement-system 2134 receives the result 2132 (e.g., r) of the execution-system 2130 at a thirty-two-bit priority encoder 2136 and a left shift unit 2138. The priority encoder 2136 and the left shifter 2138 process the result 2132 in order to obtain the in-between representation of the result (e.g., E(c)). For example, the left shifter 2138 may append a bit of '1' to $r_{30}, r_{29}, \ldots, r_1, r_0$ (obtaining $r_{30}, r_{29}, r_{28}, \ldots r_1, r_0, 1$), and interlace bits of '0' between the bits $r_{30}, r_{29}, r_{28}, \ldots r_1, r_0$ (obtaining $r_{30}, 0, r_{29}, 0, r_{28}, \ldots r_1, 0, r_0, 1$). At the same time, the thirty-two- bit priority encoder 2136 determines the position of the leading one in the result 2132. This position 2128 is inverted, via the one's complement operation, and multiplied by two, via a shift left by one operation; resulting in values between '0' and '62'. This result represents the number of left shift that the left shifter 2138 (e.g., a left barrel shifter) performs to shift $\langle r_{30}, 0, r_{29},$ $0, r_{28}, \ldots r_1, 0, r_0, 1\rangle$. This operation ensures that the most significant bit of the shifter 2138 is the most significant bit that follows the leading one of the result 2132. The post-arrangement-system 2134 also concatenates a bit of '1' to the left of result of the left shift unit 2138 to restitute the most significant bit and a bit of '0' to the right of the least significant bit to produce a sixty-four-bit result stored in a register 2140.

The in-between code can be extended to include signed number representation. In this case, subtraction may be implemented in a way that is similar to the addition described above. Furthermore, Multiplication, division, and Modulo operations follow a similar pattern to the design pattern of the In-Between adder.

Figure 22:
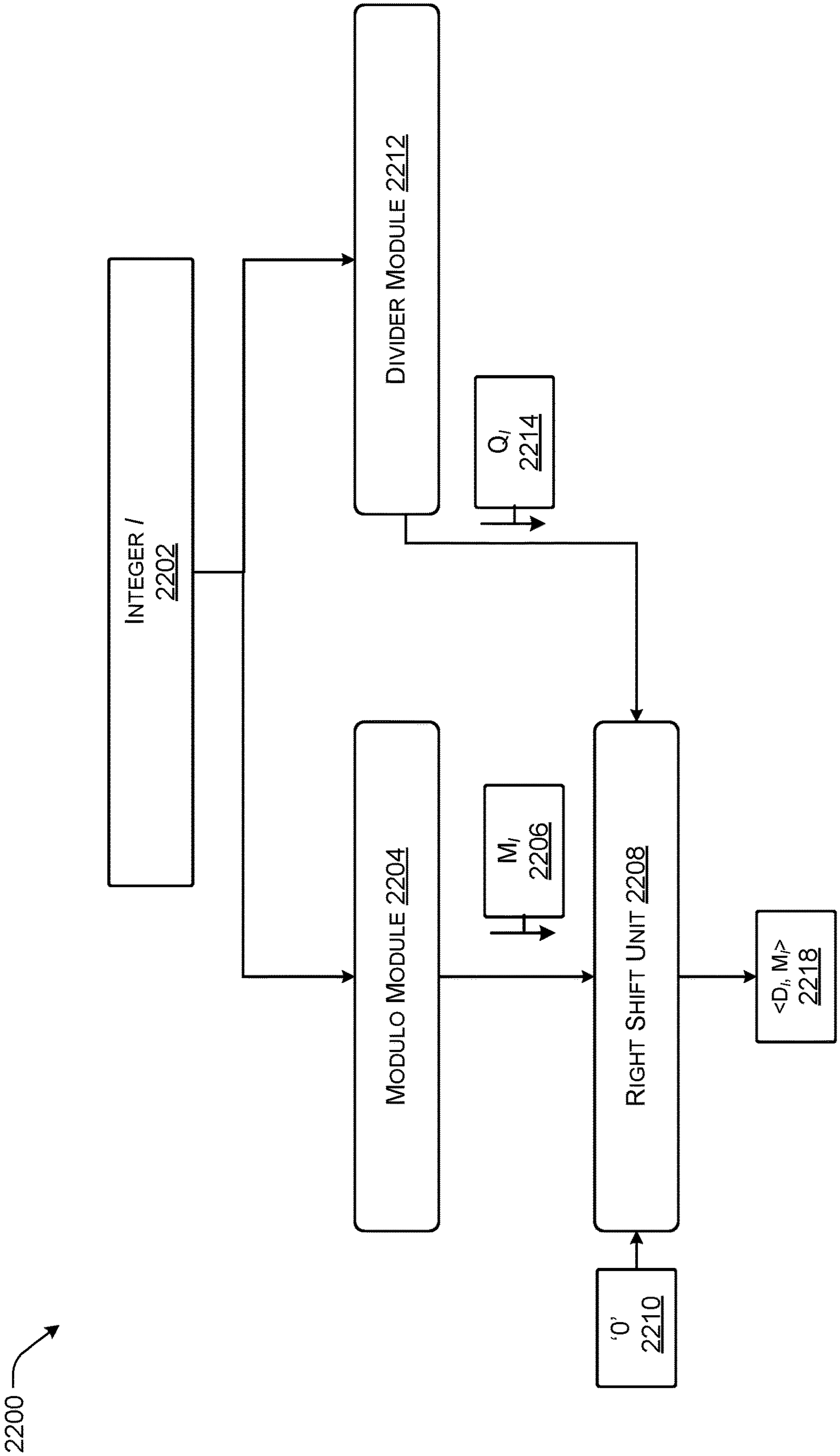
FIG. 22 illustrates a block diagram showing select components of example logic associated with a compression system according to some implementations.
Figure 23:
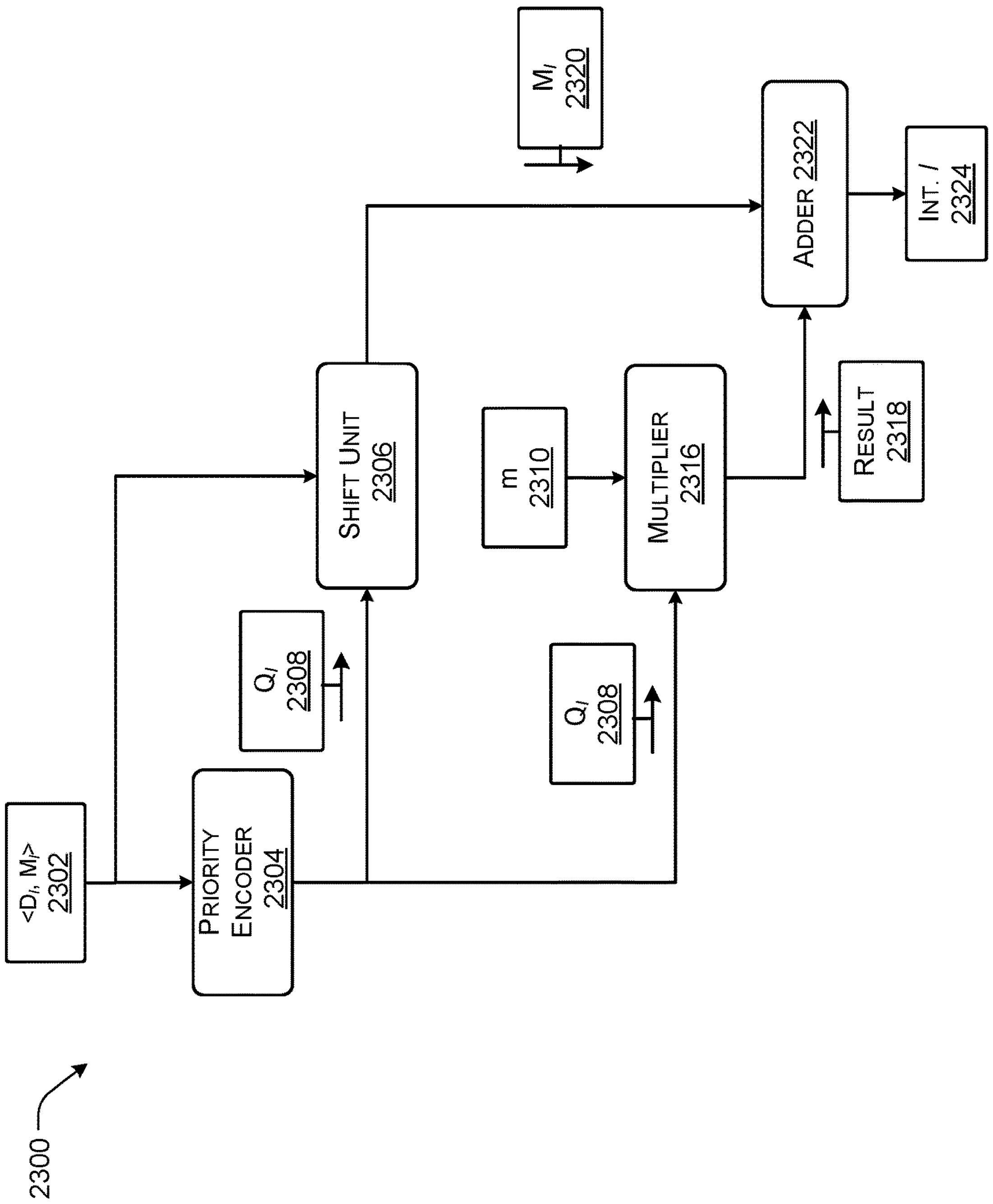
FIG. 23 illustrates a block diagram showing select components of example logic associated with a decompression system according to some implementations.

FIGS. 22 and FIG. 23 illustrate examples of logic associated with a compressed domain processor using the Golomb compression method with a parameter m. It should be noted that the Rice compression method is a special case of Golomb compression where m is a power of 2. Hence, this section provides the details of both Golomb-based compressed domain processor and Rice-based compressed domain processor. Furthermore, as shown below, the section provides sufficient details for the implementation of several extensions of the Golomb code.

In some embodiments of Golomb coding, the encode component is configured to receive non-negative integers (i.e., integers that are greater than or equal to zero) represented in thirty-two-bit fixed length code scheme (i.e., values of less than 4294967296). A thirty-two-bit integer/ may have a binary representation of $\beta_l$ with zero or more bits of '0' prepended to the left of $\beta_l$. Under Golomb coding, the integer l is represented as $E(l)=<D_l, M_l>$. In this case, $D_l$ is a uniquely decodable representation of the integer division quotient $$q = \frac{l}{m}$$

(where m is a given parameter) and $M_l$ is a uniquely decodable representation of r, the remainder of the integer division of $$\frac{l}{m}$$

That is r=l mod m. It is possible to represent $D_l$ using several uniquely decodable encoding schemes including some of the methods presented in this paper (e.g., SigBits). For the purpose of this embodiment the commonly used unary encoding is utilized. For this embodiment, to enable hardware-efficient order preserving encoding, the system uses '0' as the comma. Additionally, in this embodiment, $Q_i$ is used to represent the number of bits of '1' in $D_l$. Similarly, for this embodiment of the Golomb code which is following the standard definition, we use a minimal uniquely decodable and lexical preserving code, $M_l$ for r=l mod m. For instance, the possible values of r for m=5 are 0, 1, 2, 3, and 4. These values can be represented respectively as 00, 01, 10, 110, and 111 which is a minimal prefix code (hence it is uniquely decodable), lexical order preserving code. In a more general notation; let $k=\lceil \log_2 m\rceil$, and $w=2^k-m$, and let r be the set of remainders. That is, $r=(0, 1, 2, \ldots, m-1)$. the truncated binary representation of r, $M_l(r)$, which is a minimal nrefix code lexical order nreserying code for the narameter m is given by:

$$M_l = \begin{cases} \text{the } k-1 \text{ bits binary representation of } r & r < w \\ \text{the } k \text{ bit binary representation of } r+w & r \ge w \end{cases}$$

We refer to this encoding as the truncated binary representation of $M_l$. For example, given m=9, $k=\lceil \log_2 m\rceil=4$, $w=2^k-m=7$ $$M_l = \begin{cases} k-1=3 \text{ bits} \Rightarrow 0{:}000,\ 1{:}001,\ 2{:}010,\ 3{:}011,\ 4{:}100,\ 5{:}101,\ 6{:}110 & r<7 \\ k=4 \text{ bits} \Rightarrow 7{:}\text{bin}(7+7)=1110,\ 8{:}\text{bin}(8+7)=\text{"}1111\text{"} & r \ge 7 \end{cases}$$

Using the notation $E(l)=\langle D_l, M_l\rangle$ for l=23, with m=9 q=2, r=5. Hence, the Golomb code for l=23 with a parameter m=9 is Golomb9(23)=<2,5>=<110,101>='110101'. Similarly, for l=23 and $m=2^4=16$ (this is referred to as Rice code with a parameter of 4) we obtain: l=23, $m=2^4$, q=1, r=7, $k=\lceil \log_2 m\rceil=4$, $w=2^k-m=0$. Thus, the Golomb 16(23)=Rice4 (23)=<1, 7>=<10,0111>="100111".

FIG. 22 illustrates a block diagram showing select components of example logic associated with a compression system 2200 for preforming compression of integers according to some implementations. For example, the illustrated logic may be configured to compress and decompress non-negative integers according to the proposed embodiment of the Golomb coding. The example assumes that up-to thirty-two bits are used for the implementation scheme. The embodiment described next, assumes this setting. That is, up-to thirty-two bits of code. For example, under this constraint, assuming a parameter of m=16 (hence, k=4) the code can be used to represent decimal numbers from 0 to 447.

The system receives a 32 bits integer l 2202, where the Golomb code of l 2202 is up to 32 bits, and feeds it to a divider module with parameter m and a modulo module with parameter m. The modulo module 2204 result $M_l$ 2206 is fed into a 28-bit right shifter 2208 prepended with a bit of '1' 2210 and aligned to the left. The shifter unit 2208 shifts the prepended $\langle 1, M_l\rangle$ to the right while prepending bits of '0' based in part on the divider module 2212 result $Q_l$ 2214 number. If the divider module 2214 result $Q_l$ 2216 represents a number larger than the number supported by the encoding scheme, an error flag is set by the compression system 2200. Note that in the case of Rice code, the divider module 2212 and the modulo module 2204 are as simple as allocating the $k=\log_2 m$ right bits as the binary representation of the modulo module 2204 result $M_l$ 2206 and the remaining bits as the binary representation 2218 of the result $Q_l$ 2216 of the divider module 2212.

Note that throughout the process of encoding the system 2200 can compute the number of bits 2220 used to represent the encoded integer. Hence, in order to support the pack unit described below, the compression system 2200 may output this value denoted as 2220 in the figure.

FIG. 23 illustrates a block diagram showing select components of example logic associated with a decompression system 2300 for preforming decompression of encoded integers according to some implementations. For example, the illustrated logic may be configured to process encoded integers 2302 according to the proposed embodiment of the Golomb coding, using up-to thirty-two bits for the implementation scheme. The embodiment described next, assumes this setting. That is, up-to thirty-two bits of code. For example, under this constraint, assuming a parameter of m=16 (hence, k=4) the code can be used to represent decimal numbers from 0 to 447.

The decompression system 2300 receives one Golomb coded operand $\langle D_l, M_l\rangle$. Using a priority encoder 2304 to identify the comma (the leading 1) and the number of leading bits of '0' in front of the comma ($Q_l$) the operand is split into $D_l$ and $M_l$ components using a shift unit 2306 that shifts $\langle D_l, M_l\rangle$ to the left $Q_l$+1 times (removing the leading 0s and the comma of '1'). Substantially, simultaneously $Q_l$ 2308 is received and multiplied by m 2310 by a multiplier 2316 and the result 2318 is added with $M_l$ 2320 by an adder 2322 to generate the decompressed integer l 2324.

In the following example, an original uniquely decodable extension to Golomb code, where the operations of obtaining the quotient and remainder are carried iteratively until the quotient is 0 is discussed. In addition, the system uses coprime numerals as the parameter at each iteration. This original uniquely decodable extension of Golomb code is equivalent to a VLC Mixed Radix System (MRS).

For example, consider a MRS wits radices $\langle 7, 5, 3, 2\rangle$. Under this MRS, the representation of the integer 100 is '3,1,2,0'. Next, consider the Golomb code of 100 with a parameter m=2. In decimal notation, this representation is (50, 0). Applying Golomb code with a parameter m=3 to the header '50' results in (16, 2). The next iteration on the header '16' with m=5 results in $\langle$(3, 1$\rangle$ and the final iteration on the header '3' with m=7 produces $\langle 0, 3\rangle$. Thus, under this procedure the number 100 is represented as '3,1,2,0', which is the MRS representation of 100 in the $\langle 7, 5, 3, 2\rangle$ MRS. This strategy of iteratively applying Golomb code to the header of the Golomb code can be used to produce a uniquely decodable and universal VLC representation. Furthermore, a VLC-MRS system, such as the one described in this document and additional embodiments of VLC-MRS can be used to provide compact representation of integers using MRS. As noted, in the details of the VLC-MRS compression engine, it can be extended to provide VLC-MRS operations.

In the first extension, the system may apply the Golomb Code iteratively to the D field of the $\langle D_i, M_i\rangle$ Golomb representation of the integer i. In this case, however the parameter m is a radix that varies from one iteration to the next. In a specific embodiment of this extension the radices can be prime numbers. In this case, the extension can produce an efficient (in terms of compression rate) variable length code (VLC) for mixed radix system (MRS) representation.

In one example, let a≥0 be an unbounded integer and let R={. . . ,7,5,3,2}. That is, R is the ordered sequence of the prime numbers. Let $r_i$∈R be the i'th prime number $p_i$. Next, consider the following iterative process:

1) Iteration 1: Apply the Golomb coding technique with a parameter $r_1$=2 to a to obtain G (a)=$\langle 1_{1,a}, M_{1,a}\rangle$, where $q_{1,a}$ is the quotient of a/$r_1$, and $M_{1,a}$ is the truncated binary code of the remainder of a/$r_1$.
2) Prepend a bit of '0' to $\langle q_{1,a}, M_{1,a}\rangle$, to obtain 0$\langle q_{1,a}, M_{i,a}\rangle$
3) At iteration j (j=2, 3, . . . ), if $q_{j-1,a}$=0, then output the resultant code and stop. $\rangle$Otherwise: Set $r_j$ to be the j's prime number. Replace $q_{j-1,a}$ by $q_{j,a}$ (the quotient of $q_{j-1,a}/r_j$), and prepend $M_{j,a}$ the truncated binary code of the remainder of $q_{j-1,a}/r_j$ to $M_{j-1,a}$, . . . , $M_{1,a}$ to obtain $M_{j,a}$, $M_{j-1,a}$, . . . , $M_{1,a}$.
4) Set the current code of a to be 1, . . . , 1,0, $\langle D_{j,a}, M_{j,a}, M_{j-1,a}, \ldots, M_{1,a}\rangle$, where the number of leading bits of '1' is j−1. Return to (3).

In the second extension we apply the procedure to bounded integers.

Let R={. . . ,5,3,2}={. . . , $r_3$,$r_2$,$r_1$}. That is, R is the ordered sequence of the prime numbers. Let $r_i$∈R be the i'th prime number and let a be a bounded integer, further assume that 0≤{$r_{k-1}$×, . . . ,×$r_2$×$r_1$}≤a<{$r_k$×, . . . ,×$r_2$×$r_1$} for some k. Next, consider the following iterative process:

1) Iteration 1: Set k=1
2) Apply the Golomb coding technique with a parameter $r_1$=2 to a to obtain G(a)=$\langle q_{1,a}, M_{1,a}\rangle$, where $q_{1,a}$ is the quotient of a/$r_1$, and $M_{1,a}$ is the truncated binary code of the remainder of a/$r_1$.
3) At iteration k (k=2, 3, . . . ), if $q_{k-1,a}$=0, remove $q_{k-1,a}$ from $\langle q_{k-1,a}, M_{k-1,a}, M_{k-2,a}, \ldots, M_{1,a}\rangle$, append k−1 to the current code as binary number represented with [$\log_2$(k−1)] bits, output the resultant code and stop. Otherwise: Set $r_k$ to be the k's prime number. Replace $q_{k-1,a}$ by $q_{k,a}$ (the quotient of $q_{k-1,a}/r_k$), and prepend $M_{k,a}$ the truncated binary code of the remainder of $q_{k-1,a}/r_k$ to $M_{k-1,a}$, . . . , $M_{1,a}$ to obtain $M_{k,a}$, $M_{k-1,a}$, . . . , $M_{1,a}$.
4) Set the current code of a to be $\langle q_{k,a}, M_{k,a}, M_{k-1,a}, \ldots, M_{1,a}\rangle$. Set k←k+1 and return to (3).

Figure 24:
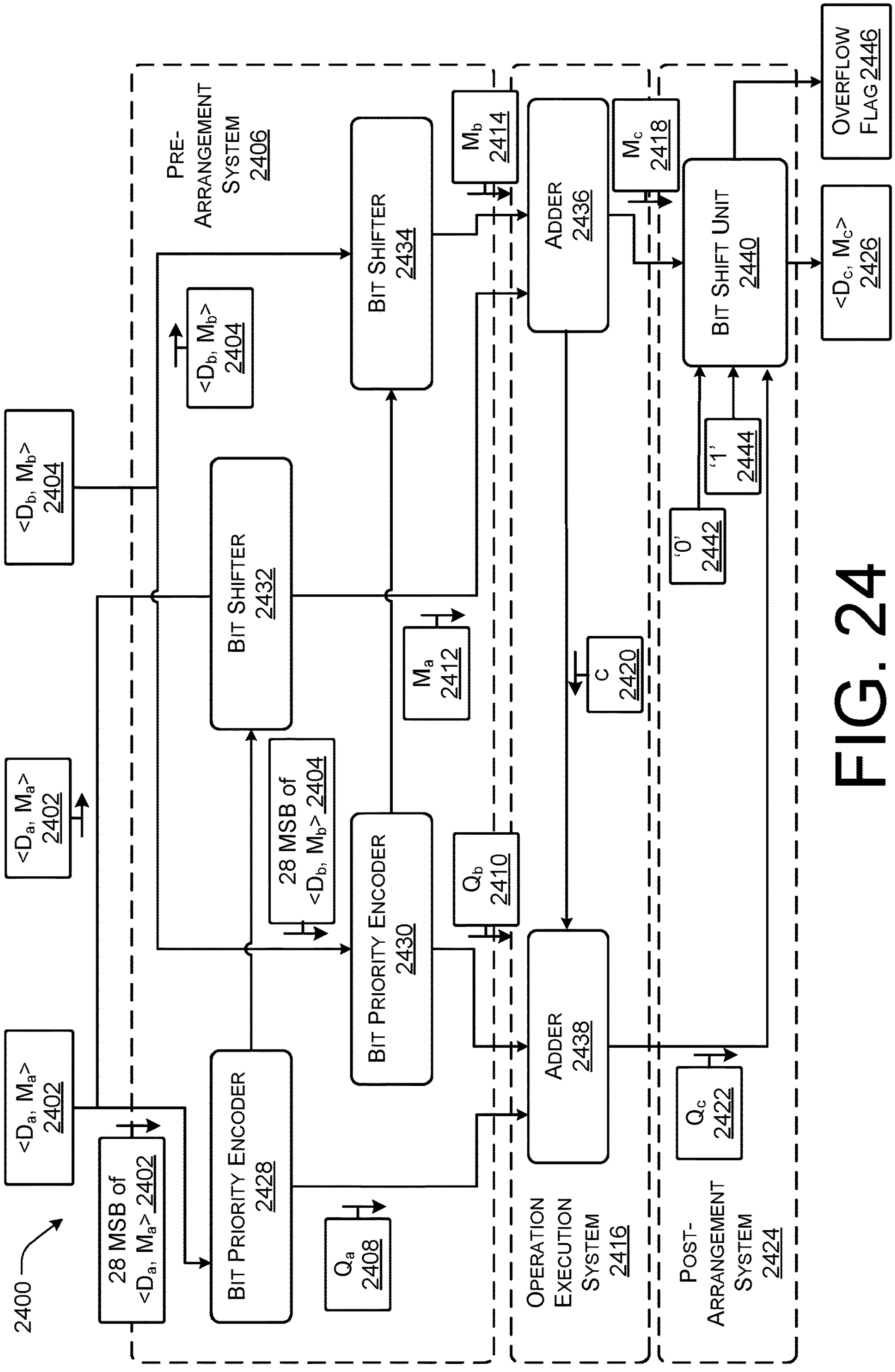
FIG. 24 illustrates a block diagram showing select components of example logic associated with a compressed domain processor according to some implementations.
Figure 25:
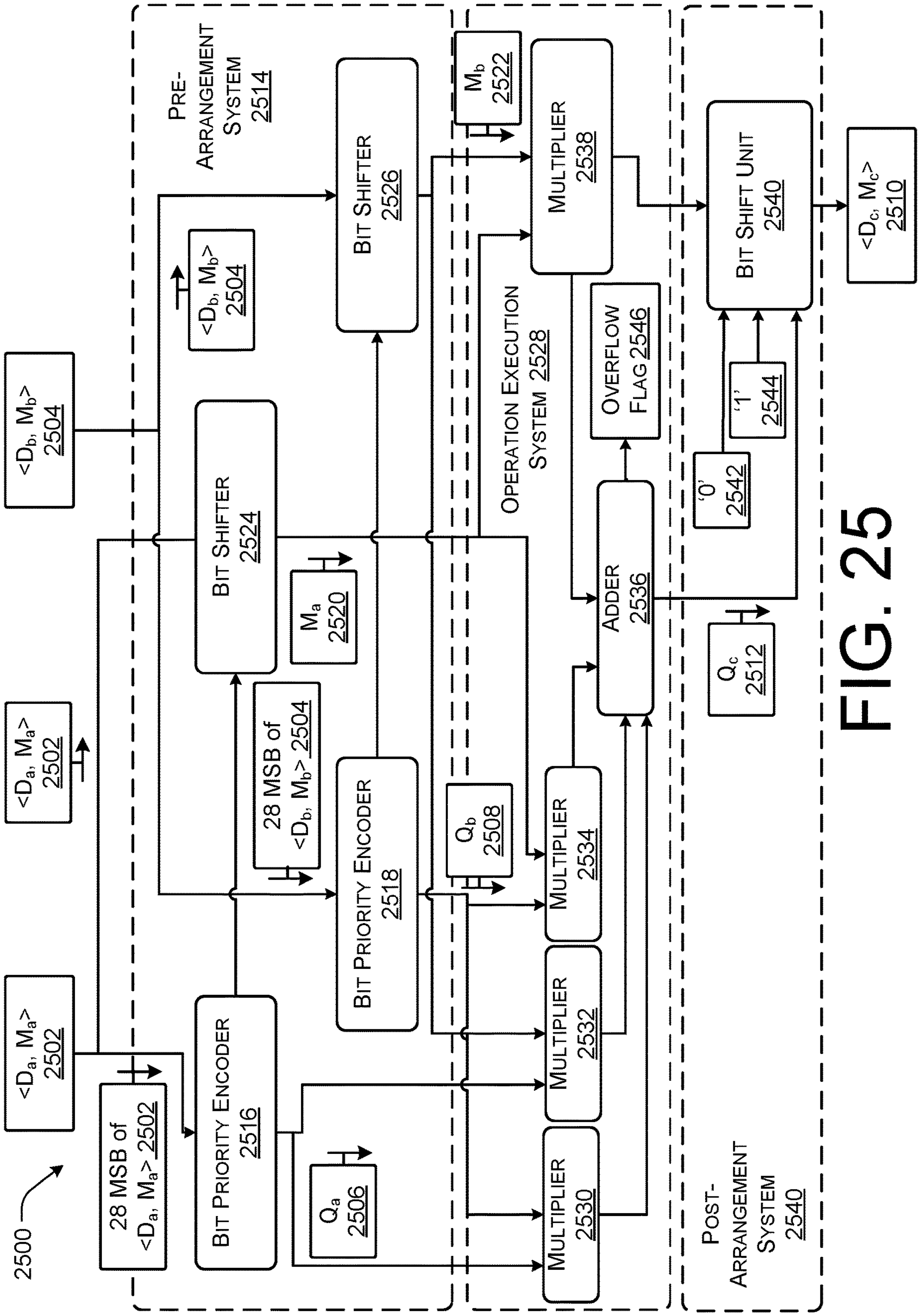
FIG. 25 illustrates a block diagram showing select components of example logic associated with a compressed domain processor according to some implementations.

FIGS. 24 and FIG. 25 illustrate examples of logic associated with a compressed domain processor using the Golomb compression method with a parameter m. It should be noted that the Rice compression method is a special case of Golomb compression where m is a power of 2. Hence, this section provides the details of both Golomb-based compressed domain processor and Rice-based compressed domain processor. Furthermore, as shown below, the section provides sufficient details for the implementation of several extensions and variants of the Golomb code.

Several variants of the Golomb compression method can be considered. In this example we assume that the integers are compressed according to the example provided for the Golomb compression engine described above. Other variants have similar properties and their use for a Golomb domain processor can be inferred by a person who is skilled in the art.

FIG. 24 illustrates a block diagram showing select components of example logic associated with a compressed domain processor 2400 for preforming addition on compressed integers according to some implementations. For example, the illustrated logic may be configured to process non-negative integers according to the proposed embodiment of the Golomb coding, using up-to thirty-two bits for the implementation scheme. That is, up-to thirty-two bits of code. For example, under this constraint, assuming a Golomb parameter of m=16 (hence, a rice parameter k=4) the code can be used to represent decimal numbers from 0 to 447.

Let E(a)=$\langle D_a, M_a\rangle$ 2402 and E(b)=$\langle D_b, M_b\rangle$ 2404 and let c=a+b. Under the proposed Golomb with a parameter m implementation, E(c)=E(a+b)=($D_c$, $M_c$) using truncated binary representation of r, let $\langle C, M_c\rangle_m$=$M_a$+$M_b$. Where $M_c$=(($M_a$+$M_b$) mod m) and C=1 if $M_a$+$M_b$≥m, otherwise, C=0. Using the unary encoding for $q_c$, $D_c$ has the same number of bits of '1' as the number of bits of '1' in $D_a$+$D_b$ , and one additional bit of '1' if C=1. For example, it can be obtained from $D_a$, $D_b$, and C as follows. Set $Q_c$ to be $Q_c$=$Q_a$+$Q_b$ C., and, in compliance with unary representation, set $D_c$ to be a string of $Q_c$ bits of '1' followed by the comma '0'. It should be understood that if different encoding (e.g., SigBits) is used for $D_a$ and $D_b$, the addition of $D_a$+$D_b$ C is implemented according to the encoding used.

The pre-arrangement-system 2406 including a first 28-bit priority encoder 2428, a second priority bit encoder 2430, a 32 bit left shifter 2432, and a second 32 bit left shifter 2434 receives two Golomb coded operands 2402 and 2404. Using a priority encoder to identify the comma and the number of bits of '1' in front of the comma, $Q_a$ 2408 and $Q_b$ 2410, each operand is split into the D and M components. The $M_a$ 2412 and $M_b$ 2414 portions are fed into the operation-execution-system 2416 including a first adder 2436 and a second adder 2438 that adds the two $M_a$ 2412 and $M_b$ 2414 values and calculates $M_c$ 2418 and the value of the carry C 2420. This operation can be done by a dedicated adder or, in a specific example, a look-up table. In addition, the operation-execution-system 2416 receives $Q_a$ 2408 and $Q_b$ 2410 at the second adder 2438, the number of bits of '1' of $D_a$ and $D_b$ respectively, and C 2420 and adds them to generate $Q_c$ 2422, the number of bits of '1' of $D_c$. If $Q_c$ 2422 represents a number larger than the number supported by the system encoding scheme, the post-arrangement-system 2424 sets an overflow flag 2446. Otherwise, the post-arrangement-system 2424 shifts, via a 28 bit right shifter 2440, $M_c$ 2418, prepended with a '0' 2442 as the comma, $Q_c$ 2422 right shifts with an input of '1' 2444 per shift introducing $Q_c$ 2422 bits of '1' to the left of the comma and $M_c$ 2418 to produce $E(c)=(D_c, M_c)$ 2426.

In this embodiment the parameter m is static. It should be understood, however, that a dynamic parameter m, which enables changing the efficiency of the encoding during operation, might be used. To support dynamic changes to m, the dedicated adder or look-up table set to add $M_a$+$M_b$ is changed (dynamically) to reflect the new value of m.

A similar logic can be implemented to execute subtraction of two Golomb encoded numbers, which requires replacing the dedicated adder with a dedicated subtractor or in specific cases with a look-up table to execute subtraction and calculate a borrow bit instead of carry. Additionally, the operation of the operation-execution-system adder to calculate $Q_c$ is changed to a subtractor and the overflow flag is changed to indicate the detection of negative numbers.

FIG. 25 illustrates a block diagram showing select components of example logic associated with a compressed domain processor 2500 for preforming multiplication on compressed integers according to some implementation scheme. The embodiment described next, assumes this setting. That is, up-to thirty-two bits of code. For example, under this constraint, assuming a parameter of m=16 (hence, k=4) the code can be used to represent decimal numbers from 0 to 447.

Let $E(a)=\langle D_a, M_a\rangle$ 2502 and $E(b)=\langle D_b, M_b\rangle$ 2504 where, $Q_a$ 2506 and $Q_b$ 2508 are the number of bits of '1' in $D_a$ and $D_b$ and are equal in value to $q_a$ and $q_b$ respectively and let c=a×b. Then, $a=Q_a\times m+r_a$, $b=Q_b\times m+r_b$, $c=a\times b=m^2\times Q_a\times Q_b+m\times(Q_a\times r_b+Q_b\times r_a)\ r_a\times r_b \Rightarrow Q_c=m\times Q_a\times Q_b\ Q_a\times r_b+Q_b\times r_a\ ((r_a\times r_b)$ div in) and $r_c=(r_a\times r_b)$ mod m. Under the proposed Golomb implementation $E(c)=E(a\times b)=\langle D_c, M_c\rangle$ 2510 is obtained in the following way: $M_c$ is set to be the truncated binary representation of $r_c$ and $D_c$ may be set to be the unary representation of $Q_c$ 2512.

For example, using a decimal representation of q and r for Golomb encoding, $E(l)=\langle q_l, r_l\rangle$, let m=5, a=17 (E(17)=(3, 2)), b=23 (E(b)=(4,3)), c=17×23=391 (E(391)=(78,1)). Then, $q_{17\times23}$=(5×3×4+3×3+2×4+(6 div 5))=78, and $r_{17\times23}$=6 mod 5=1. Hence, E(17×23)=(78,1).

The pre-arrangement-system 2514 receives two Golomb coded operands 2502 and 2504. Using a first and second priority encoder 2516 and 2518 and a first and second bit left shifter 2524 and 2526 to identify the comma and the number of bits of '1' in front of the comma, $Q_a$ 2506 and $Q_b$ 2508, each operand is split into the D and M portions. The $Q_a$ 2506, $Q_b$ 2508, $M_a$ 2520 and $M_b$ 2522 portions are fed into the operation-execution-system 2528. The operation-execution-system 2528 calculates $(m\times Q_a\times Q_b)$, $(Q_a\times r_b)$, $(Q_b\times r_a)$, and $((r_a\times r_b)$ div m) using look-up tables and/or binary multipliers/dividers, generally indicated by 2530, 2532, and 2534, and adds the results using a binary adder 2536. The result of the addition represents the value of $Q_c$ 2512, or the number of bits of '1' needed to represent $D_c$ using unary representation. If the result of the addition is larger than the largest q supported by the encoding scheme, an overflow flag 2546 may be set. In addition, the operation-execution-unit 2528 calculates $((r_a\times r_b)$ mod m) using $M_a$ and $M_b$ by a dedicated binary multiplier 2538 or a dedicated look-up table. The result of this operation is the value of $M_c$. The post-arrangement-system 2540 shifts $M_c$, prepended with a '0' 2542 as a comma, $Q_c$ 2512 right shifts introducing $Q_c$ 2512 bits of '1' 2544 to the left of the comma and $M_c$ to produce $E(c)=\langle D_c, M_c\rangle$ 2510.

In this embodiment the parameter m is static. It should be understood, however, that a dynamic parameter m, which enables changing the efficiency of the encoding during operation, might be used. To support dynamic changes to m, the dedicated multipliers or look-up tables set to perform the required products are changed (dynamically) to reflect the new value of m.

It should be noted that variations and extensions of the Golomb Code exist. Nevertheless, implementation of a compressed domain process to operate on the Golomb variation and extensions is considered herein and is similar to the embodiment described above. Consider two such extension as well as a new innovative extension disclosed herein and that illustrate that the other compressed domain processors proposed in this paper can operate on data compressed according to these extensions. The first extension, to be considered, is referred to as Exponential Golomb Code. Nevertheless, this extension is equivalent to Elias Gamma code. In this case one should consider using the SigBits encoding and the SigBits compressed domain processor, as it is more efficient in terms of compression rate and hardware implementation. The second extension is referred to as Extended Golomb Code, where Golomb Code is applied iteratively to the D field of the $\langle D_i, M_i\rangle$ representation of the integer i. In this case, the parameter m is fixed. Nevertheless, it is known that the extended Golomb Code is equivalent to Elias Gamma code. Hence, one should consider using the SigBits encoding and the SigBits compressed domain processor as it is more efficient in terms of compression and hardware implementation.

Figure 26:
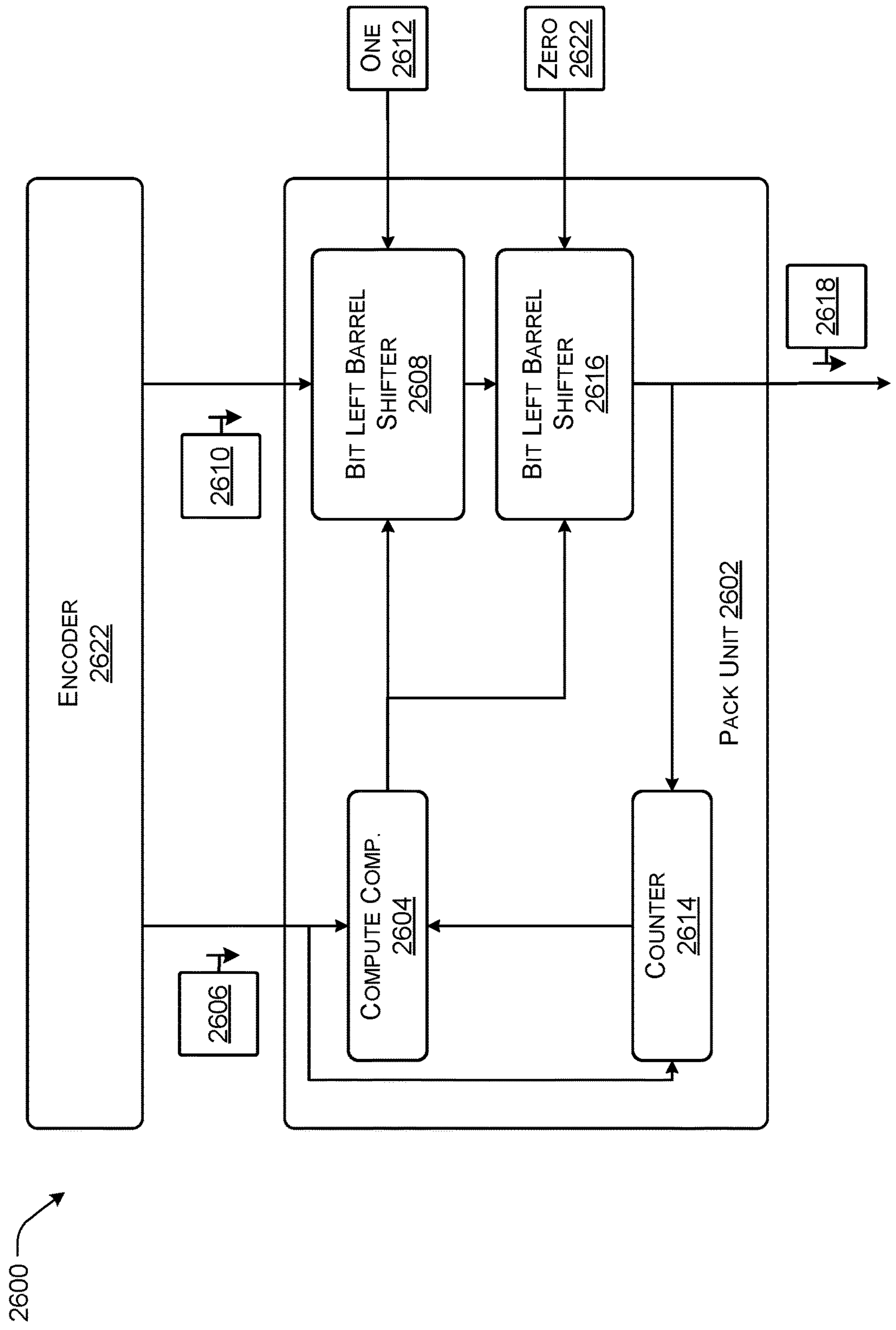
FIG. 26 illustrates select components of example logic associated with a pack unit according to some implementations.
Figure 27:
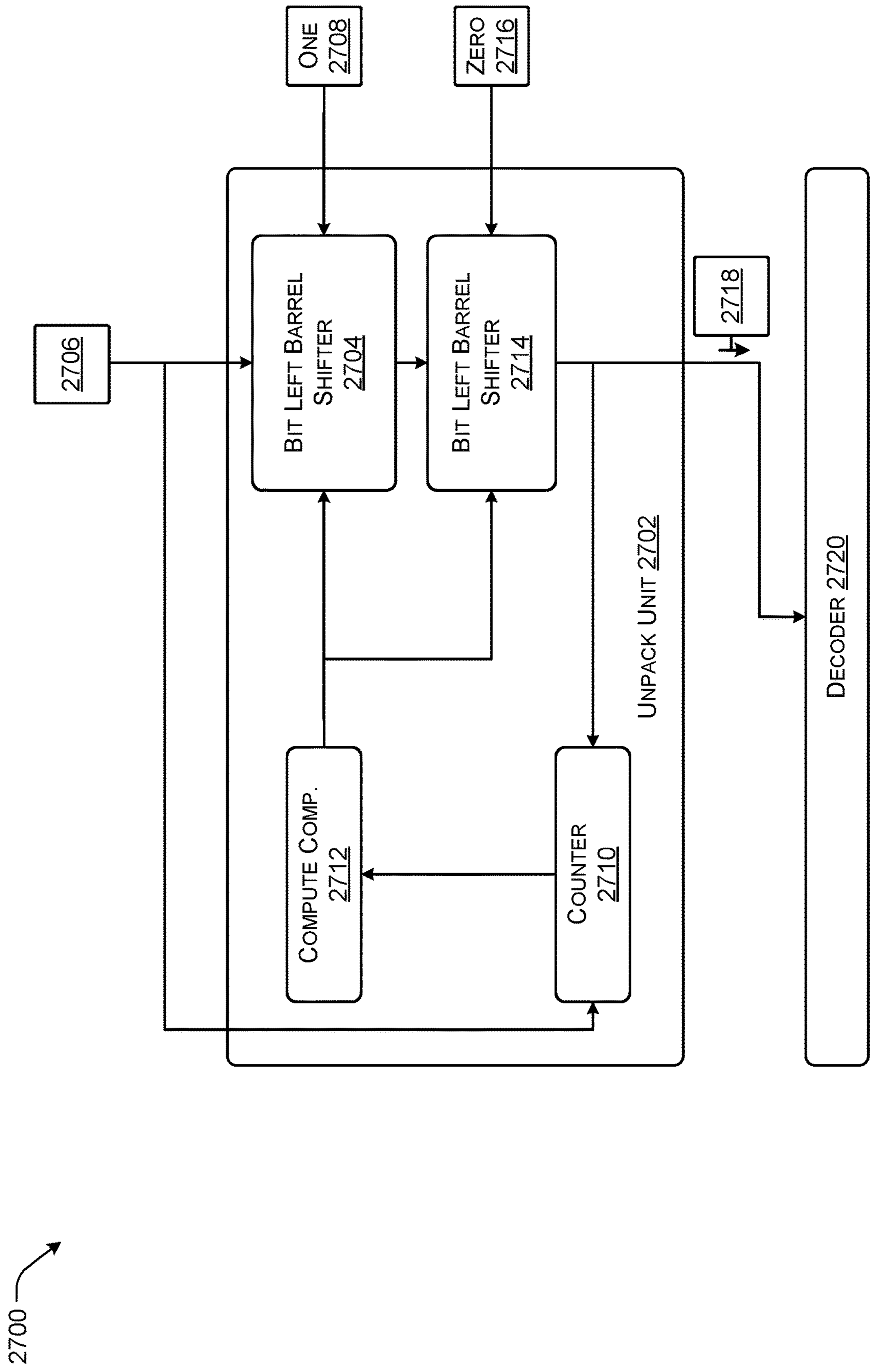
FIG. 27 illustrates select components of example logic associated with an unpack unit according to some implementations.

In some systems the compression and pack and decompression and unpack are performed in conjunction with each other. However, in other systems, pack and unpack may be performed independently or by separate components from the compression and decompression. FIGS. 26 and 27 provide example pack and unpack units that may be used with various compression techniques.

In these examples, packing may be performed after the encoding. The task of the pack unit is to receive code-words of variable length generated by the encoder, pack the code-words into consecutive bytes, and output the byte stream, potentially through a bus, to the next system unit. The pack unit may use a buffer, where the encoder inserts code-words and a counter that keeps track on the number of bits (hence, the number of bytes) in the buffer. In general, the buffer size should be at least two times larger than the system bus size and large enough to include at least two code-words. Table 1 below illustrates the process executed by the pack unit. Generally, the compression engine have information about the size of the code-word used to encode each input integer. Often, and as shown below, transmitting this information to a pack unit can improve operations of the compressed engine. In fact, this is the case for all the compression engines discussed in this document including, SigBits, Sig-Bytes, VLC RNS, VLC-MRS, Comma, InBetween, 1210, and the Golomb CE. In cases where the information is explicit, the CE may output it as an additional output that may be used by the pack unit. For some of the information, the compression engine can often apply a computation procedure and obtain this information. Next, the compression engine can output the information to the pack unit.

TABLE 1

| | Bytes in buffer | | | | | | | | |
|---|---|---|---|---|---|---|---|---|---|
| | 0 | 1 | 2 | 3 | 4 | 5 | 6 | 7 | 8+ |
| Action | Wait | Wait | Wait | Wait | Wait | Wait | Wait | Wait | Out |

In the present example, the system may operate on 64-byte and 128-byte strings. The pack unit enact a set of pack actions based on the number of bytes in the counter. This number is obtained by integer division by eight, of the number of bits in the buffer, which is stored in the counter. The division, however may be done via a shift left by three or through table lookup. In Table 1, 'Bytes in Buffer' denotes the number of meaningful bytes (i.e., bytes that contain code-words) currently stored in the buffer. For example, 0 means that there is less than one byte (0-bits to 7-bits) in the buffer, and 1 means that there is at least one byte but less than two bytes. The number 8+ means that there are either 8-bytes of data, or more than 8-bytes of data, in the buffer. Furthermore, 'Wait' means wait for the encoder to place a new code-word into the buffer, and 'Out' means: output the eight most significant bytes, left shift the buffer content by 8-bytes, and update the counter by subtracting 64 from the value stored in the buffer. It should be noted that other configurations of buffer/bus sizes as well as other units of data size (e.g., nibbles or bits) can be considered. In some embodiments, the encoder sends code-words and their respective size to the pack unit. Alternatively, the encoder may send only the code-words to the pack unit. As another alternative, the encoder sends a fixed number of bits per transaction, for example, 64 bits, provided that these bits contain at least one left adjusted code-word.

The pack unit uses the counter to determine where to append new code-words in the buffer. This is described in FIG. 26, below, and may be done using a barrel shifter that shifts the code-word to the left so that it is inserted in the first available place in the buffer. Additionally, the pack unit updates the counter after placing a code-word or fixed length block. In some compression systems, however, the pack unit is placed within the encoder as this may eliminate redundant operations, reduce the number of system units, and lessen communication overhead. Note, that it is possible to pipeline the encoding of data-token l with the packing of data-token l−1. This can enable working in parallel on more than one data-token and pipelining more than one buffer.

In some cases, Table 1 can be implemented via a state machine with two states 'Wait', and 'Out'. In the Wait state the system waits (or stays in the Wait state) until there are at least eight bytes of data in the buffer. In the out state, the system may output the eight most significant bytes, left shift the buffer content by 8-bytes, and update the counter by subtracting 64 from the value stored in the buffer. Table 2 illustrates this state machine:

TABLE 2

| Current state | Next State when byte counter value is less than eight | Next State when byte counter value is eight or more than eight |
|---|---|---|
| Wait | Wait | Out |
| Out | Wait | Out |

Unpacking may be done before decoding. The task of the unpack unit is to receive enough data so that the unpack unit may determine if the data contains at least one encoded code-word to unpack the code-word when it is available, and send the packed code-word to the decoder. That is, to isolate the left most code-word and send the left most code-word to the decoder. Alternatively, the unpack unit might place the left most code-word at the left most part of the buffer and send the buffer or a fixed part of the buffer that contains at least one code-word to the decoder. In some compression systems, however, the unpack unit is placed within the decoder as this may eliminate redundant operations reduce the number of system units, and lessen communication overhead.

In some cases, the system may include a buffer where the system inserts code-words bits and a counter that keeps track on the number of bits (hence the number of bytes) in the buffer. The number of bytes is derived via integer division by eight of the counter value and may be implemented with shift left by three or via look-up tables. In general, the buffer size should be at least two times larger than the system bus size and large enough to include at least two code-words. Table 3, below, may serve as an illustration of the process for a set of unpack actions based on the number of code-words in the buffer.

TABLE 3

| Code-words in the buffer | 0 | 1+ |
|---|---|---|
| Action: 'bring k bytes' or Decode (Dec) | In | out |

In some example, eight bytes contain at least one code-words. The system places eight bytes into a buffer with a size of at least 16-bytes. This is done using a barrel shifter that shifts these bytes to the left so that they are inserted in the first most left place available in the buffer. Additionally, the system updates the counter, by incrementing its value by 64. Next, the system identifies the left most code-word in the buffer. For many compression methods, however, it involves finding the leading bit of one in the data and this can be accomplished using a priority encoder. Next, the system checks how many code-words are left in the buffer and act according to the table. The number of code-words in the buffer may be less than one (denoted as 0). Alternatively, the buffer may contain one or more than one code-words and this is denoted as (1+) in Table 3. In the table, 'In' means bringing 64 bits from the system placing these 64-bits into the buffer. This is done using a barrel shifter that shifts these bytes to the left so that they are inserted in the first most left place available in the buffer. Additionally, on 'In' operation the system updates the counter, by incrementing the counter's value by 64 it may include may re-initializing buffers and barrel shifters. 'Out' means output 64 bits (in some systems) or one code-word, potentially along with the size of the code-word. At the end of an Out operation the counter is updated by subtracting the size of the code-word just transmitted and subtraction of the size of this code-word from the counter.

In some cases, Table 3 may be implemented as a state machine with two states 'In', and 'Out'. In the 'In' state the system brings at least one code-word into the buffer. In the out state the system: outputs the left most code-word potentially left aligned in 8-bytes data and potentially along with its size, left shifts the buffer content by 8-bytes or by the size of the code-word, and updates the counter by subtracting 64 or subtracting the code-word length from. Table 4 illustrates this state machine:

TABLE 4

| Current state | Next State when byte counter value is less than eight | Next State when byte counter value is eight or more than eight |
|---|---|---|
| In | In | Out |
| Out | In | Out |

It should be noted that other configurations of buffer/bus sizes as well as other units of data size (e.g., nibbles or bits) can be considered. In some compression systems, the unpack unit is placed within the decoder as this might reduce the number of system units and their communication overhead. Note, that it is possible to pipeline unpacking of code-word l with the decoding of-token l−1. This can enable working in parallel on more than one code-word and pipelining more than one buffer Generally, the compression engine have information about the size of the code word used to encode each input integer. Often, and as shown below, transmitting this information to the pack unit can simplify operations of the compression engine. In fact, this is the case for all the compression engines discussed in this document including, SigBits, SigBytes, VLC RNS, VLC-MRS, Comma, InBetween, 1210, and Golomb compression engines. In cases, the compression engine may output the information as an additional output that may be used by the pack unit. In other cases, the compression engine can often apply a computation procedure and obtain this information. Next, the compression engine can output the information to the pack unit.

FIG. 26 illustrates an example system 2600 including a pack unit 2602 according to some implementations. In this example, the pack unit 2602 may be utilized to pack symbols or integers encoded using various compression techniques discussed above. In general, the pack unit 2602 may receive a code-word size 2606 (described above) and a code-word 2610 from an encoder 2622. Alternatively, the pack unit 2602 may receive only code-words from the encoder and has to find their sizes. In another alternative, the size of code-words is fixed and is available to the pack unit 2602. The code-word size 2606 may be received at a compute component 2604 and the code-word 2610 may be received at a bit left barrel shifter 2608. In the example, the code-word size 2606 may be up to 64 bits.

Initially, the counter 2614 may be set to 0, the bit left barrel shifter 2608 may maintain a value that contains only '1' values, and the bit left barrel shifter 2616 may maintain a value that only contains '0' values. Following the initialization, the code-word 2610 may be inserted into the right most part of the bit left barrel shifter 2608 and the counter 2614 may be updated by adding the value of the size 2606 to its contents. In this example, the bit left barrel shifter 2608 and the bit left barrel shifter 2616 are assumed to be 128-bit bit left barrel shifters.

Next, the value maintained by the bit left barrel shifter 2608 may be shifted left by inserting one bit with a value of '1' 2612 per shift. The number of shifts may be equal to the size of the bit left barrel shifter 2608 minus the value of the counter 2614. Next, the value maintained by the bit left barrel shifter 2608 may go through a bitwise AND operation with a value maintained by the bit left barrel shifter 2616. At the same time, the bit left barrel shifter 2608 may be set to maintain a value that only contains '1' values.

When the counter 2614 has a value of 64 or more, the 64 most significant bits of the value maintained by the bit left barrel shifter 2616 may be used as output to external units such as memory or a communication channel as 2618. After outputting 2618, the counter 2614 may be updated by subtracting 64 from its value and the value maintained by bit left barrel shifter 2616 may be shifted left by 64 with insertion of bits of '0' 2622 from the left. At the same time, the bit left barrel shifter 2608 may be updated to maintain a value that only contains '1' values. Next, the system 2600 may commence with the operations that are following the initialization as described above.

FIG. 27 illustrates an example system 2700 including an unpack unit 2702 for use with unpacking code-words according to some implementations. In this example, the unpack unit 2702 may be utilized to unpack symbols encoded using various compression techniques such as the methods discussed above. In this example, the unpack unit 2702 receives 64 bits 2706 of packed data at a bit left barrel shifter 2704. These bits might come from an external unit such as memory unit or from a transmitter.

Initially, the counter 2710 may be set to 64, the bit left barrel shifter 2704 may be set to maintain a value that only contains '1' values, and the bit left barrel shifter 2714 may be set to maintain a value that only contains '0' values. In this example, the bit left barrel shifter 2704 and the bit left barrel shifter 2714 are assumed to be 128-bit bit left barrel shifters.

Following the initiation, the 64 bits 2706 received are inserted in the right part of a value maintained by the bit left barrel shifter 2704. Next, the value maintained by the bit left barrel shifter 2704 may be shifted left by inserting a number of '1' at the right. The number of '1' being equal to 128 minus the value of a counter 2710.

Next, the value maintained by the bit left barrel shifter 2704 is bitwise AND with a value maintained by the bit left barrel shifter 2714. Next, a compute component 2712 identifies the boundary of the left most code-word in the value maintained by the bit left barrel shifter 2714. Next, the 64-bits that contain the left most code-word 2718 (or in some cases the actual code-word) potentially along with its size, are output by the unpack unit 2702 to the decoder 2720. Next the value of the counter 2710 may be updated by subtracting the code-word size from its value and the value maintained by the bit left barrel shifter 2714 may be shifted left by inserting a number of '0' 2716. The number of '0' 2716 may be equal to the size of the code-word that was just sent to the decoder. At the same time, the bit left barrel shifter 2704 may be set to maintain a value that only contains '1' values. The process of isolating code words, sending them to the decoder and updating the counter continues until the subtraction operation performed on the counter 2710 yields a negative result. At this point the value of the counter 2710 before that subtraction may be restored. Next, the unpack unit triggers the unit 2706 to send the next 64 bits. These bits might come from a memory unit or from a transmitter connected to an external device. The 64 bits 2706 received are inserted in the right part of a value maintained by the bit left barrel shifter 2704. Next, the value maintained by the bit left barrel shifter 2704 may be shifted left by inserting a number of '1' at the right. The number of '1' being equal to 128 minus the value of a counter 2710. The process of getting the next 64 bits, isolating code-words and sending them to the decoder as long as there is at least one available code word, and updating counters continues as long as the unit 2706 have available data.

Although the subject matter has been described in language specific to structural features, it is to be understood that the subject matter defined in the appended claims is not necessarily limited to the specific features described. Rather, the specific features are disclosed as illustrative forms of implementing the claims.

What is claimed is:

1. A compressed domain processor comprising:

a pre-arrangement-system to:

receive a first compressed integer and a second compressed integer, the first compressed integer including a first uniquely decodable quotient and a first uniquely decodable reminder and the second compressed integer including a second uniquely decodable quotient and a second uniquely decodable reminder;

output a first integer quotient associated with the first compressed integer, a second integer quotient associated with the second compressed integer, a first left aligned representation of a first remainder, and a second left aligned representation of a second remainder;

an operation-execution-system to:

receive the first integer quotient associated with the first compressed integer, the second integer quotient associated with the second compressed integer, the first left aligned representation of the first remainder, and the second left aligned representation of the second remainder;

output a third quotient associated with a third compressed integer and a third remainder associated with a third compressed integer, the third compressed integer equal to a sum of the first compressed integer and the second compressed integer;

a post-arrangement-system to:

receive the third quotient and the third reminder; and output a uniquely decodable compressed representation of the third integer.

2. The compressed domain processor as recited in claim 1, wherein the pre-arrangement-system includes a first bit priority encoder, a second bit priority encoder, a first left bit shifter, and a second left second bit shifter.

3. The compressed domain processor as recited in claim 2, wherein:

the first bit priority encoder receives the first uniquely decodable quotient and outputs the first integer quotient;

the second bit priority encoder receives the second uniquely decodable quotient and outputs the second integer quotient;

the first left bit shifter receives the first integer uniquely decodable remainder and outputs the first left aligned representation of the first remainder; and the second left bit shifter receives the second uniquely decodable remainder and outputs the second left aligned representation of the second remainder.

4. The compressed domain processor as recited in claim 1, wherein the operation-execution-system includes a first adder and a second adder.

5. The compressed domain processor as recited in claim 4, wherein:

the first adder sums the first left aligned representation of the first remainder and the second left aligned representation of the second remainder and outputs a third left aligned representation of a third remainder; and the adder sums the first integer quotient with the second integer quotient and outputs a third integer quotient and a third remainder.

6. The compressed domain processor as recited in claim 1, wherein the compressed representation of the third integer includes the third integer quotient and the third remainder.

7. The compressed domain processor as recited in claim 1, wherein the first uniquely decodable quotient, the second uniquely decodable quotient, and third uniquely decodable quotient are represented in a unary code and the first reminder, the second reminder, and the third reminder are represented using a truncated binary representation which is a minimal prefix code.

8. A compression engine comprising:

a comparator, the comparator to receive an uncompressed integer;

a binary to Residue Number System (RNS) conversion unit, the binary to RNS conversion unit to receive the uncompressed integer;

an encoder configured to receive an output of the comparator; and a selector configured to receive a plurality of RNS digits and an output of the encoder, the selector to output a frustum portion of a compressed representation of the uncompressed integer.

9. The compression engine as recited in claim 8, wherein the binary to Residue Number System (RNS) conversion unit is a binary to variable length code Residue Number System (VLC-RNS) conversion unit.

10. The compression engine as recited in claim 9, wherein the plurality of RNS digits are in a form of a truncated binary representation which is a minimal prefix code.

11. The compression engine as recited in claim 8, wherein the output of the encoder is a two-bit header.

12. The compression engine as recited in claim 8, wherein the output of the encoder is received by the selector as a control input.

13. The compression engine as recited in claim 8, wherein the output of the encoder is concatenated with the frustum output by the selector to form the compressed representation of the uncompressed integer.

14. The compression engine as recited in claim 8, wherein a number of the plurality of RNS digits is variable.

15. A compression engine comprising:

a comparator, the comparator to receive an uncompressed integer;

a binary to Mixed Radix Number System (MRS) conversion unit, the binary to MRS conversion unit to receive the uncompressed integer;

an encoder configured to receive an output of the comparator; and a selector configured to receive a plurality of MRS digits and an output of the encoder, the selector to output a frustum portion of a compressed representation of the uncompressed integer.

16. The compression engine as recited in claim 15, wherein the binary to MRS conversion unit is a binary to variable length code Mixed Radix Number System (VLC-MRS) conversion unit.

17. The compression engine as recited in claim 15, wherein the output of the encoder is a two-bit header.

18. The compression engine as recited in claim 15, wherein the output of the encoder is received by the selector as a control input.

19. The compression engine as recited in claim 15, wherein the output of the encoder is concatenated with the frustum output by the selector to form the compressed representation of the uncompressed integer.

20. The compression engine as recited in claim 15, wherein a number of the plurality of MRS digits is variable.

* * * * *